US012085856B2

(12) United States Patent
Iio et al.

(10) Patent No.: US 12,085,856 B2
(45) Date of Patent: *Sep. 10, 2024

(54) POSITIVE PHOTOSENSITIVE RESIN COMPOSITION, POSITIVE PHOTOSENSITIVE DRY FILM, METHOD FOR PRODUCING POSITIVE PHOTOSENSITIVE DRY FILM, PATTERNING PROCESS, METHOD FOR FORMING CURED FILM, INTERLAYER INSULATION FILM, SURFACE PROTECTIVE FILM, AND ELECTRONIC COMPONENT

(71) Applicant: SHIN-ETSU CHEMICAL CO., LTD., Tokyo (JP)

(72) Inventors: Masashi Iio, Joetsu (JP); Hiroyuki Urano, Joetsu (JP); Osamu Watanabe, Joetsu (JP); Katsuya Takemura, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/389,866

(22) Filed: Jul. 30, 2021

(65) Prior Publication Data
US 2022/0043351 A1    Feb. 10, 2022

(30) Foreign Application Priority Data
Aug. 4, 2020    (JP) ................................. 2020-132426

(51) Int. Cl.
*G03F 7/039*    (2006.01)
*G03F 1/48*    (2012.01)
(Continued)

(52) U.S. Cl.
CPC .............. *G03F 7/0397* (2013.01); *G03F 1/48* (2013.01); *G03F 7/0045* (2013.01); *G03F 7/075* (2013.01);
(Continued)

(58) Field of Classification Search
CPC ........ G03F 7/0397; G03F 1/48; G03F 7/0045; G03F 7/075; G03F 7/11; G03F 7/161;
(Continued)

(56) References Cited

U.S. PATENT DOCUMENTS 3,957,512 A    5/1976  Kleeberg et al.
5,441,845 A *  8/1995  Okinoshima ......... G03F 7/0757
430/192

(Continued)

FOREIGN PATENT DOCUMENTS

EP    3 235 803 A1    10/2017
JP    S49-115541 A    11/1974
(Continued)

OTHER PUBLICATIONS https://www.honshuchemical.co.jp/en/products/search/91-04-3.html (Year: 2023).*

(Continued)

*Primary Examiner* — Sean M DeGuire
*Assistant Examiner* — Alexander N. Lee
(74) *Attorney, Agent, or Firm* — Oliff PLC

(57) ABSTRACT

A positive photosensitive resin composition including: (A) an alkali-soluble resin containing at least one or more structures selected from a polyimide structure, a polybenzoxazole structure, a polyamide-imide structure, and a precursor structure thereof; (B) a crosslinkable polymer compound containing a structural unit represented by the following general formula (1) and having a group cross-
(Continued)

linked with the component (A); and (C) a compound having a quinonediazide structure for serving as a photosensitizer to generate an acid by light and increase a dissolution speed to an alkaline aqueous solution, the resin composition and a positive photosensitive dry film derived therefrom that enable formation of a fine pattern and high resolution, have excellent mechanical characteristics even when cured at low temperatures, and have no degradation in adhesive force between before and after a high temperature and high humidity test.

(1)

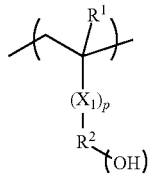

16 Claims, 1 Drawing Sheet

(51) Int. Cl.
- *G03F 7/004* (2006.01)
- *G03F 7/075* (2006.01)
- *G03F 7/11* (2006.01)
- *G03F 7/16* (2006.01)
- *G03F 7/20* (2006.01)
- *G03F 7/32* (2006.01)

(52) U.S. Cl.
CPC ............... *G03F 7/11* (2013.01); *G03F 7/161* (2013.01); *G03F 7/2004* (2013.01); *G03F 7/322* (2013.01)

(58) Field of Classification Search
CPC ...... G03F 7/2004; G03F 7/322; G03F 7/0226; G03F 7/40; G03F 7/0233; G03F 7/039; G03F 7/00; G03F 7/09; G03F 7/0392; G03F 7/162; G03F 7/168; G03F 7/30; C08K 5/0025
See application file for complete search history.

(56) References Cited

U.S. PATENT DOCUMENTS

| | | | | |
|---|---|---|---|---|
| 5,573,886 A | * | 11/1996 | Kato | G03F 7/0233 430/326 |
| 5,858,584 A | * | 1/1999 | Okabe | G03F 7/0233 430/326 |
| 10,816,900 B2 | * | 10/2020 | Urano | C07F 7/1804 |
| 2006/0079658 A1 | | 4/2006 | Kato et al. | |
| 2006/0246377 A1 | | 11/2006 | Yamato et al. | |
| 2007/0020555 A1 | | 1/2007 | Matsumura et al. | |
| 2008/0131813 A1 | * | 6/2008 | Etou | G03F 7/0233 430/286.1 |
| 2009/0087799 A1 | * | 4/2009 | Tachibana | G03F 7/091 430/323 |
| 2012/0052441 A1 | | 3/2012 | Sagehashi et al. | |
| 2012/0107563 A1 | * | 5/2012 | Yonezawa | G03F 7/40 428/156 |
| 2012/0251949 A1 | * | 10/2012 | Miyabe | C08L 79/08 430/283.1 |
| 2014/0234777 A1 | | 8/2014 | Sakurai et al. | |
| 2015/0024173 A1 | | 1/2015 | Tahara et al. | |
| 2016/0313641 A1 | | 10/2016 | De et al. | |
| 2017/0045818 A1 | | 2/2017 | Karasawa et al. | |
| 2017/0298186 A1 | | 10/2017 | Takemura et al. | |
| 2018/0031970 A1 | | 2/2018 | Arimoto et al. | |
| 2018/0051136 A1 | | 2/2018 | Koyama et al. | |
| 2018/0052391 A1 | | 2/2018 | Katsurada et al. | |
| 2018/0079864 A1 | | 3/2018 | Kawabata et al. | |
| 2018/0275513 A1 | | 9/2018 | Takemura et al. | |
| 2018/0284614 A1 | | 10/2018 | Satoh et al. | |
| 2018/0342386 A1 | | 11/2018 | Onishi et al. | |
| 2018/0356727 A1 | | 12/2018 | Shuto et al. | |
| 2020/0004145 A1 | * | 1/2020 | Fujimura | C08L 63/00 |
| 2020/0012192 A1 | | 1/2020 | Sakurai | |
| 2020/0081343 A1 | | 3/2020 | Furue et al. | |
| 2020/0363722 A1 | * | 11/2020 | Kandanarachchi | G03F 7/0233 |
| 2021/0284839 A1 | | 9/2021 | Komori et al. | |

FOREIGN PATENT DOCUMENTS

| | | | |
|---|---|---|---|
| JP | S55-45746 A | 3/1980 | |
| JP | H02-060941 A | 3/1990 | |
| JP | H02-099537 A | 4/1990 | |
| JP | H02-115238 A | 4/1990 | |
| JP | H11-100378 A | 4/1999 | |
| JP | 2001-310937 A | 11/2001 | |
| JP | 2003-55362 A | 2/2003 | |
| JP | 2003-231860 A | 8/2003 | |
| JP | 2005-8847 A | 1/2005 | |
| JP | 2005-18012 A | 1/2005 | |
| JP | 2005-146038 A | 6/2005 | |
| JP | 2005-290052 A | 10/2005 | |
| JP | 2006-133757 A | 5/2006 | |
| JP | 2006-199790 A | 8/2006 | |
| JP | 3824286 B2 | 9/2006 | |
| JP | 2006-273748 A | 10/2006 | |
| JP | 2006-313237 A | 11/2006 | |
| JP | 2006-348252 A | 12/2006 | |
| JP | 2007-199653 A | 8/2007 | |
| JP | 2008-24920 A | 2/2008 | |
| JP | 2008-115263 A | 5/2008 | |
| JP | 2014-186300 A | 10/2014 | |
| JP | 5609815 B2 | 10/2014 | |
| JP | 2015-129791 A | 7/2015 | |
| JP | 2015-200819 A | 11/2015 | |
| JP | 5987984 B2 | 9/2016 | |
| JP | 2017-044964 A | 3/2017 | |
| JP | 2018010066 A * | 1/2018 | ............ G03F 7/004 |
| JP | 6414060 B2 | 10/2018 | |
| JP | 6601628 B2 | 11/2019 | |
| KR | 10-2014-0103839 A | 8/2014 | |
| KR | 10-2018-0035724 A | 4/2018 | |
| KR | 10-2018-0095228 A | 8/2018 | |
| KR | 10-2019-0080865 A | 7/2019 | |
| TW | 201829539 A | 8/2018 | |
| TW | 201840609 A | 11/2018 | |
| TW | 201842421 A | 12/2018 | |
| WO | 2004/074242 A2 | 9/2004 | |
| WO | 2013/118680 A1 | 8/2013 | |
| WO | 2015/087831 A1 | 6/2015 | |
| WO | 2016/140024 A1 | 9/2016 | |
| WO | 2016/158150 A1 | 10/2016 | |
| WO | 2016/158389 A1 | 10/2016 | |
| WO | 2016/172092 A1 | 10/2016 | |
| WO | 2016/194769 A1 | 12/2016 | |
| WO | 2017/038664 A1 | 3/2017 | |
| WO | 2017/043375 A1 | 3/2017 | |
| WO | 2017/159476 A1 | 9/2017 | |
| WO | 2017/170032 A1 | 10/2017 | |
| WO | 2017/188153 A1 | 11/2017 | |
| WO | WO-2018084149 A1 * | 5/2018 | ............... C08F 8/48 |
| WO | 2019/031114 A1 | 2/2019 | |

OTHER PUBLICATIONS

May 5, 2022 Office Action and Search Report issued in Taiwan Patent Application No. 110128252.
May 30, 2022 Office Action and Search Report issued in Taiwan Patent Application No. 110128250.

(56) References Cited

OTHER PUBLICATIONS

Dec. 21, 2021 Extended European Search Report issued in European Patent Application No. 21188845.8.
Dec. 17, 2021 Extended European Search Report issued in European Application No. 21188838.3.
Yu, D., "A New Integration Technology Platform: Integrated Fan-Out Wafer-Level-Packaging for Mobile Applications," 2015 Symposium on VLSI Technology Digest of Technical Papers, T46-T47.
Kurita et al., "Fan-Out Wafer-Level Packaging with Highly Flexible Design Capabilities," Proceedings of Electronic System-integration Technology Conference 2010, pp. 1-6.
Braun et al., "Large Area Compression Molding for Fan-out Panel Level Packing," Proceedings of Electronic Components & Technology Conference 2015, pp. 1077-1083.
Yu, C. H., et al. "High Performance, High Density RDL for Advanced Packaging," IEEE 68th Electronic Components and Technology Conference, pp. 587-593, 2018.
U.S. Appl. No. 17/389,948, filed Jul. 30, 2021 in the name of Iio et al.
1 May 9, 2023 Office Action issued in Japanese Application 2020-132426.
Jul. 13, 2023 Office Action Issued In U.S. Appl. No. 17/389,948.
Mar. 7, 2024 Office Action issued in European Patent Application No. 21188845.8.
Oct. 4, 2023 Office Action issued in Korean Application No. 10-2021-0100952.
Dec. 28, 2023 U.S. Office Action issued in U.S. Appl. No. 17/389,948.
Oct. 3, 2023 Office Action issued in Japanese Patent Application No. 2020-132426.
Oct. 4, 2023 Office Action issued in Korean Patent Application No. 10-2021-0100647.
May 3, 2024 U.S. Office Action issued in U.S. Appl. No. 17/389,948.
Mar. 7, 2024 Office Action issued in European Patent Application No. 21 188 838.3.
Mar. 19, 2024 Reasons for Refusal issued in Japanese Patent Application No. 2021-114756.
Mar. 22, 2024 Office Action issued in Korean Patent Application No. 10-2021-0100952.

\* cited by examiner

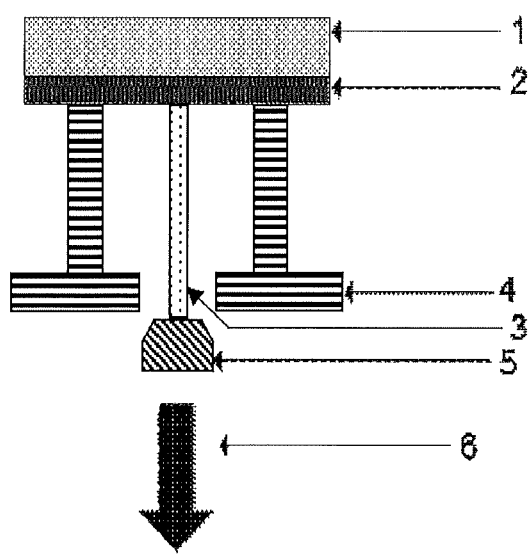

POSITIVE PHOTOSENSITIVE RESIN COMPOSITION, POSITIVE PHOTOSENSITIVE DRY FILM, METHOD FOR PRODUCING POSITIVE PHOTOSENSITIVE DRY FILM, PATTERNING PROCESS, METHOD FOR FORMING CURED FILM, INTERLAYER INSULATION FILM, SURFACE PROTECTIVE FILM, AND ELECTRONIC COMPONENT

TECHNICAL FIELD

The present invention relates to: a positive photosensitive resin composition; a positive photosensitive dry film; a method for producing the positive photosensitive dry film; a patterning process capable of developing with an alkaline aqueous solution that uses the positive photosensitive resin composition and the positive photosensitive dry film; a method for forming a cured film; an interlayer insulation film; a surface protective film; and an electronic component.

BACKGROUND ART

As miniaturization and higher performance of various electronic devices such as personal computers, digital cameras, and mobile phones advance, a demand for further miniaturization, thinning and higher density in semiconductor devices are also increasing rapidly. Accompanying these, it is demanded for interlayer insulation films and surface protective films of semiconductor devices to combine excellent electric characteristics, heat resistance, mechanical characteristics and the like.

In a high-density mounting technology such as a three-dimensional lamination, as a photosensitive insulation material capable of forming a pattern on a substrate, a polyimide film has been utilized as a protective film or an insulation layer, its insulation property, mechanical characteristics, and adhesiveness with a substrate, and so forth have continued to draw attention, and its development is active even now. In particular, a Fan out Wafer Level Package (FO-WLP) structure has been paid attention to, being advantageous from viewpoints of higher transmission speed, and miniaturization and thinning of devices. Various FO-WLP structures are being studied (Non Patent Document 1).

FO-WLP is mass-produced in 12-inch wafer size. On the other hand, in recent years, a Fan Out Panel Level Package (FO-PLP), which raises productivity by wiring formation on a substrate using a film, is being studied (Non Patent Document 2, Non Patent Document 3).

A characteristic of rewiring formation in FO-PLP is in wiring formation on a surface layer of a mold material in which a die is implanted. Therefore, low temperature curing at 220° C. or lower is required in an insulation material for rewiring in this process from the viewpoint of heat resistance of the mold material, which contains epoxy resin as a main component. In addition, generally in FO-PLP, it is common to form wiring on only one side, and warp suppression is also a problem.

A photosensitive polyimide material is used for surface protective films and interlayer insulation films of semiconductor devices, and wiring protection insulation films for circuit formation. This is because photosensitive polyimide materials are excellent in electric characteristics and mechanical characteristics, and has heat resistance to 300° C. or higher. In particular, to improve the above-described problem, a photosensitive polyimide that uses a pre-imidized and solvent-soluble resin has been proposed in order to lower a post-curing temperature (Patent Document 1).

Patent Document 1 proposes a positive photosensitive resin composition that uses an alkali-soluble and closed-ring polyimide, a quinonediazide compound, and a heat cross-linking agent having a methylol group, and the positive photosensitive resin composition is a material excellent in resolution. However, there has been room for improving a value of breaking elongation when cured at low temperatures.

In addition, in achieving a dry film of a photosensitive polyimide, the following are proposed: a negative photosensitive resin composition having a dissolution modifier added to a solvent-soluble polyimide resin as a plasticizer (Patent Document 2); a positive photosensitive resin composition having an alkali-soluble polyimide as a base resin with a diamine unit having a flexible chain introduced into the polyimide, and having a heat crosslinking agent having a flexible chain added as a plasticizer (Patent Document 3); a positive photosensitive resin composition having epoxy resin added as a plasticizer to a mixture of a polyimide resin and a crosslinkable resin based on hydroxystyrene (Patent Document 4); and the like.

In Patent Document 2, the material is excellent in physical properties of the cured film and electric characteristics. However, radical polymerization is adopted for the patterning mechanism, and due to the photocuring mechanism, the material is liable to oxygen impedance, and there has been room for improvement regarding demands for miniaturization. Meanwhile, in Patent Document 3 and Patent Document 4, only physical properties of the cured film at a curing temperature of 250° C. or 220° C. are considered, and there is no description of the physical properties of the cured film or lithography performance of fine patterns in low temperature curing.

In addition, to improve the mechanical strength of a cured film, addition of a (meth)acrylic resin is proposed for achieving both lithography characteristics and physical properties of the cured film (Patent Document 5, Patent Document 6, and Patent Document 7). Patent Document 5 proposes a positive photosensitive resin composition, where a crosslinkable acrylic resin is added to an alkali-soluble resin having a phenolic hydroxy group. However, consideration of miniaturization and pattern shapes are insufficient, and there has been room for improvement in photosensitive characteristics.

Patent Document 6 and Patent Document 7 propose positive photosensitive resin compositions containing one polymer selected from polyimide, polybenzoxazole, and precursors thereof and an acrylic resin. The positive photosensitive resin compositions are materials excellent in physical properties of the cured film and stress, but there is no mention regarding lithography performance.

Thus, hereafter, as higher densification and higher integration of chips proceed, the miniaturization of patterns in a rewiring technology of the insulation protective film further proceeds. Accordingly, as the photosensitive resin composition, there is strong demand for a composition that can be made into a film, and that can realize high resolution without damaging excellent features such as the mechanical characteristics of a protective film, adhesiveness, and so forth.

CITATION LIST

Patent Literature

Patent Document 1: JP 2006-313237 A
Patent Document 2: WO 2016/172092

Patent Document 3: WO 2016/158150
Patent Document 4: WO 2017/170032
Patent Document 5: WO 2013/118680
Patent Document 6: JP 2015-129791 A
Patent Document 7: JP 2015-200819 A Non Patent Literature Non Patent Document 1: 2015 Symposium on VLSI Technology Digest of Technical Papers, T46-47
Non Patent Document 2: Proceedings of Electronic System—integration Technology Conference 2010, pp. 1-6
Non Patent Document 3: Proceedings of Electronic Components and Technology Conference 2015, pp. 1077-1083

SUMMARY OF INVENTION

Technical Problem

The present invention has been made in view of the above-described circumstances, and an object thereof is to provide a positive photosensitive resin composition and a positive photosensitive dry film that is soluble in an alkaline aqueous solution, that can achieve high resolution without damaging excellent features such as the mechanical characteristics of a protective film, adhesiveness, etc., and that has excellent mechanical characteristics and adhesiveness to a substrate even when cured at low temperatures.

Solution to Problem

To solve the problem, the present invention provides
a positive photosensitive resin composition comprising:
(A) an alkali-soluble resin containing at least one or more structures selected from a polyimide structure, a polyamide structure, a polybenzoxazole structure, a polyamide-imide structure, and a precursor structure thereof;
(B) a crosslinkable polymer compound containing a structural unit represented by the following general formula (1) and having a group crosslinked with the component (A); and
(C) a compound having a quinonediazide structure for serving as a photosensitizer to generate an acid by light and increase a dissolution speed to an alkaline aqueous solution,

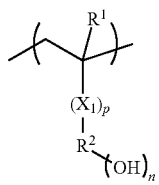

(1)

wherein $R^1$ represents a hydrogen atom or a methyl group, $R^2$ represents a linear, branched, or cyclic aliphatic saturated hydrocarbon group with a valency of (n+1) having 1 to 15 carbon atoms, an aromatic hydrocarbon group having 6 to 15 carbon atoms, a benzyl group, or a naphthalene methyl group, wherein a carbon atom of the aliphatic saturated hydrocarbon group is optionally substituted with an oxygen atom; "n" is an integer of 1 to 5; $X_1$ each represents —C(=O)—O—, —C(=O)—NH—, or —C(=O)—N($R^3$OH)—; $R^3$ represents a divalent linear, branched, or cyclic aliphatic saturated hydrocarbon group having 1 to 12 carbon atoms, or an aromatic hydrocarbon group having 6 to 12 carbon atoms, wherein a carbon atom of the aliphatic saturated hydrocarbon group is optionally substituted with an oxygen atom; and "p" is 0 or 1.

Such a positive photosensitive resin composition is soluble in an alkaline aqueous solution, enables formation of a fine pattern and high resolution, and has excellent mechanical characteristics and adhesiveness to a substrate even when cured at low temperatures. Furthermore, a dry film can be provided with flexibility while maintaining lithography characteristics.

Furthermore, the component (B) of the inventive positive photosensitive resin composition is preferably a crosslinkable polymer compound containing a structural unit represented by the following general formula (2) and containing a structural unit represented by the following general formula (3), the structural unit having a group crosslinked with the component (A),

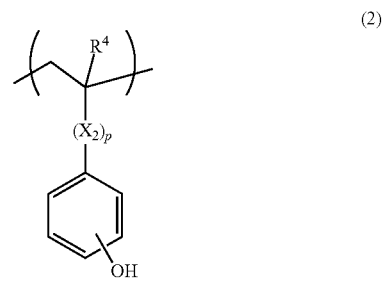

(2)

wherein $R^4$ represents a hydrogen atom or a methyl group, $X_2$ each represents —C(=O)—O—, —C(=O)—NH—, or —C(=O)—N($R^5$OH)—; $R^5$ represents a divalent linear, branched, or cyclic aliphatic saturated hydrocarbon group having 1 to 12 carbon atoms, or an aromatic hydrocarbon group having 6 to 12 carbon atoms, wherein a carbon atom of the aliphatic saturated hydrocarbon group is optionally substituted with an oxygen atom; and "p" is 0 or 1,

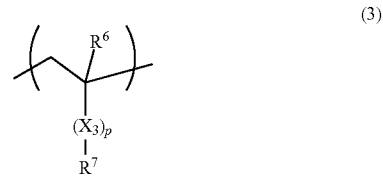

(3)

wherein $R^6$ represents a hydrogen atom or a methyl group, $R^7$ represents a group containing an oxazoline group, an isocyanate group, a blocked isocyanate group, an oxetanyl group, and an epoxy group, $X_3$ represents —C(=O)—O—, a phenylene group, or a naphthylene group; and "p" is 0 or 1.

Such a positive photosensitive resin composition makes it possible to adjust the alkali-solubility of an exposed part, and enables formation of a finer pattern and high resolution. Furthermore, mechanical characteristics and adhesiveness to a substrate become excellent even when cured at low temperatures.

Furthermore, the component (B) is preferably a crosslinkable polymer compound containing structural units represented by the following general formula (2) and the following general formula (4),

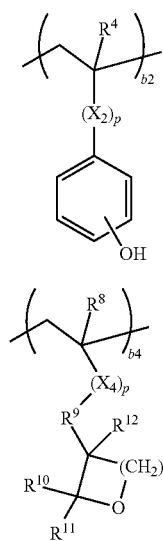

(2)

(4)

wherein $R^8$ represents a hydrogen atom or a methyl group, $X_4$ each represents —C(=O)—O—, a phenylene group, or a naphthylene group; $R^9$ represents a linear, branched, or cyclic alkylene group having 1 to 15 carbon atoms, optionally containing a hydroxy group, an ester group, an ether group, or an aromatic hydrocarbon, $R^{10}$ represents a hydrogen atom, a linear, branched, or cyclic alkyl group having 1 to 6 carbon atoms, or is optionally bonded with $R^9$ to form a ring; $R^{11}$ represents a hydrogen atom or a linear, branched, or cyclic alkyl group having 1 to 6 carbon atoms, $R^{12}$ represents a hydrogen atom or a linear alkyl group having 1 to 6 carbon atoms, and is optionally bonded with $R^9$ to form a ring; "m" is 0 or 1; "p" is 0 or 1; $0<b2<1.0$, $0<b4<1.0$, and $0<b2+b≤1.0$; $R^4$ represents a hydrogen atom or a methyl group, $X_2$ each represents —C(=O)—O—, —C(=O)—NH—, or —C(=O)—N($R^5$OH)—; and $R^5$ represents a divalent linear, branched, or cyclic aliphatic saturated hydrocarbon group having 1 to 12 carbon atoms, or an aromatic hydrocarbon group having 6 to 12 carbon atoms, wherein a carbon atom of the aliphatic saturated hydrocarbon group is optionally substituted with an oxygen atom.

When such a crosslinkable polymer compound is added to (A) an alkali-soluble resin containing at least one or more structures selected from a polyimide structure, a polyamide structure, a polybenzoxazole structure, a polyamide-imide structure, and a precursor structure thereof, a fine pattern can be achieved by excellent alkali dissolution contrast in an exposed/unexposed part. Moreover, since a crosslinkable group excellent in crosslinking property is present, the compound undergoes a crosslinking reaction with a phenolic hydroxy group of (A) the alkali-soluble resin, so that there is no degradation in adhesiveness with a substrate after a reliability test.

Furthermore, (D) a heat crosslinking agent is preferably further comprised.

Furthermore, the component (D) preferably contains one or more kinds of crosslinking agents selected from an amino condensate modified by formaldehyde or formaldehyde-alcohol; a phenol compound having two or more methylol groups or alkoxymethylol groups by average in one molecule; a compound in which a hydrogen atom of a phenolic hydroxy group of polyhydric phenol is substituted with a glycidyl group; a compound in which a hydrogen atom of a phenolic hydroxy group of polyhydric phenol is substituted with a substituent represented by the following formula (D-1); and a compound containing two or more nitrogen atoms having a glycidyl group represented by the following formula (D-2),

(D-1)

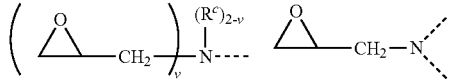
(D-2)

wherein a dotted line represents a bond, $R^c$ represents a linear, branched, or cyclic alkyl group having 1 to 6 carbon atoms, and "v" represents 1 or 2.

The alkali-solubility of an exposed/unexposed part can be adjusted by adding the component (D). In addition, by the component (D) being crosslinked with the component (A) and the component (B) during post-curing, the crosslinking density of the cured film can be raised, and excellent mechanical strength can be achieved.

Furthermore, 1 to 50 parts by mass of the component (B) is preferably contained relative to 100 parts by mass of the component (A).

Within such a range, sufficient mechanical characteristics, in particular, elongation and tensile strength of the cured film can be achieved while maintaining excellent lithography characteristics and physical properties of the cured film.

Furthermore, 0.5 to 100 parts by mass of the component (D) is preferably contained relative to 100 parts by mass of the component (A).

Within such a range, the film can be provided with flexibility while maintaining lithography characteristics when the positive photosensitive resin composition is made into a dry film.

Any one or more of (E) a protective amine compound, (F) a thermal acid generator, (G) an antioxidant, and (H) a silane compound is preferably further comprised.

The component (E) produces a basic compound on curing at high temperatures, becomes a catalyst for a crosslinking reaction, and can promote a curing reaction. The component (F) can further improve the mechanical strength, chemical resistance, adhesiveness and so forth of an obtained pattern or film by further advancing the crosslinking and curing reaction. The component (G) can suppress degradation of physical properties due to degradation by oxidation of the cured film during a reliability test such as a high humidity test or a thermal shock test, and a more suitable cured film can be formed. The component (H) can further improve the adhesiveness of the obtained pattern or film to a substrate.

Furthermore, the present invention provides a patterning process comprising:
(1) forming a photosensitive material film by coating a substrate with the above-described positive photosensitive resin composition;
(2) subsequently, after a heat treatment, exposing the photosensitive material film with a high energy beam having a wavelength of 190 to 500 nm or an electron beam via a photomask; and
(3) after irradiation, developing with a developer of an alkaline aqueous solution.

According to such a patterning process, since the positive photosensitive resin composition used is soluble in an alkaline aqueous solution, a fine pattern can be formed and high resolution can be achieved.

Furthermore, the present invention provides a positive photosensitive dry film, which has a photosensitive resin layer having a film thickness of 5 to 200 μm, the photosensitive resin layer being sandwiched between a supporting film and a top coat film, wherein the photosensitive resin layer is formed using the above-described positive photosensitive resin composition.

Such a positive photosensitive dry film is soluble in an alkaline developer, a fine pattern can be formed, and high resolution can be achieved.

Furthermore, the present invention provides a method for producing a positive photosensitive dry film, comprising:
(1) forming a photosensitive resin layer by continuously coating a supporting film with the above-described positive photosensitive resin composition;
(2) continuously drying the photosensitive resin layer; and further
(3) laminating a top coat film onto the photosensitive resin layer.

According to such a method for producing a positive photosensitive dry film, the above-described dry film can be mass-produced stably with good yield.

Furthermore, the patterning process provides a patterning process comprising:
(1) adhering onto a substrate the photosensitive resin layer which becomes exposed by delaminating the top coat film from the above-described positive photosensitive dry film;
(2) exposing the photosensitive resin layer to a high energy beam having a wavelength of 190 to 500 nm or an electron beam via a photomask under the state of intervention of the supporting film or under the state of the supporting film delaminated; and
(3) after irradiation, developing with a developer of an alkaline aqueous solution.

According to such a patterning process, the positive photosensitive dry film can be adhered to a substrate without bubbles or creases on adhering, and furthermore, a fine pattern can be formed by photolithography.

Furthermore, the present invention provides a method for forming a cured film comprising:
heating and post-curing a film on which a pattern is formed by the above-described patterning process at a temperature of 100 to 300° C.

According to such a method for forming a cured film, a cured film (pattern) excellent in mechanical characteristics can be formed even when cured at low temperatures.

Furthermore, the present invention provides an interlayer insulation film being a cured film by curing the above-described positive photosensitive resin composition or the above-described positive photosensitive dry film.

Furthermore, the present invention provides a surface protective film being a cured film by curing the above-described positive photosensitive resin composition or the above-described positive photosensitive dry film.

The cured film obtained by curing the inventive positive photosensitive resin composition and positive photosensitive dry film has excellent adhesiveness with a substrate, heat resistance, electric characteristics, mechanical strength, and chemical resistance to alkaline release liquid or the like, and a semiconductor device having the cured film as a protective coating has excellent reliability. Therefore, the cured film is suitable as a protective coating (an interlayer insulation film or surface protective film) of electric and electronic components, semiconductor devices and the like.

Furthermore, the present invention provides an electronic component having the above-described interlayer insulation film or surface protective film.

Such a protective coating (interlayer insulation film or surface protective film) is effective for an insulation film for semiconductor devices including rewiring use, an insulation film for multilayer printed board and so on from the viewpoint of heat resistance, chemical resistance, and insulation property, and can give electronic components having excellent reliability.

Advantageous Effects of Invention

As described above, according to the present invention, it is possible to provide a positive photosensitive resin composition and a positive photosensitive dry film that are soluble in an alkaline aqueous solution, that can achieve high resolution without damaging excellent features such as mechanical characteristics and adhesiveness of a protective film, etc., and that has excellent mechanical characteristics and adhesiveness to a substrate even when cured at low temperatures.

BRIEF DESCRIPTION OF DRAWINGS

FIG. 1 is an explanatory diagram illustrating an adhesion measurement method.

DESCRIPTION OF EMBODIMENTS

As described above, there has been demand for a photosensitive resin composition that is soluble in an alkaline aqueous solution, can be made into a film, and that can realize high resolution without damaging excellent features such as the mechanical characteristics of a protective film, adhesiveness, and so forth.

To achieve the object, the present inventors have earnestly studied and found out that a positive photosensitive resin composition containing: (A) an alkali-soluble resin containing at least one or more structures selected from a polyimide structure, a polyamide structure, a polybenzoxazole structure, a polyamide-imide structure, and a precursor structure thereof; (B) a crosslinkable polymer compound containing a structural unit represented by the following general formula (1) and having a group crosslinked with the component (A); and (C) a compound having a quinonediazide structure for serving as a photosensitizer to generate an acid by light and increase a dissolution speed to an alkaline aqueous solution can be made into a dry film. In addition, the present inventors have found out that high resolution can be achieved without damaging excellent features such as mechanical characteristics and adhesiveness of a protective film and so forth even when cured at low temperatures.

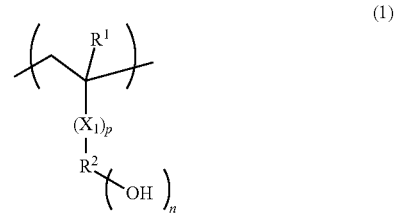

(1)

In the formula, $R^2$ represents a hydrogen atom or a methyl group, $R^2$ represents a linear, branched, or cyclic aliphatic saturated hydrocarbon group with a valency of (n+1) having 1 to 15 carbon atoms, an aromatic hydrocarbon group having 6 to 15 carbon atoms, a benzyl group, or a naphthalene methyl group, where a carbon atom of the aliphatic saturated hydrocarbon group is optionally substituted with an oxygen atom; "n" is an integer of 1 to 5; $X_1$ each represents —C(=O)—O—, —C(=O)—NH—, or —C(=O)—N($R^3$OH)—; $R^3$ represents a divalent linear, branched, or cyclic aliphatic saturated hydrocarbon group having 1 to 12 carbon atoms, or an aromatic hydrocarbon group having 6 to 12 carbon atoms, where a carbon atom of the aliphatic saturated hydrocarbon group is optionally substituted with an oxygen atom; and "p" is 0 or 1.

Furthermore, the present inventors have found out that a protective film obtained by using the above-described positive photosensitive resin composition and positive photosensitive dry film, by forming a pattern and heating has excellent mechanical characteristics, and has excellent adhesion after a high temperature and high humidity test. That is, the present inventors have found that a cured film with a pattern formed by using the positive photosensitive resin composition and positive photosensitive dry film is excellent as an electric, electronic component protective film, and an insulation protective film, and thus completed the present invention. In the present specification, the electric and electronic components are also summarized as "electronic component".

That is, the present invention is a positive photosensitive resin composition containing:

(A) an alkali-soluble resin containing at least one or more structures selected from a polyimide structure, a polyamide structure, a polybenzoxazole structure, a polyamide-imide structure, and a precursor structure thereof;

(B) a crosslinkable polymer compound containing a structural unit represented by the general formula (1) and having a group crosslinked with the component (A); and (C) a compound having a quinonediazide structure for serving as a photosensitizer to generate an acid by light and increase a dissolution speed to an alkaline aqueous solution.

Hereinafter, the present invention will be described in detail, but the present invention is not limited thereto.

[Positive Photosensitive Resin Composition]

The positive photosensitive resin composition of the present invention will be described.

The inventive positive photosensitive resin composition contains:

(A) an alkali-soluble resin containing at least one or more structures selected from a polyimide structure, a polyamide structure, a polybenzoxazole structure, a polyamide-imide structure, and a precursor structure thereof;

(B) a crosslinkable polymer compound containing a structural unit represented by the following general formula (1) and having a group crosslinked with the component (A); and (C) a compound having a quinonediazide structure for serving as a photosensitizer to generate an acid by light and increase a dissolution speed to an alkaline aqueous solution.

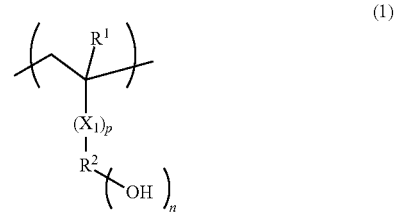

(1)

In the formula, $R^2$ represents a hydrogen atom or a methyl group, $R^2$ represents a linear, branched, or cyclic aliphatic saturated hydrocarbon group with a valency of (n+1) having 1 to 15 carbon atoms, an aromatic hydrocarbon group having 6 to 15 carbon atoms, a benzyl group, or a naphthalene methyl group, where a carbon atom of the aliphatic saturated hydrocarbon group is optionally substituted with an oxygen atom; "n" is an integer of 1 to 5; $X_1$ each represents —C(=O)—O—, —C(=O)—NH—, or —C(=O)—N($R^3$OH)—; $R^3$ represents a divalent linear, branched, or cyclic aliphatic saturated hydrocarbon group having 1 to 12 carbon atoms, or an aromatic hydrocarbon group having 6 to 12 carbon atoms, where a carbon atom of the aliphatic saturated hydrocarbon group is optionally substituted with an oxygen atom; and "p" is 0 or 1.

The positive photosensitive resin composition can be alkali-developed. Furthermore, the positive photosensitive resin composition may further contain, as needs arise, (D) a heat crosslinking agent, (E) a protective amine compound, (F) a thermal acid generator, (G) an antioxidant, (H) a silane compound and the like, besides the component (A), component (B), and component (C). Hereinafter, these components will be described in detail.

[(A) Alkali-Soluble Resin]

The alkali-soluble resin (A) of the present invention contains at least one or more structures selected from a polyimide structure, a polyamide structure, a polybenzoxazole structure, a polyamide-imide structure, and a precursor structure thereof. The resin (A) is not particularly limited as long as the resin (A) is an alkali-soluble resin containing a structure mentioned above, but a resin containing the structure represented by the following general formula (5) and/or (6) is preferable.

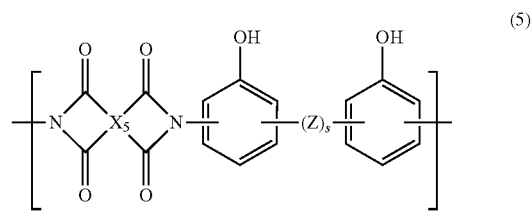

(5)

In the formula, $X_5$ represents a tetravalent organic group, "s" represents 0 or 1, Z represents a divalent linking group, and when s=0, two aromatic rings in the formula are directly bonded without a linking group.

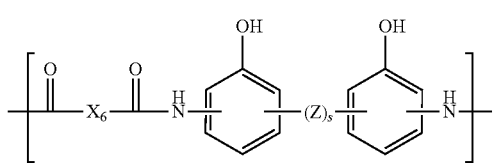
(6)

In the formula, $X_6$ represents a divalent organic group, and "s" and Z are the same as those described above.

$X_5$ in the general formula (5) represents a tetravalent organic group, but it is not limited as long as it is a tetravalent organic group. $X_5$ is preferably a tetravalent organic group of an alicyclic aliphatic group having 4 to 40 carbon atoms or an aromatic group, and more preferably, a tetravalent organic group represented by the following formula (7). Furthermore, a structure of $X_5$ may be one kind or a combination of two or more kinds.

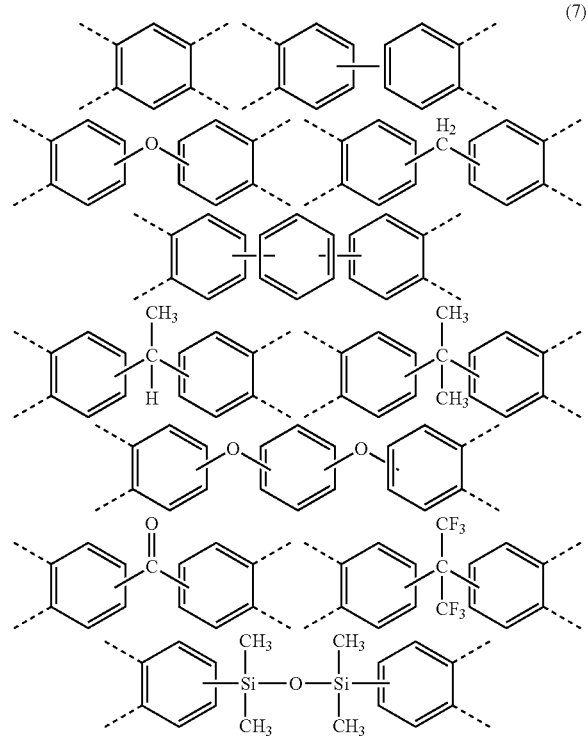
(7)

In the formulae, a dotted line represents a bond.

The "s" in the general formula (5) represents 0 or 1, and when "s" is 0, two aromatic rings in the general formula (5) are bonded directly without the divalent linking group Z.

Meanwhile, when "s" is 1, two aromatic rings in the general formula (5) are bonded via the divalent linking group Z. Z is not limited as long as it is a divalent group. Preferably, Z is a divalent organic group of an alicyclic aliphatic group having 4 to 40 carbon atoms or an aromatic group, and more preferably a divalent linking group represented by the following formula (8). The structure of Z may be one kind or a combination of two or more kinds.

$$*-(CH_2)_{q_1}-* \quad *-(CF_2)_{q_2}-* \quad *---O---* \quad *----S----*$$
(8)

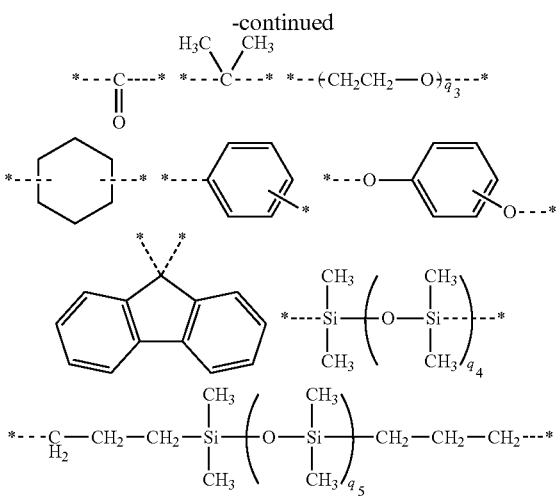

In the formulae, $q_1$, $q_2$, and $q_3$ represent an integer of 1 to 6, and $q_4$ and $q_5$ represent an integer of 1 to 10. A dotted line represents a bond.

In particular, a preferable divalent linking group Z is a divalent group represented by the following general formula (9) or (10).

(9)

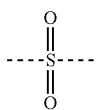
(10)

In the formulae, a dotted line represents a bond.

As a structural unit represented by the general formula (5), when Z in the general formula (5) is a group represented by the formula (9), a structural unit represented by the following general formula (5-1) is preferable, and when Z in the general formula (5) is a group represented by the formula (10), a structural unit represented by the following general formula (5-2) is preferable.

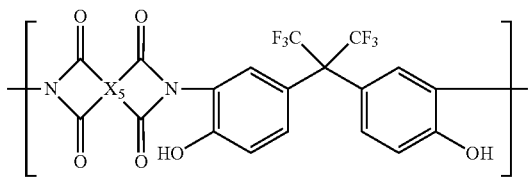
(5-1)

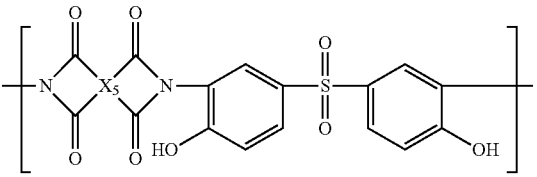
(5-2)

In the formulae, $X_5$ is the same as that described above.

As shown by the general formula (5-1), when the divalent linking group Z is a hexafluoropropylene group shown by the formula (9) and is located at a p-position of a phenolic hydroxy group, the acidity of the phenolic hydroxy group becomes high since the hexafluoropropylene group is an electron-withdrawing group. Thus, the solubility of an alkaline aqueous solution to a developer increases. Therefore, it is preferred that the Z be the group shown by the formula (9).

Similarly, as shown by the general formula (5-2), when the divalent linking group Z is a sulfonic group represented by the formula (10) and is located at a p-position of a phenolic hydroxy group, the acidity of the phenolic hydroxy group becomes high since the sulfonic group is also an electron-withdrawing group. Thus, the solubility of an alkaline aqueous solution to a developer increases. Therefore, it is also preferred that the Z be the group shown by the formula (10).

The $X_6$ in the general formula (6) is a divalent organic group, and is not limited as long as it is a divalent organic group. Preferably, $X_6$ is a divalent organic group of an aliphatic chain length structure or an alicyclic aliphatic group having 4 to 40 carbon atoms, or an aromatic group. Further preferably, $X_6$ is a divalent organic group represented by the following formula (11). The structure of $X_6$ may be one kind or a combination of two or more kinds.

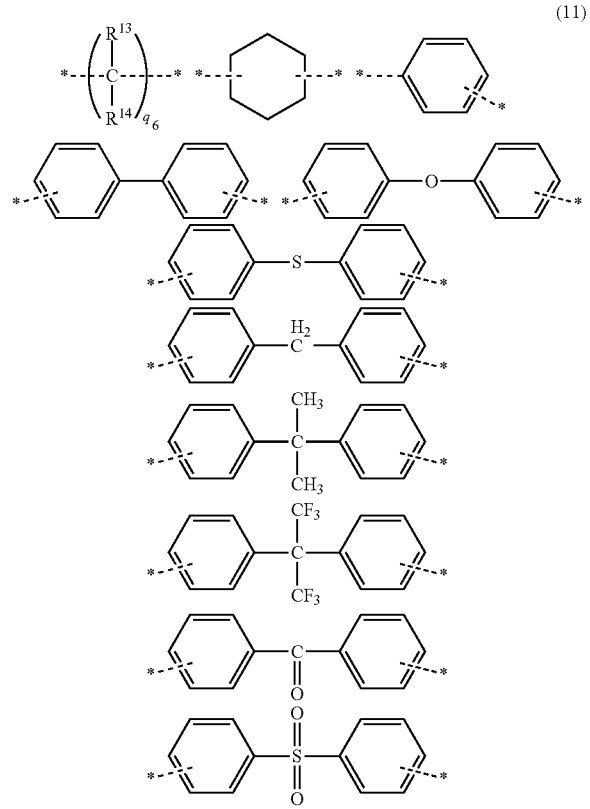

(11)

In the formulae, $R^{13}$ and $R^{14}$ each independently represents a hydrogen atom, a fluorine atom, or an alkyl group having 1 to 6 carbon atoms, $q_6$ is an integer of 1 to 30, and a dotted line represents a bond.

When the $X_6$ in the general formula (6) is a divalent organic group that is an aliphatic chain length structure, the mechanical strength, in particular, the elongation of a cured film of the inventive positive photosensitive resin composition is improved. Therefore, this case is preferred.

The "s" and Z in the general formula (6) are the same as the above, and Z is preferably the general formula (9) or (10) from the viewpoint of the solubility to a developer of an alkaline aqueous solution. Also in this case, in the same manner as the case of the formulae (5-1) and (5-2), the acidity of the phenolic hydroxy group becomes higher, and the solubility to the developer that is an alkaline aqueous solution is improved. Therefore, this case is preferred.

The alkali-soluble resin (A) of the present invention may further contain a structural unit represented by the following general formula (12) (hereinafter, also referred to as a structural unit (12)), in addition to the structural units shown by the general formulae (5) and (6).

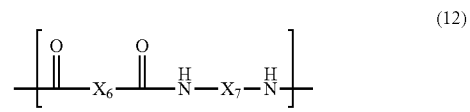

(12)

In the formula, $X_6$ is the same as the above. $X_7$ is a divalent organic group.

The $X_7$ in the general formula (12) is a divalent organic group, and is not restricted as long as it is a divalent organic group. However, $X_7$ is preferably a divalent organic group having 6 to 40 carbon atoms, more preferably a cyclic organic group having an aromatic ring having a substituent or a cyclic organic group containing 1 to 4 aliphatic rings, or an aliphatic group or a siloxane group not having a cyclic structure. Further suitable examples of $X_7$ include structures shown by the following formulae (13) or (14). The structure of $X_7$ may be one kind or a combination of two or more kinds.

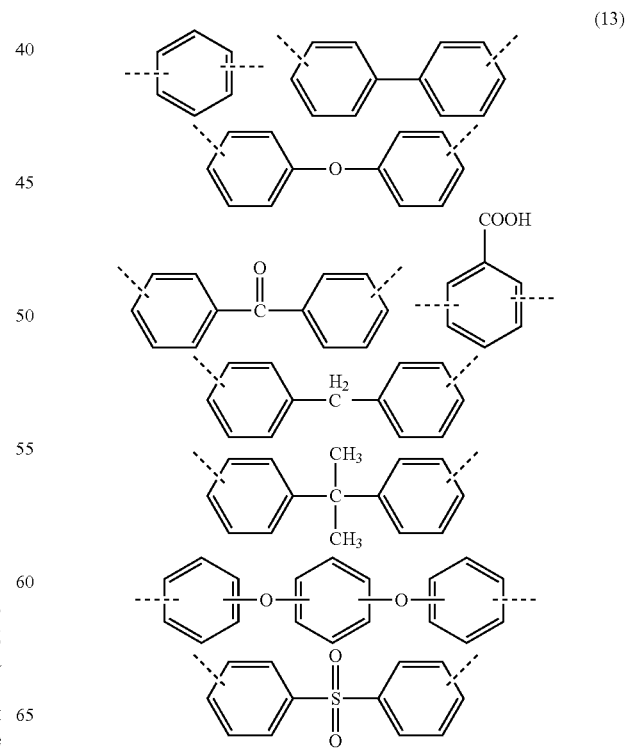

(13)

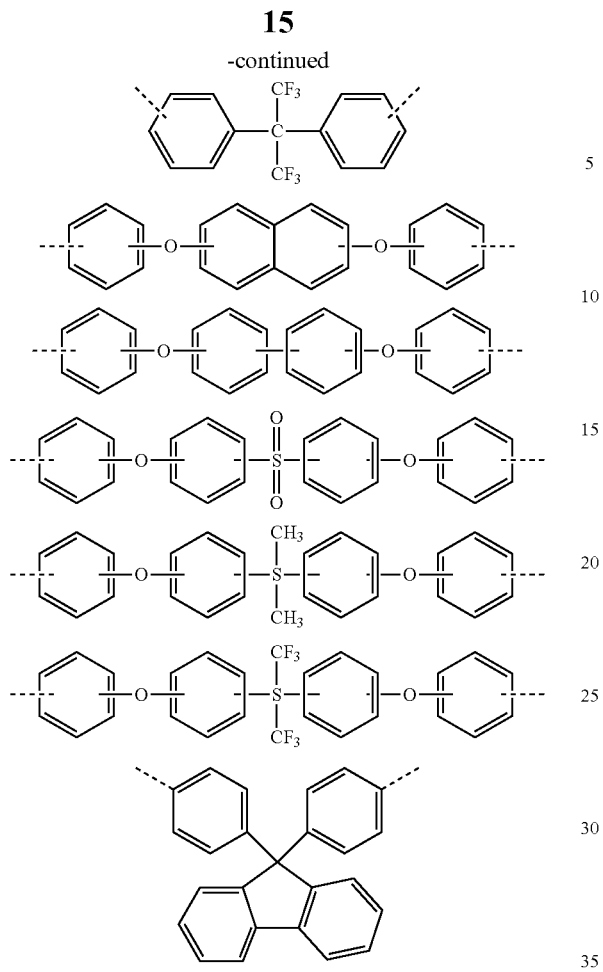

In the formulae, a dotted line represents a bond with an amino group.

(14)

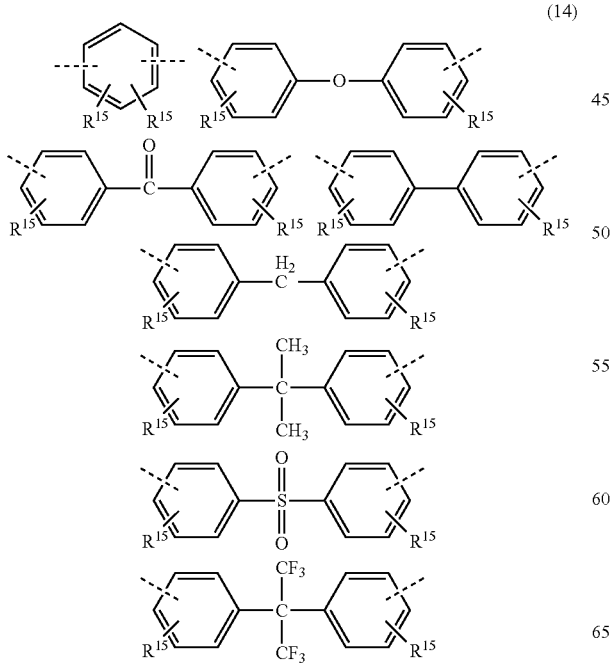

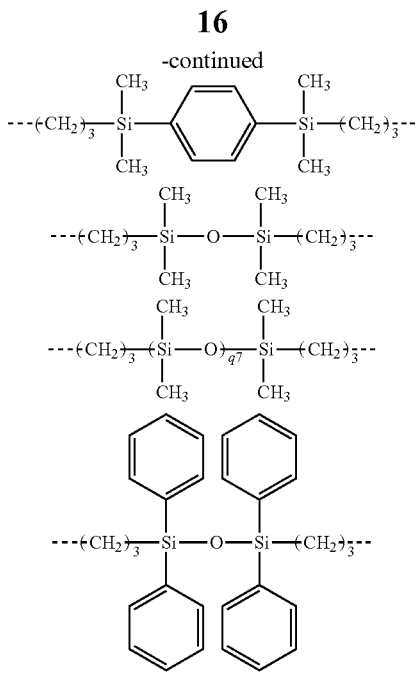

In the formulae, a dotted line represents a bond with an amino group, $R^{15}$ each independently represents a methyl group, an ethyl group, a propyl group, an n-butyl group, or a trifluoromethyl group, and $q_7$ represents a positive number of 2 to 20.

The alkali-soluble resin (A) of the present invention preferably further contains a structural unit represented by the following general formula (15) (hereinafter, also referred to as a structural unit (15)) in addition to the structural units represented by the general formulae (5) and (6).

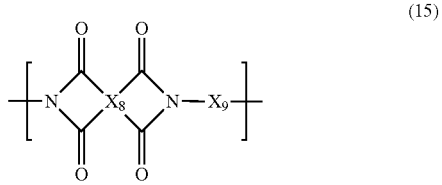

(15)

In the formula, $X_8$ is the same tetravalent organic group as or different from the $X_5$, $X_9$ is a group represented by the following general formula (16).

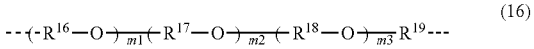

(16)

In the formula, $R^{16}$ to $R^{19}$ each independently represent a linear or branched alkylene group having 2 to 10 carbon atoms, $m_1$ is an integer of 1 to 40, and $m_2$ and $m_3$ each independently represent an integer of 0 to 40.

$X_8$ in the formula (15) may be a tetravalent organic group cited as $X_5$, for example, a tetravalent organic group shown by the formula (7). Meanwhile, in $X_9$ (the group represented by the general formula (16)), specific examples of a preferred organic group include the following. However, there is no restriction to these.

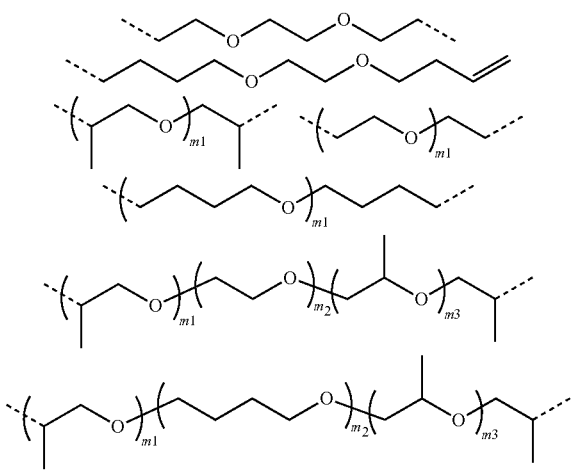

When the alkali-soluble resin (A) contains such a structural unit (15), flexibility is produced to obtain a cured film having high elongation and low warpage.

Furthermore, the alkali-soluble resin (A) of the present invention can also contain a structural unit represented by the following general formula (17) or (18) (hereinafter, structural unit (17), structural unit (18)).

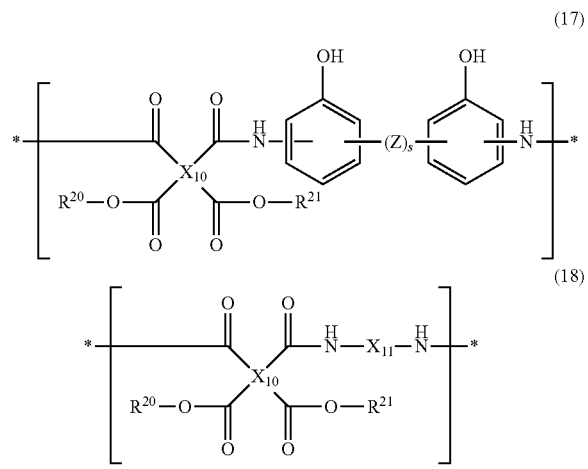

In the formulae, $X_{10}$ is the same tetravalent organic group as or different from the above $X_5$, $X_{11}$ is the same divalent organic group as or different from $X_7$, and "s" and Z are the same as above. $R^{20}$ and $R^{22}$ are each independently a hydrogen atom, a linear, branched, or cyclic alkyl group having 1 to 6 carbon atoms, or an organic group represented by the following general formula (19), where at least one of $R^{20}$ and $R^{22}$ is an organic group represented by the following general formula (19).

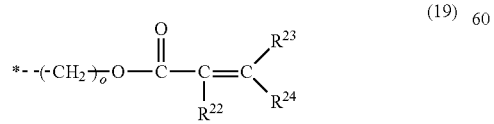

In the formula, a dotted line represents a bond. $R^{22}$ is a hydrogen atom or an organic group having 1 to 3 carbon atoms, $R^{23}$ and $R^{24}$ are each independently a hydrogen atom or an organic group having 1 to 3 carbon atoms, and "o" is an integer of 2 to 10.

The $X_{10}$ in the structural units (17) and (18) is a tetravalent organic group and can be the same as or different from the above-described $X_5$, and is not limited as long as it is a tetravalent organic group. $X_{10}$ is preferably a tetravalent organic group of an alicyclic aliphatic group having 4 to 40 carbon atoms or an aromatic group, further preferably a tetravalent organic group represented by the formula (7). The structure of $X_{10}$ may be one kind or a combination of two or more kinds.

Meanwhile, the $X_{11}$ in the structural unit (18) is a divalent organic group and can be the same as or different from the above-described $X_7$, and is not limited as long as it is a divalent organic group. $X_{11}$ is preferably a divalent organic group having 6 to 40 carbon atoms, more preferably a cyclic organic group having an aromatic ring having a substituent or a cyclic organic group containing 1 to 4 aliphatic rings, or an aliphatic group or a siloxane group not having a cyclic structure. Further suitable examples of $X_{11}$ include structures shown by the formulae (13) or (14). The structure of $X_{11}$ may be one kind or a combination of two or more kinds.

The $R^{20}$ and $R^{21}$ in the structures (17) and (18) are each independently a hydrogen atom or a linear, branched, or cyclic alkyl group having 1 to 6 carbon atoms, or an organic group represented by the general formula (19), and at least one of $R^{20}$ and $R^{21}$ is an organic group represented by the general formula (19).

The $R^{22}$ in the general formula (19) is not limited as long as it is a hydrogen atom or a monovalent organic group having 1 to 3 carbon atoms. However, from the viewpoint of photosensitive characteristics of the positive photosensitive resin composition, a hydrogen atom or a methyl group are preferable.

The $R^{23}$ and $R^{24}$ in the general formula (19) are not limited as long as they are each independently a hydrogen atom or a monovalent organic group having 1 to 3 carbon atoms. However, from the viewpoint of photosensitive characteristics of the positive photosensitive resin composition, a hydrogen atom is preferable.

The "o" in the general formula (19) is an integer of 2 to 10, and from the viewpoint of photosensitive characteristics, is preferably an integer of 2 to 4. Further preferably, "o" is 2.

[(B) Crosslinkable Polymer Compound]

The crosslinkable polymer compound (B) used in the present invention is not particularly limited as long as it contains a structural unit represented by the following general formula (1), and has a group crosslinked with the component (A).

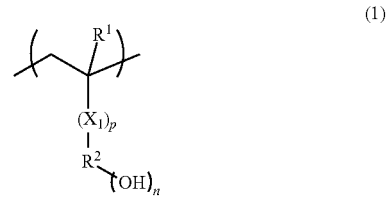

Here, in the general formula (1), $R^1$ represents a hydrogen atom or a methyl group. $R^2$ represents a linear, branched, or cyclic aliphatic saturated hydrocarbon group with a valency of (n+1) having 1 to 15 carbon atoms, an aromatic hydrocarbon group having 6 to 15 carbon atoms, a benzyl group, or a naphthalene methyl group, where a carbon atom of the aliphatic saturated hydrocarbon group is optionally substituted with an oxygen atom. "n" is an integer of 1 to 5. $X_1$ each represents —C(=O)—O—, —C(=O)—NH—, or —C(=O)—N($R^3$OH)—. $R^3$ represents a divalent linear, branched, or cyclic aliphatic saturated hydrocarbon group having 1 to 12 carbon atoms, or an aromatic hydrocarbon group having 6 to 12 carbon atoms, where a carbon atom of the aliphatic saturated hydrocarbon group is optionally substituted with an oxygen atom. "p" is 0 or 1.

In addition, specific examples of a monomer that can be favorably used for obtaining the structure represented by the general formula (1) include the following.

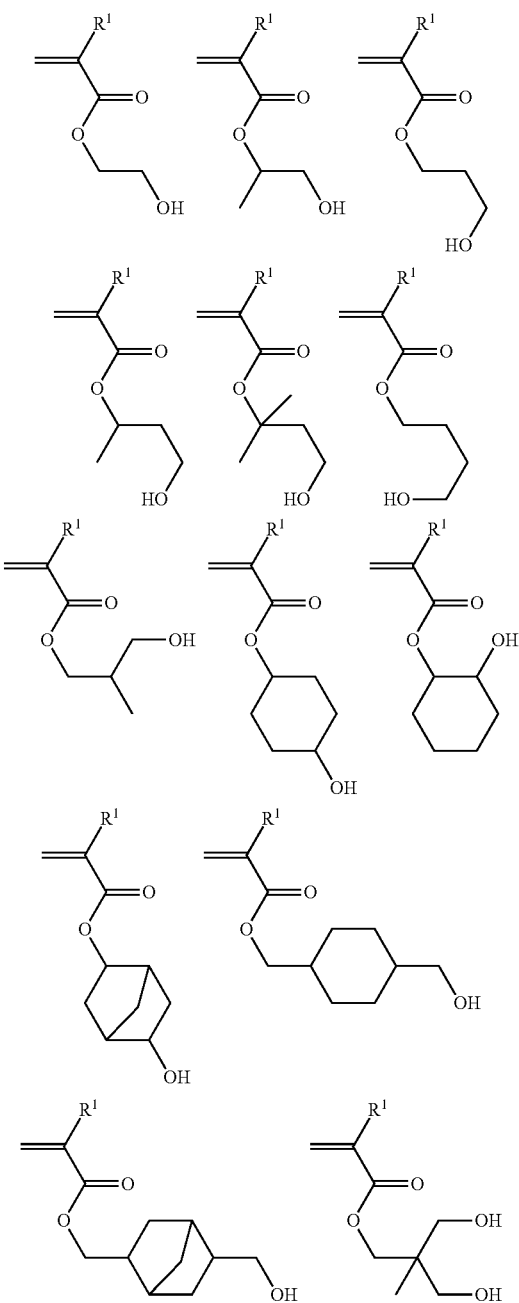

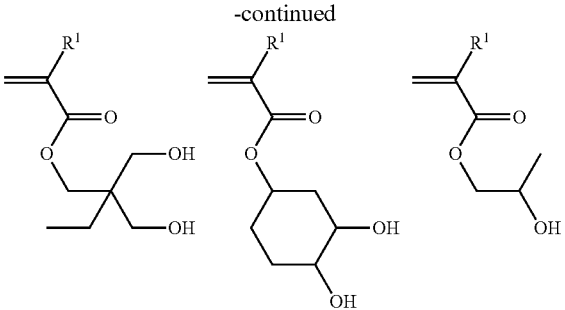

-continued

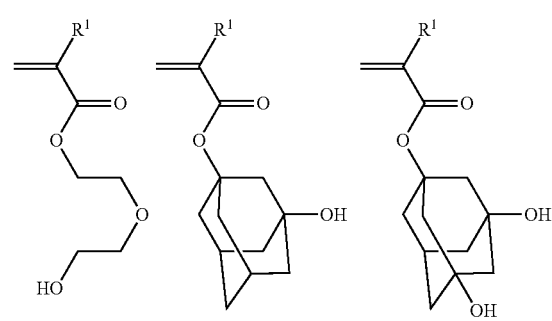

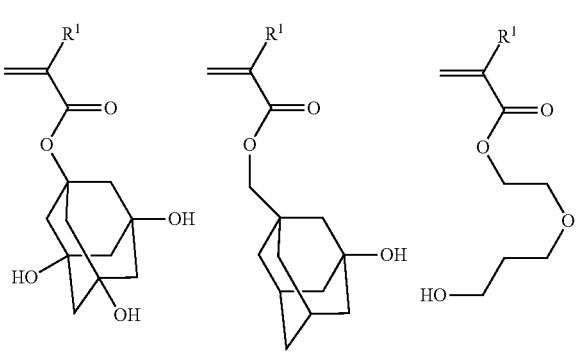

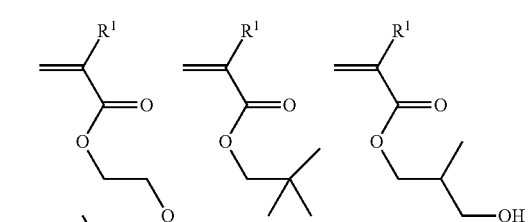

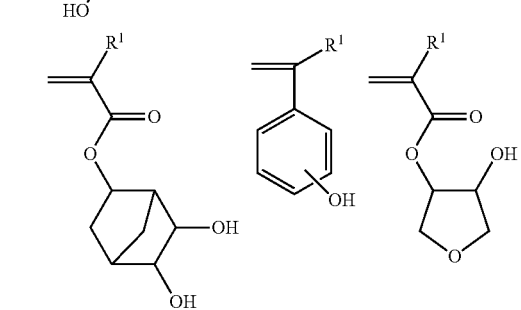

-continued
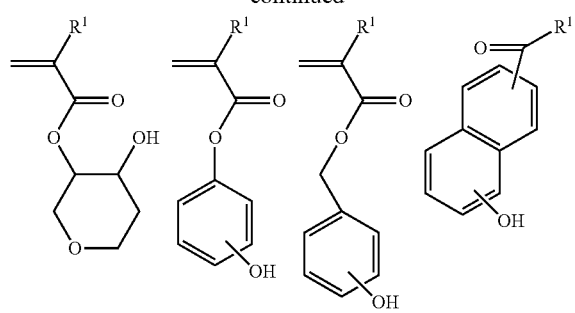
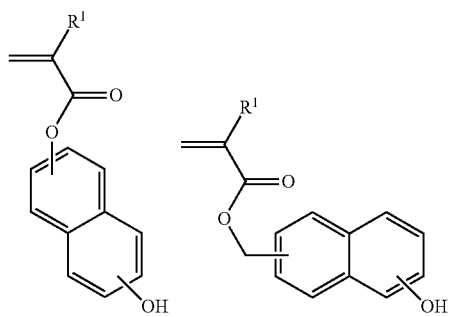
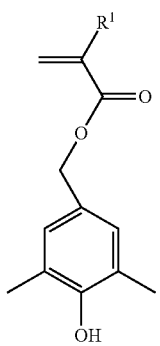
In the formulae, R¹ is as described above.
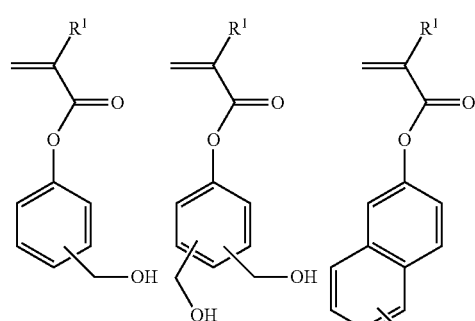
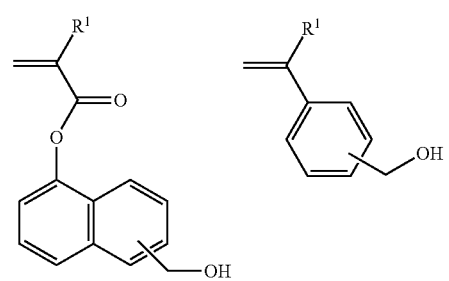
-continued
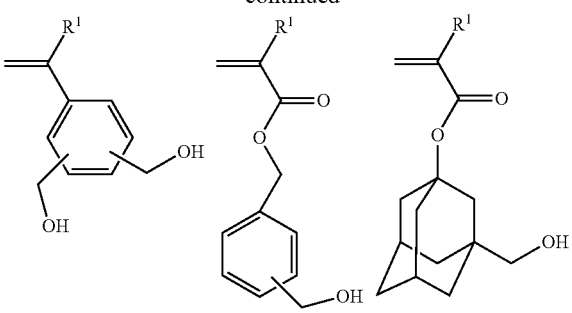
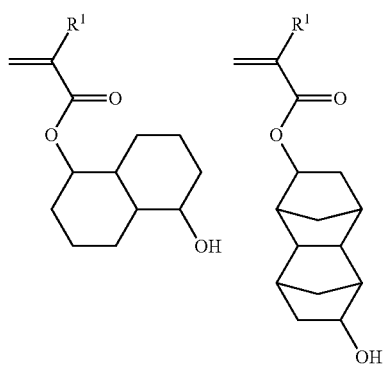
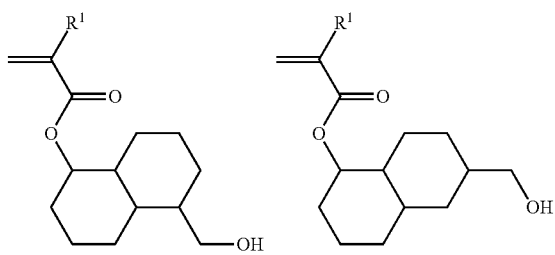
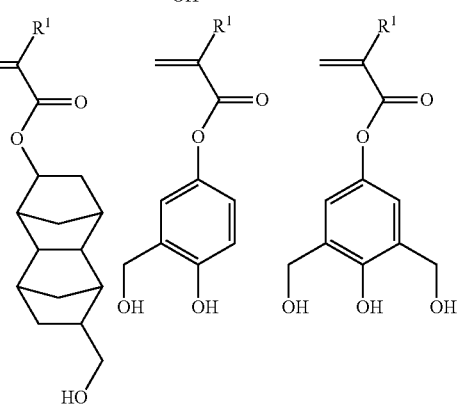

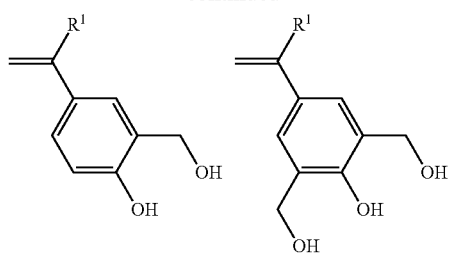
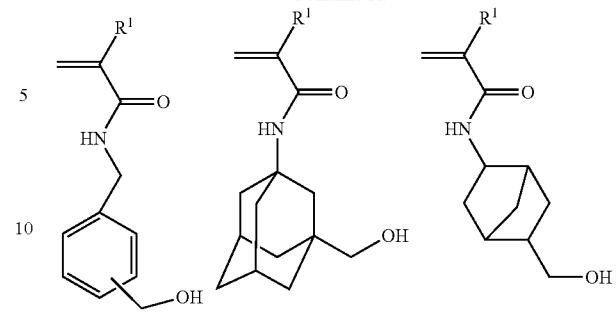
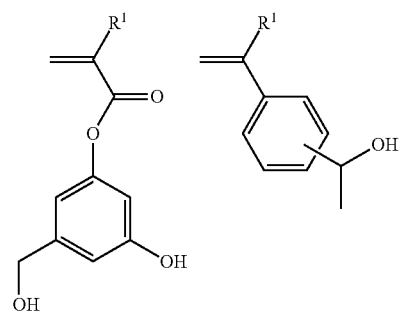
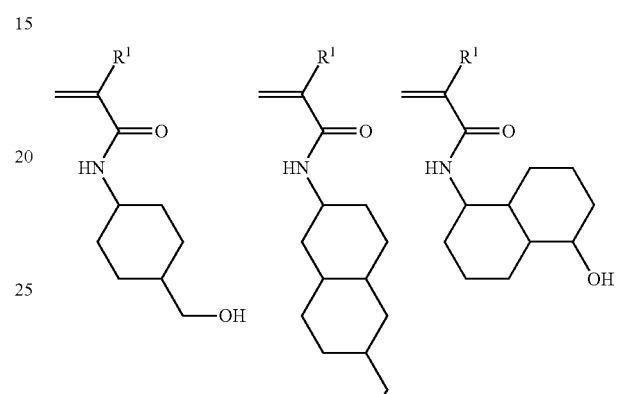
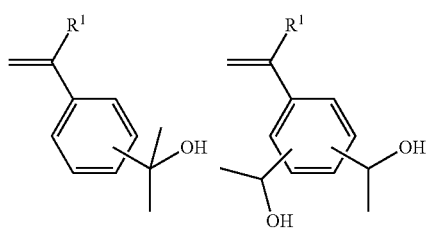
In the formulae, R¹ is as described above.
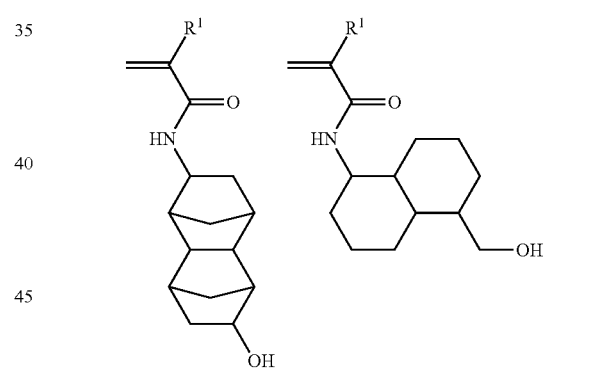
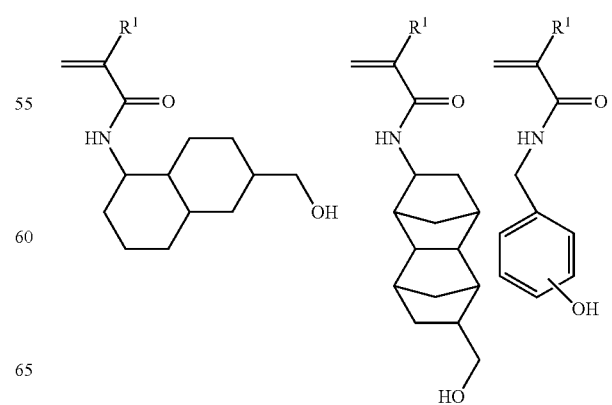

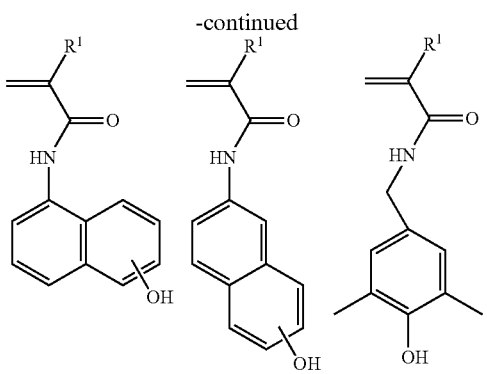

In the formulae, $R^1$ is as described above.

The group to be crosslinked with the component (A) alkali-soluble resin is not particularly limited. Examples thereof include an oxazoline group, an isocyanate group, a blocked isocyanate group, an oxetanyl group, and an epoxy group described below.

Furthermore, the component (B) more preferably contains structural units represented by the following general formula (2) and the following general formula (3), so that crosslinking density can be improved while maintaining alkali-solubility.

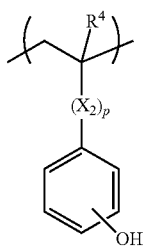

(2)

Here, in the general formula (2), $R^4$ represents a hydrogen atom or a methyl group. $X_2$ each represents —C(=O)—O—, —C(=O)—NH—, or —C(=O)—N($R^5$OH)—. $R^5$ represents a divalent linear, branched, or cyclic aliphatic saturated hydrocarbon group having 1 to 12 carbon atoms, or an aromatic hydrocarbon group having 6 to 12 carbon atoms, where a carbon atom of the aliphatic saturated hydrocarbon group is optionally substituted with an oxygen atom. "p" is 0 or 1.

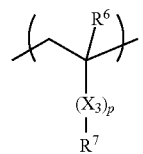

(3)

Here, in the general formula (3), $R^6$ represents a hydrogen atom or a methyl group. $R^7$ represents a group containing an oxazoline group, an isocyanate group, a blocked isocyanate group, an oxetanyl group, and an epoxy group. $X_3$ represents —C(=O)—O—, a phenylene group, or a naphthylene group. "p" is 0 or 1.

Note that the blocked isocyanate group is an organic group having an isocyanate group (—N=C=O) blocked with a suitable protecting group. A blocked isocyanate group can be formed by making an isocyanate group and a blocking agent react.

When the blocked isocyanate group reacts with a hydroxy group or a carboxy group in the component (A), the blocking agent is eliminated, and the hydroxy group or the carboxy group react with the isocyanate group to form a crosslinking structure. Examples of the blocking agent include an active-hydrogen-containing compound that can react with isocyanate, for example, alcohol, phenol, polycyclic phenol, amide, imide, imine, thiol, oxime, lactam, active-hydrogen-containing heterocycle, and active-methylene-containing compound.

Suitable blocked isocyanate groups are disclosed in paragraphs [0015] to [0025] of JP 6601628 B, and those compounds can be used.

Meanwhile, when the structure represented by the general formula (2) has a carbonyl group or an amide group, being electron-withdrawing groups, on a p-position of a phenolic hydroxy group, the acidity of the phenolic hydroxy group becomes high. Thus, solubility to a developer of an alkaline aqueous solution becomes improved. Specific examples of monomers that can be favorably used for forming the structural unit of the general formula (2) include the following. However, examples are not limited thereto.

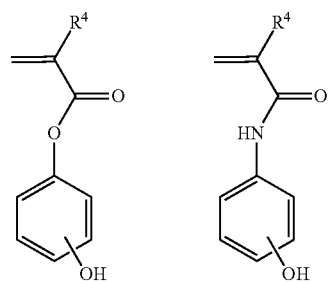

In the formulae, $R^4$ is as described above.

The general formula (2) is effective as a unit for promoting crosslinking in addition to alkali-solubility, and curability can be further improved by using together with a crosslinkable group.

Furthermore, to improve crosslinking density, a monomer having an epoxy group or an oxetanyl group shown by the following general formula (4) is preferably copolymerized.

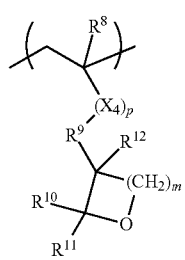

(4)

Here, in the general formula (4), $R^8$ represents a hydrogen atom or a methyl group. $X_4$ each represents —C(=O)—O—, a phenylene group, or a naphthylene group. $R^9$ represents a linear, branched, or cyclic alkylene group having 1 to 15 carbon atoms, optionally containing a hydroxy group, an ester group, an ether group, or an aromatic hydrocarbon. $R^{10}$ represents a hydrogen atom, a linear, branched, or cyclic alkyl group having 1 to 6 carbon atoms, or is optionally bonded with $R^9$ to form a ring. $R^{11}$ represents a hydrogen atom or a linear, branched, or cyclic alkyl group having 1 to 6 carbon atoms. $R^{12}$ represents a hydrogen atom or a linear alkyl group having 1 to 6 carbon atoms, and is optionally bonded with $R^9$ to form a ring. "m" is 0 or 1. "p" is 0 or 1. Examples of the unit of the formula (4) include the following.

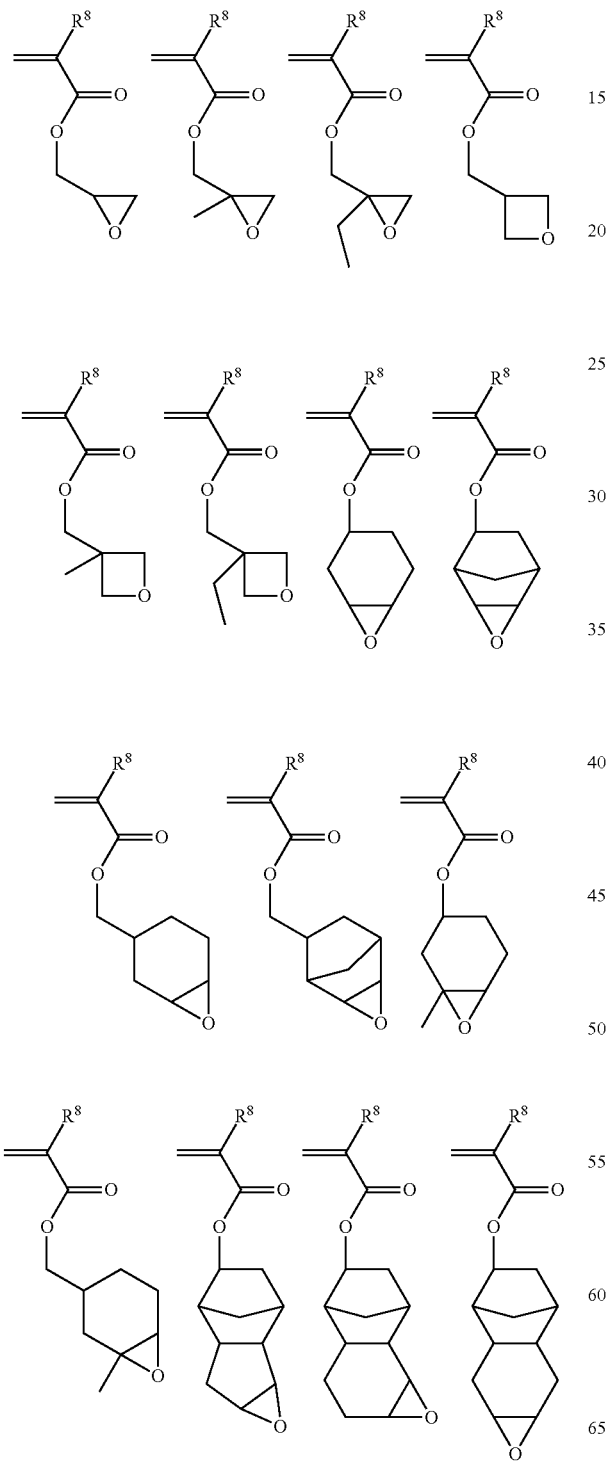

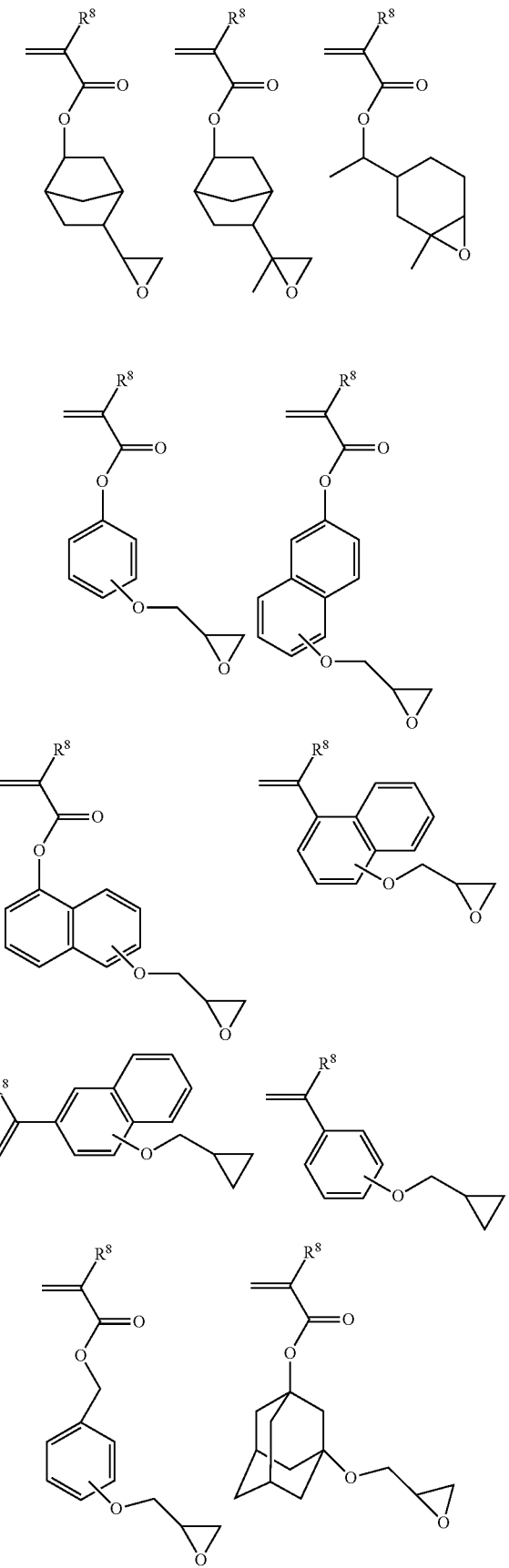

-continued

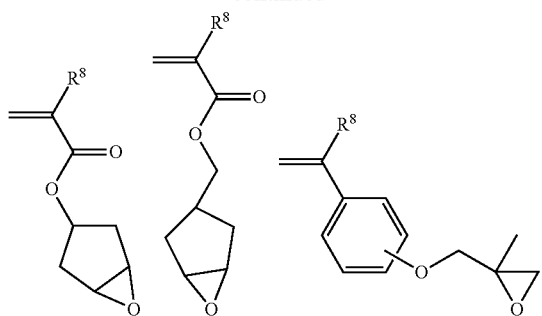
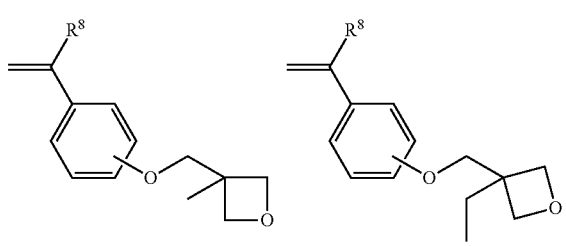
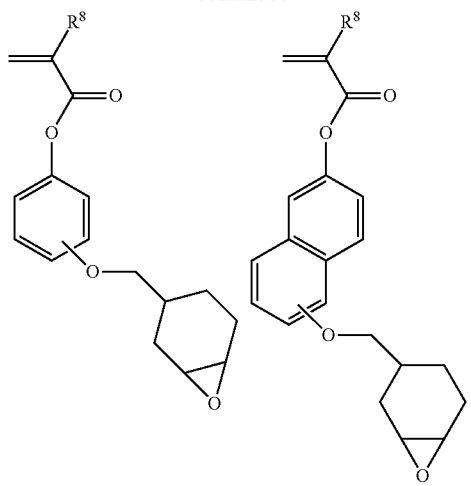
In the formulae, R⁸ is as described above.
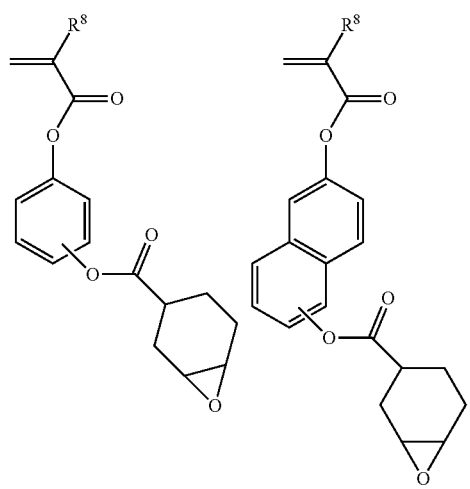
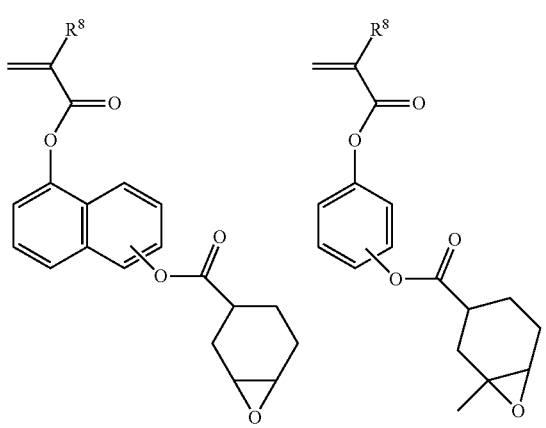

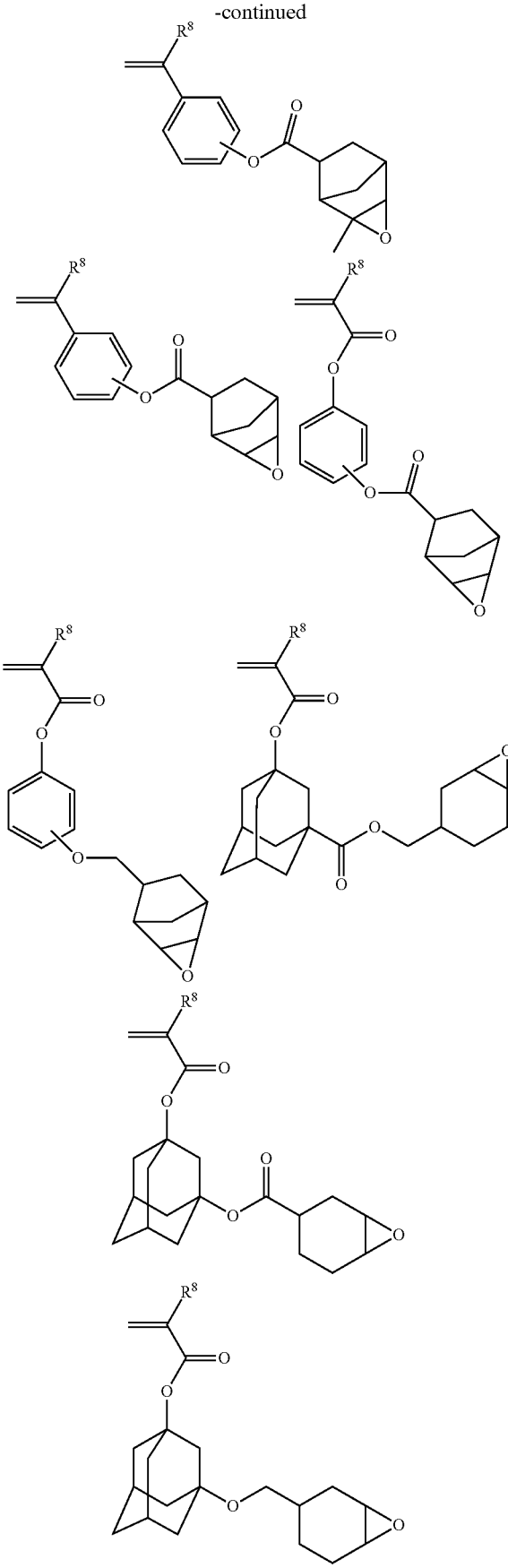
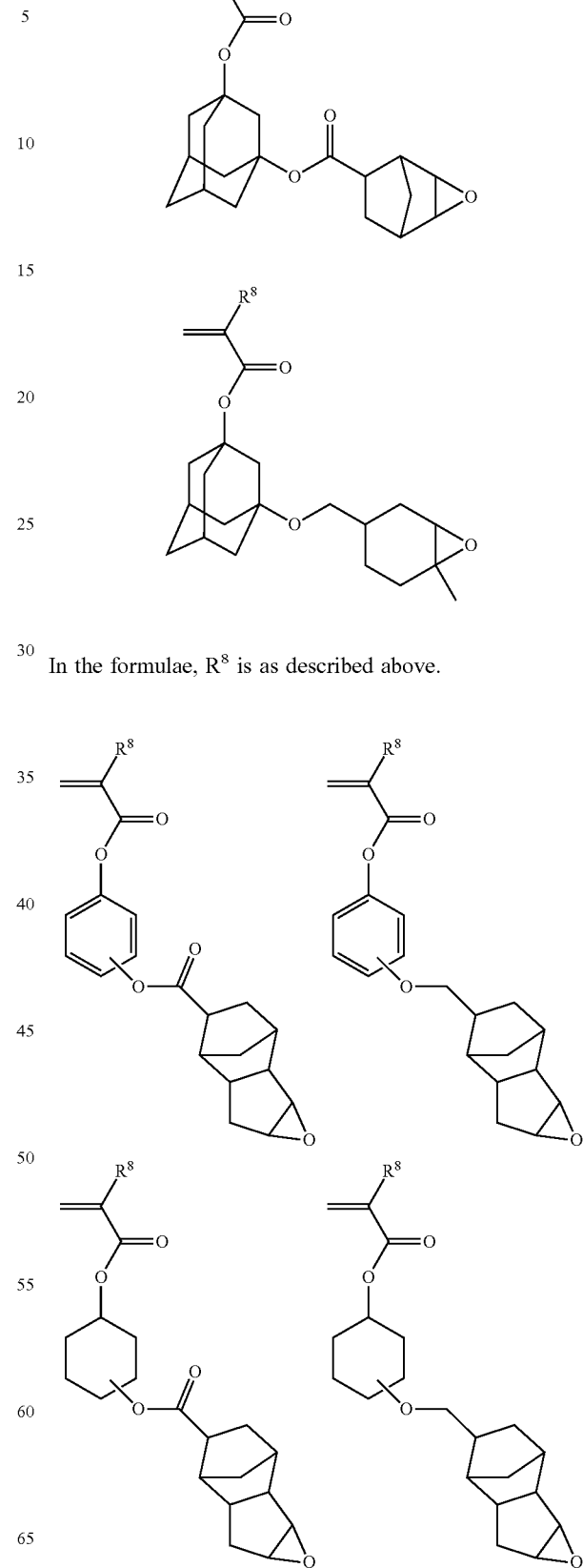
In the formulae, R⁸ is as described above.

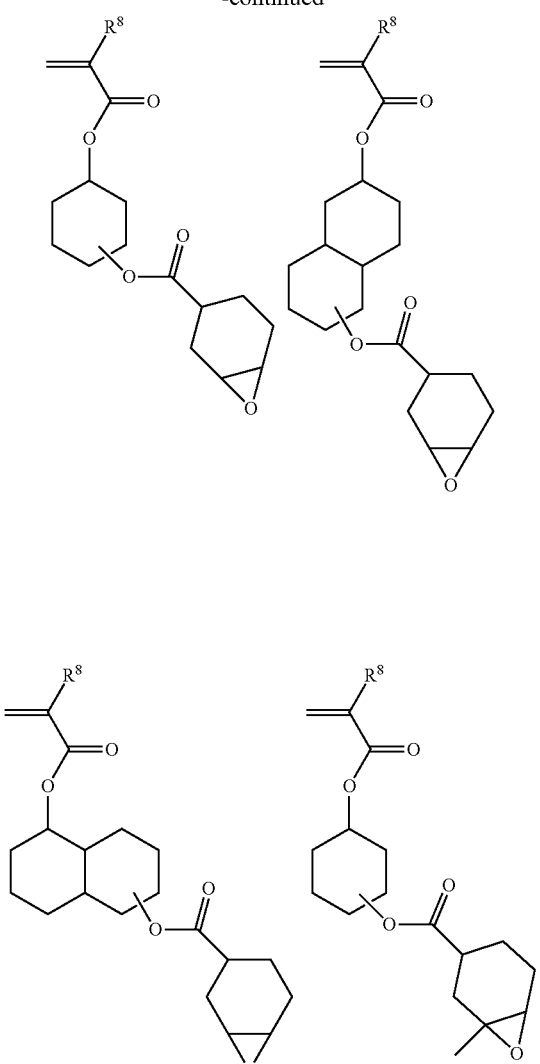
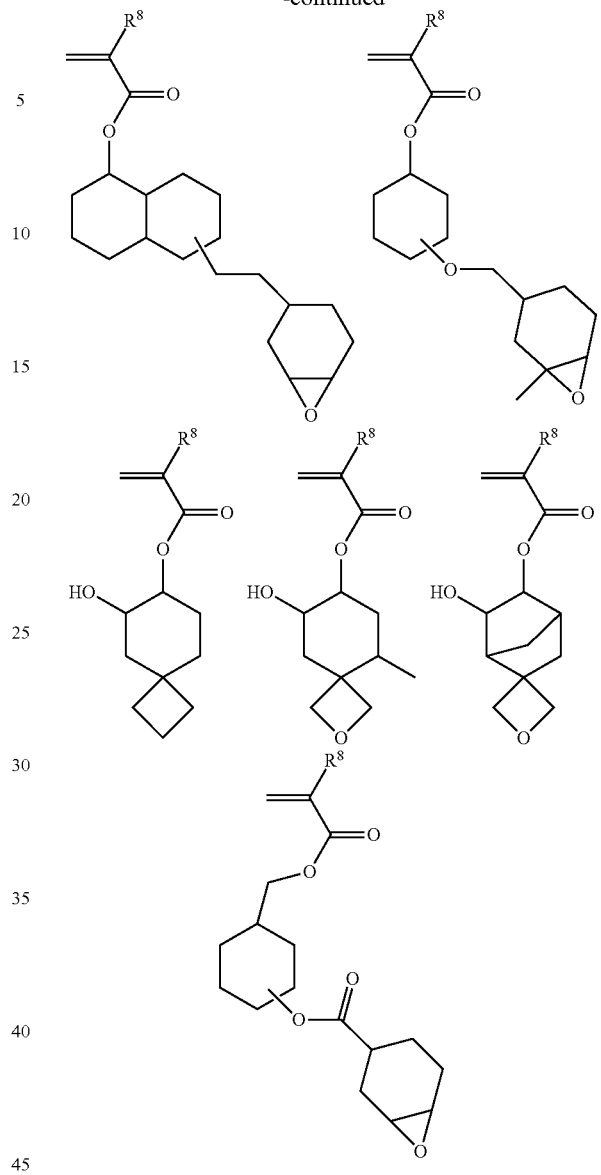
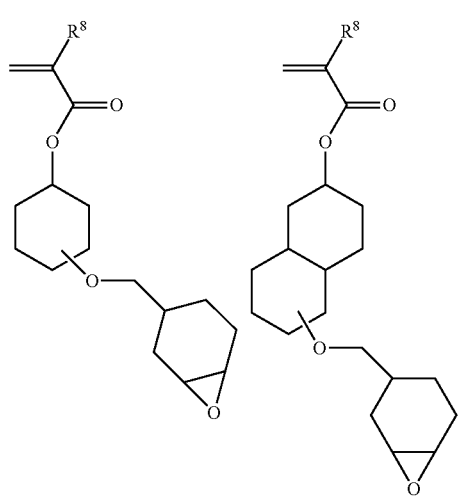

In the formulae, $R^8$ is as described above.

Incidentally, some of the monomers for obtaining a repeating unit having an epoxy group and an oxetanyl group are disclosed in JP 2003-55362 A, JP 2005-8847 A, JP 2005-18012 A.

The structural unit represented by the general formula (2) is excellent in solvent-solubility and alkali-solubility, but does not have crosslinking property. Therefore, it is necessary to copolymerize with the structural unit which has crosslinking property and is represented by the general formula (4). A polymer formed only from epoxy groups and oxetanyl groups represented by the general formula (4) having crosslinking property is excellent in crosslinking property. However since such a polymer has no alkali-solubility, it is necessary to copolymerize with a structural unit represented by the general formula (2).

Accordingly, when repeating units are copolymerized in this manner, repeating units of the following formula (1a) are preferably contained.

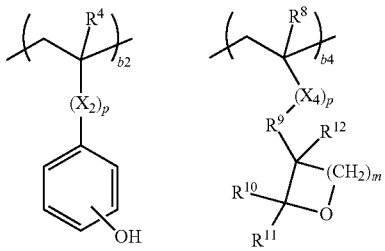

(1a)

In the formulae, $R^4$, $R^8$ to $R^{12}$, $X_2$, $X_4$, "m", and "p" are the same as above, and $0<b2<1.0$, $0<b4<1.0$, $0<b2+b\leq1.0$.

The crosslinkable polymer compound of the present invention includes, as a base, a repeating unit with a monomer for obtaining a repeating unit represented by the general formula (1) having a hydroxy group (hereinafter, noted as b1), and a monomer for obtaining a repeating unit that is represented by the general formula (4) and that has a group crosslinked with the component (A) alkali-soluble resin (hereinafter, noted as b4), for example. It is also possible to copolymerize a monomer b5 for obtaining a repeating unit represented by the following general formula (20) in order to improve adhesiveness to a substrate and flexibility of a cured film, and to further improve mechanical characteristics and thermal shock resistance.

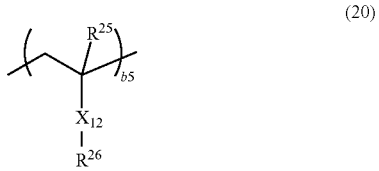

(20)

Here, in the general formula (20), $R^{25}$ represents a hydrogen atom or a methyl group. $R^{26}$ may have a monovalent organic group having a primary, secondary, or tertiary amino group, an alkyl group having 4 to 20 carbon atoms, an aryl group having 6 to 10 carbon atoms, or an alicyclic group having 6 to 10 carbon atoms. $X_{12}$ is preferably —C(=O)—O— or —C(=O)—NH—. b5 is $0\leq b5<1$.

Specific examples of monomers for obtaining the repeating unit represented by the general formula (20) include the following: aminoethyl(meth)acrylate, N-methylaminoethyl (meth)acrylate, N,N-dimethylaminoethyl(meth)acrylate, N-ethylaminoethyl(meth)acrylate, N,N-diethylaminoethyl (meth)acrylate, aminopropyl(meth)acrylate, N-methylaminopropyl(meth)acrylate, N,N-dimethylaminopropyl(meth)acrylate, N-ethylaminopropyl(meth)acrylate, N,N-diethylaminopropyl(meth)acrylate, aminoethyl(meth)acrylamide, N-methylaminoethyl(meth)acrylamide, N,N-dimethylaminoethyl(meth)acrylamide, N-ethylaminoethyl (meth)acrylamide N,N-diethylaminoethyl(meth)acrylamide, aminopropyl(meth)acrylamide, N-methylaminopropyl (meth)acrylamide, N,N-dimethylaminopropyl(meth)acrylamide, N-ethylaminopropyl(meth)acrylamide, N,N-diethylaminopropyl(meth)acrylamide, piperidine-4-yl(meth) acrylate, 1-methylpiperidine-4-yl(meth)acrylate, 2,2,6,6-tetramethylpiperidine-4-yl(meth)acrylate, 1,2,2,6,6-pentamethylpiperidine-4-yl(meth)acrylate, (piperidine-4-yl) methyl(meth)acrylate, 2-(piperidine-4-yl)ethyl(meth) acrylate, piperidine-4-yl(meth)acrylate, 1-methylpiperidine-4-yl(meth)acrylate, 2,2,6,6-tetramethylpiperidine-4-yl (meth)acrylate, 1,2,2,6,6-pentamethylpiperidine-4-yl(meth) acrylate, (piperidine-4-yl)methyl(meth)acrylate, 2-(piperidine-4-yl)ethyl(meth)acrylate, and the like.

Furthermore, a (meth)acrylic acid alkyl ester can be used as a monomer for obtaining the repeating unit represented by the general formula (20), and specific examples include (meth)acrylic acid butyl ester, (meth)acrylic acid pentyl ester, (meth)acrylic acid hexyl ester, (meth)acrylic acid heptyl ester, (meth)acrylic acid octyl ester, (meth)acrylic acid nonyl ester, (meth)acrylic acid decyl ester, (meth) acrylic acid undecyl ester, (meth)acrylic acid dodecyl ester, (meth)acrylic acid tridecyl ester, (meth)acrylic acid tetradecyl ester, (meth)acrylic acid pentadecyl ester, (meth) acrylic acid hexadecyl ester, (meth)acrylic acid heptadecyl ester, (meth)acrylic acid octadecyl ester, (meth)acrylic acid nonadecyl ester, (meth)acrylic acid eicosyl ester, and the like.

Furthermore, in order to improve the mechanical strength of the cured film, it is also possible to copolymerize olefins b6 having an aromatic group such as styrenes, vinylnaphthalenes, vinylanthracenes, vinylcarbazoles, acenaphthylenes, indenes, and the like; and alicyclic olefins b7 such as norbornenes, norbornadienes, and the like.

Regarding the repeating units b1, b4, b5, b6, and b7, the proportion of the repeating units is $0<b1<1.0$, $0<b1+b\leq1.0$, $0\leq b4<1.0$, $0\leq b5\leq0.8$, $0\leq b6\leq0.8$, and $0\leq b7\leq0.8$; preferably $0<b1\leq0.5$, $0.1\leq b4\leq0.9$, b4 is more preferably $0.2$ $b\leq0.8$, $0.1\leq b1+b4\leq1.0$, $0\leq b5\leq0.7$, $0\leq b6\leq0.7$, and $0\leq b7\leq0.7$; more preferably $0<b1\leq0.4$, $0.5\leq b4\leq0.8$, $0.2\leq b1+b\leq1.0$, $0\leq b5\leq0.6$, $0\leq b6\leq0.6$, and $0\leq b7\leq0.6$. Note that $b1+b4+b5+b6+b7=1$, and the total of these repeating units is 100 mol % of the total amount of all the repeating units.

The crosslinkable polymer compound (B) used in the present invention preferably has a weight-average molecular weight of 1,000 to 500,000, in particular, 2,000 to 30,000 in terms of polystyrene determined by gel permeation chromatography (GPC). When the weight-average molecular weight is greater than these lower limits, glass transition temperature becomes sufficiently high, so that the pattern does not become deformed in heat crosslinking after development of the positive photosensitive resin composition. When the weight-average molecular weight is less than the upper limit, there is no risk of pinhole defects occurring on application.

Note that it is also possible to blend two or more polymers having different composition ratios, molecular weight distributions, or molecular weights.

In this event, the crosslinkable polymer compound (B) is preferably added in an amount of 1 part by mass or more and 50 parts by mass or less relative to 100 parts by mass of the alkali-soluble resin (A). When the added amount is 1 part by mass or more, a cured film with the above-described alkali-soluble resin (A) becomes tough. When the added amount is 50 parts by mass or less, the tensile strength of the cured film does not become degraded. Therefore, the added amount of the crosslinkable polymer compound (B) is preferably within the above range. The added amount of the component (B) is more preferably 1 part by mass or more and 35 parts by mass or less, further preferably 1 part by mass or more and 25 parts by mass or less. When the amount is set to this range, the balance between the lithography patterning performance and the physical properties of the cured film becomes excellent.

[(C) Photosensitizer]

The component (C) in the inventive positive photosensitive resin composition is a photosensitizer that generates an acid by light to increase the dissolution speed to an alkaline aqueous solution, and is a compound having a quinonediazide structure. Examples of the component (C) include a compound having a 1,2-naphtoquinone diazide sulfonyl group in a molecule.

Examples of the compound having a 1,2-naphthoquinone diazide sulfonyl group in its molecule include compounds having a 1,2-naphthoquinone diazide sulfonyl group represented by the following general formula (21) or (22) in its molecule.

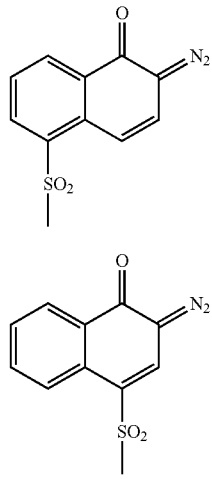

Illustrative examples of a preferable compound into which the 1,2-naphthoquinone diazide sulfonyl group is introduced include trihydroxybenzophenone or tetrahydroxybenzophenone, a ballast molecule shown by the following general formula (23) having a phenolic hydroxy group and a novolak resin having a repeating unit represented by the following formula (28) with a weight-average molecular weight in the range of 2,000 to 20,000, preferably 3,000 to 10,000. That is, those obtained by substituting a hydrogen atom(s) of the phenolic hydroxy group of the following resin or compound which has the phenolic hydroxy group with the 1,2-naphthoquinone diazide sulfonyl group are suitable as the component (C).

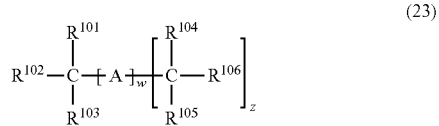

Here, $R^{101}$ to $R^{106}$ each independently represents a hydrogen atom, a methyl group, a group represented by the following formula (24) or a group represented by the following formula (25). "w" is an integer of 0 to 2, and "z" is an integer of 0 to 2. When "z" is 0, "w" is 1 or 2. "A" is represented as follows: when "z" is 0 and "w" is 1, a hydrogen atom, a methyl group, or a group represented by the following formula (24); when "z" is 0 and "w" is 2, one "A" is a methylene group or a group represented by the following formula (26), and the other "A" is a hydrogen atom, a methyl group or a group represented by the following formula (24); when "z" is 1, "A" is a methylene group or a group represented by the following formula (26); when "z" is 2 and "w" is 1, "A" is a methyne group or a group represented by the following formula (27); and when "z" is 2 and "w" is 2, one of the "A"s is a methylene group or a group represented by the following formula (26), and the other is a methyne group or a group represented by the following formula (27).

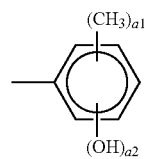

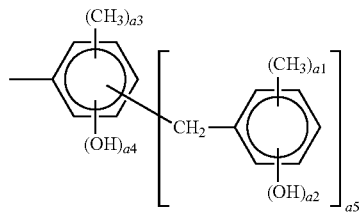

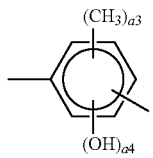

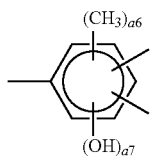

In the formulae, $a_1$, $a_2$, $a_3$, $a_4$, $a_5$, $a_6$, and $a_7$ each is an integer of 0 to 3, $a_1+a_2 \leq 5$, $a_3+a_4 \leq 4$, and $a_6+a_7 \leq 3$.

In this case, a low nucleus body (ballast molecule) of the formula (23) has 2 to 20 benzene rings, more preferably 2 to 10, and further preferably 3 to 6. In addition, a ratio of the number of the phenolic hydroxy groups to the number of the benzene rings is 0.5 to 2.5, more preferably 0.7 to 2.0, and further preferably 0.8 to 1.5.

Specific examples of such a low nucleus body (ballast molecule) include the following.

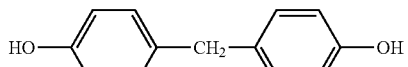

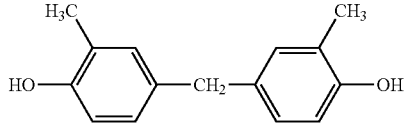

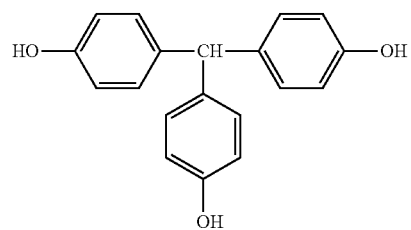 (C-3)
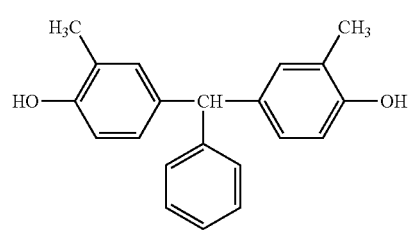 (C-4)
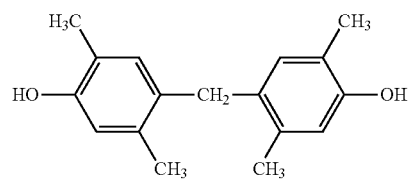 (C-5)
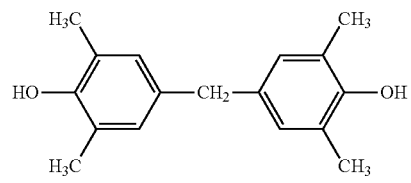 (C-6)
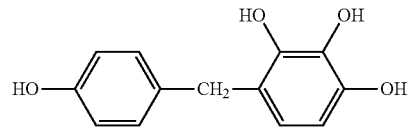 (C-7)
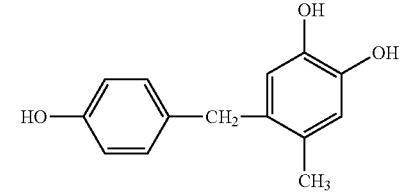 (C-8)
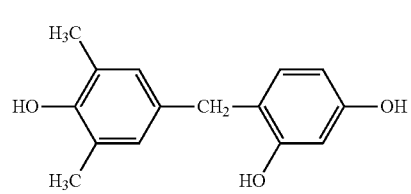 (C-9)
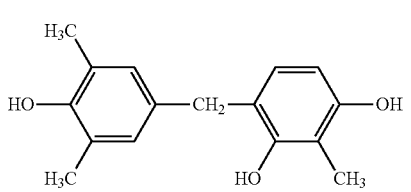 (C-10)
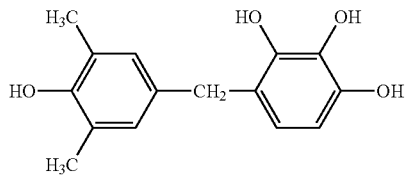 (C-11)
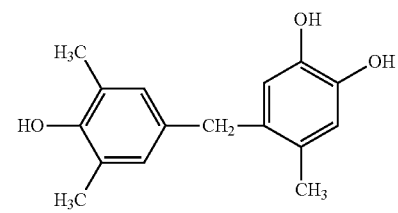 (C-12)
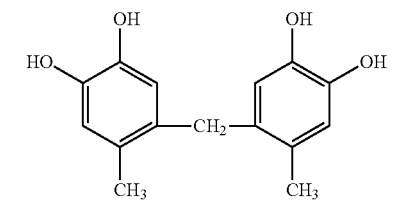 (C-13)
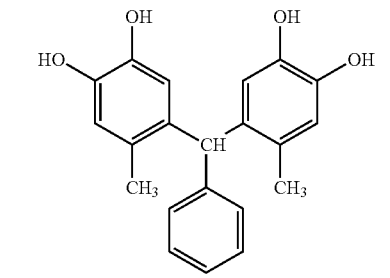 (C-14)
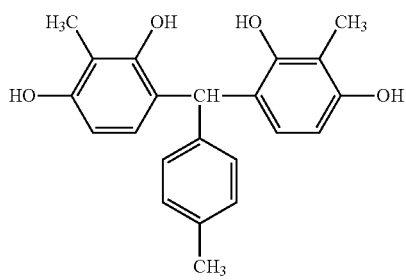 (C-15)
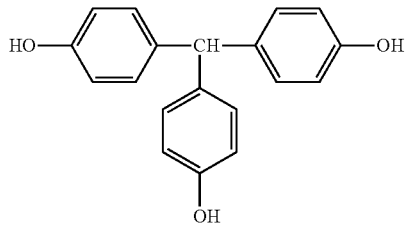 (C-16)

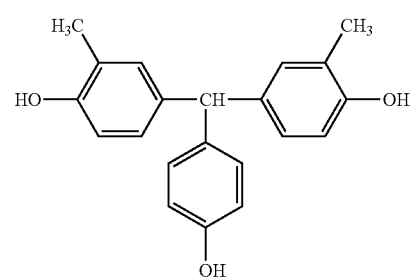
(C-17)
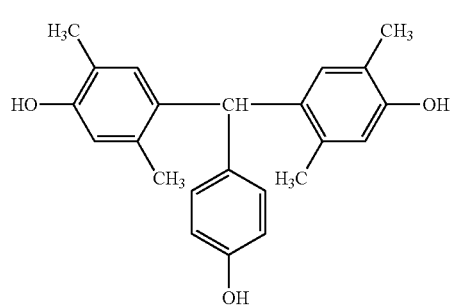
(C-18)
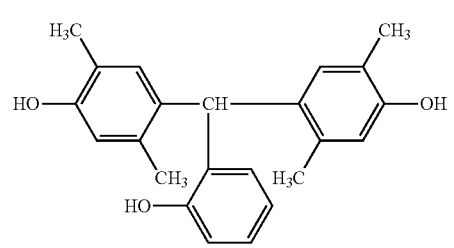
(C-19)
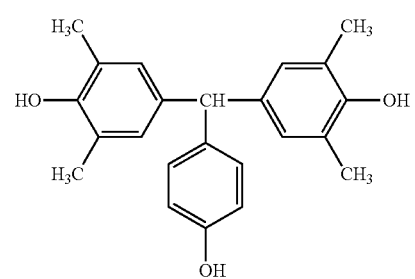
(C-20)
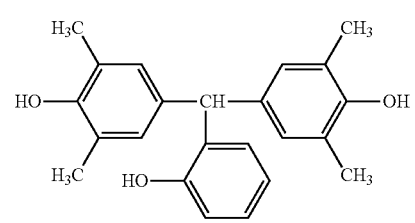
(C-21)
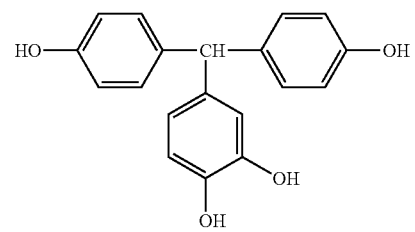
(C-22)
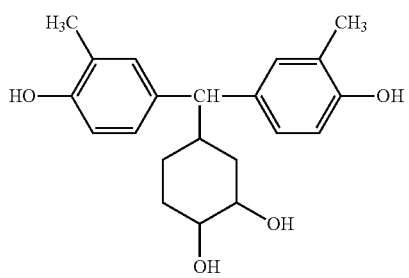
(C-23)
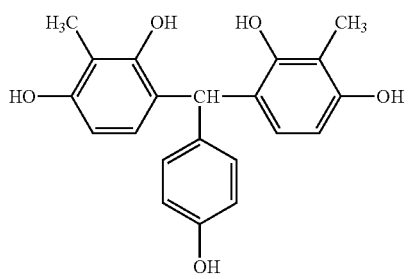
(C-24)
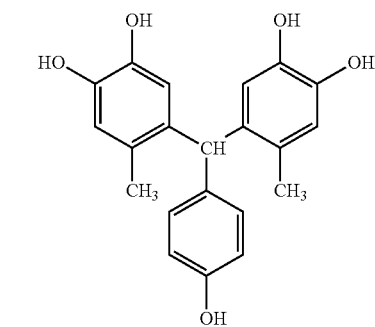
(C-25)
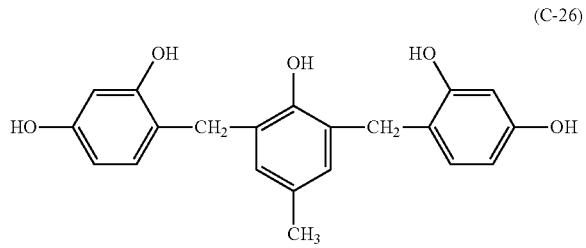
(C-26)
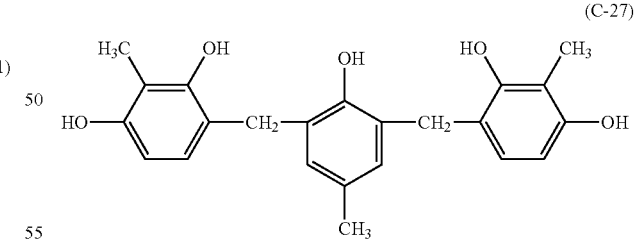
(C-27)
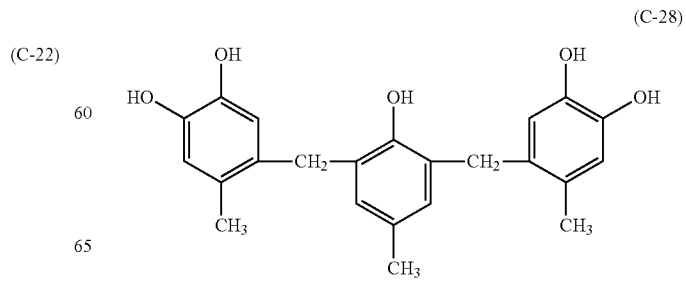
(C-28)

(C-29)
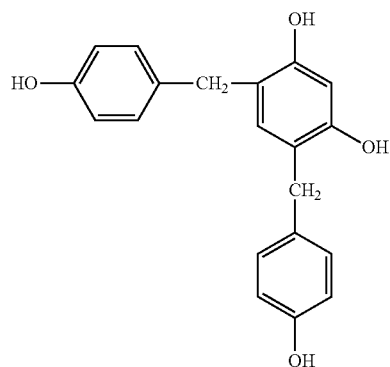
(C-30)
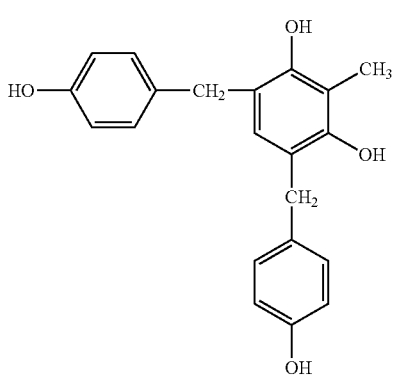
(C-31)
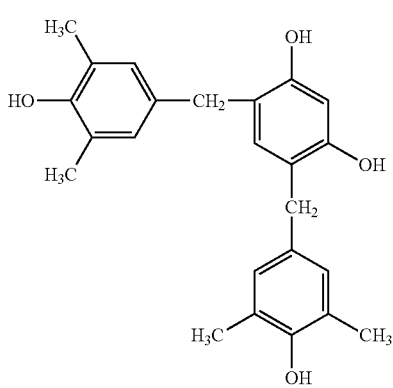
(C-32)
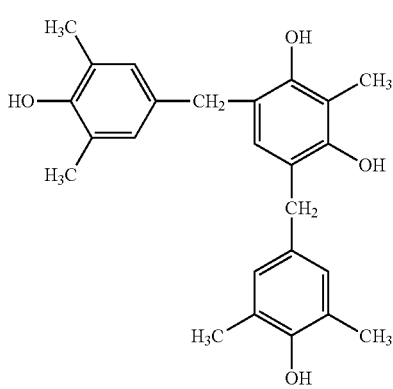
(C-33)
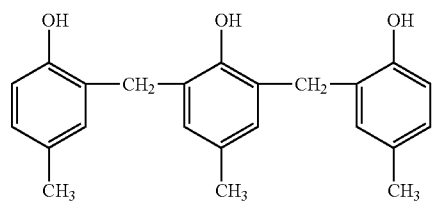
(C-34)
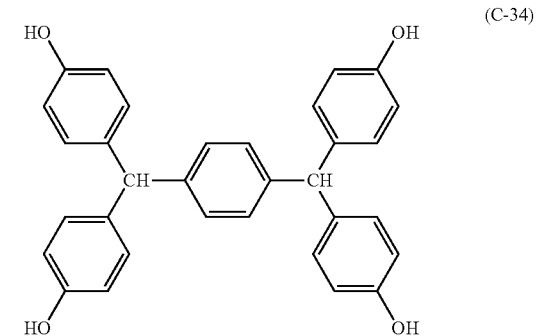
(C-35)
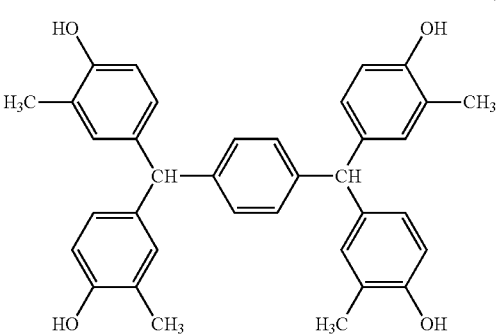
(C-36)
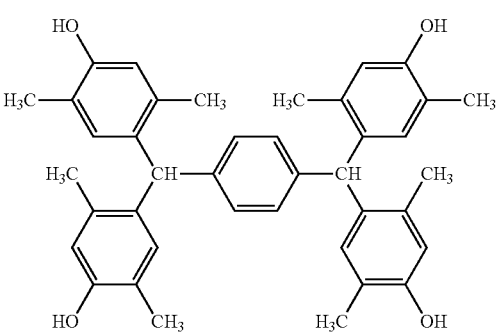
(C-37)
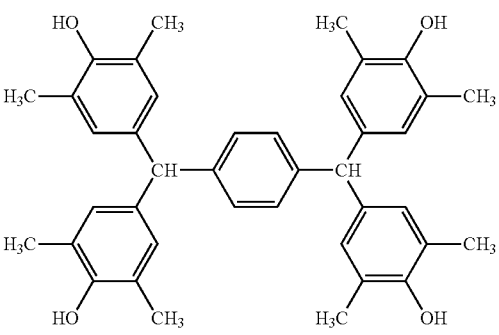

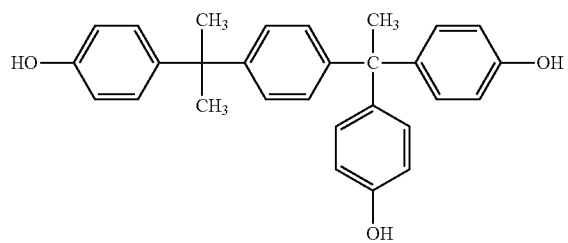
(C-38)

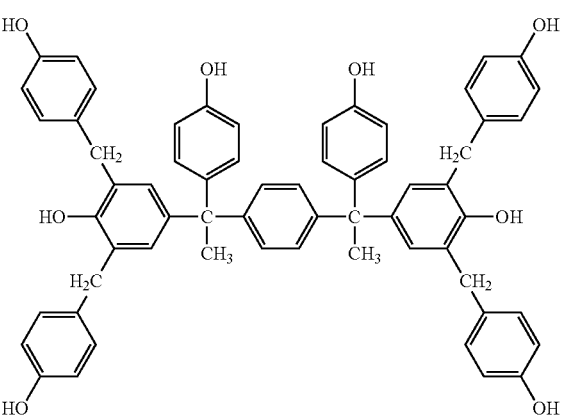
(C-43)

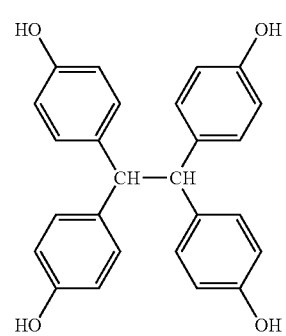
(C-39)

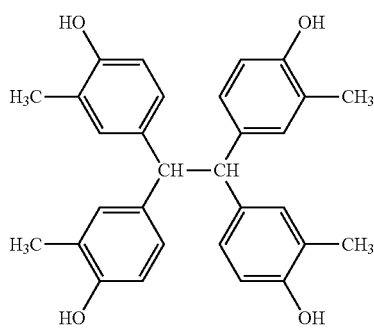
(C-40)

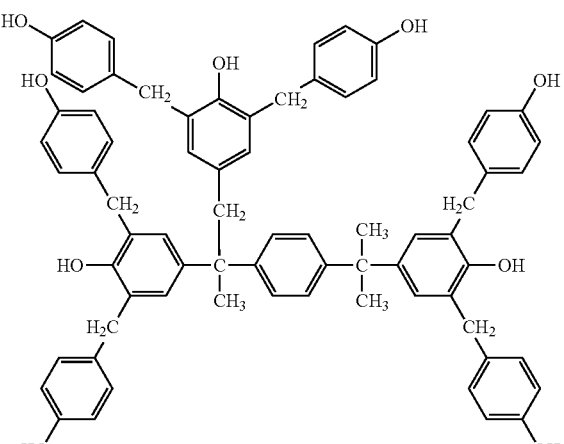
(C-44)

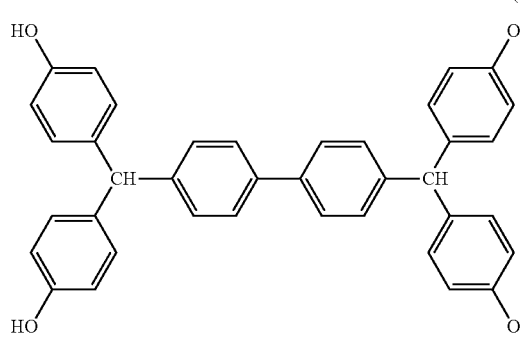
(C-41)

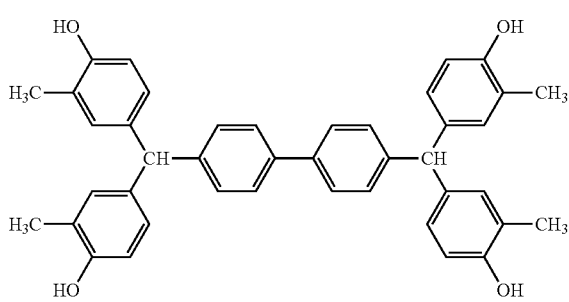
(C-42)

Among the low nucleus bodies (ballast molecules) illustrated above, (C-3), (C-29), (C-33), (C-38) and the like are preferred. Compounds obtained by substituting a hydrogen atom of the phenolic hydroxy group of these ballast molecules with the 1,2-naphthoquinone diazide sulfonyl group are suited for the component (C) of the inventive positive photosensitive resin composition.

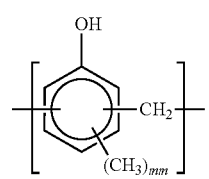
(28)

In the formula, "mm" is an integer of 0 to 3.

The novolak resin having a repeating unit represented by the formula (28) may be synthesized by making condensed aldehydes and the phenols shown by the following formula (29), specifically, at least one kind of phenol such as o-cresol, m-cresol, p-cresol, 3,5-xylenol, and the like according to an ordinary method.

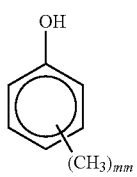

(29)

In the formula, "mm" is an integer of 0 to 3.

In this case, examples of the aldehydes include formaldehyde, para-formaldehyde, acetaldehyde, benzaldehyde and the like, and the formaldehyde is preferable.

A ratio of the phenols represented by the formula (29) to the aldehydes is preferably 0.2 to 2, particularly preferably 0.3 to 2, by molar ratio.

As a method for introducing the 1,2-naphthoquinone diazide sulfonyl group into a compound into which the 1,2-naphthoquinone diazide sulfonyl group is introduced, it is preferable to perform a dehydrochlorination condensation reaction between the 1,2-naphthoquinone diazide sulfonyl chloride and the phenolic hydroxy group with a basic catalyst. In the case of reacting with the ballast molecule represented by the formula (23), trihydroxybenzophenone or tetrahydroxybenzophenone, a ratio of substituting hydrogen atoms of the phenolic hydroxy group with the 1,2-naphthoquinone diazide sulfonyl group is 10 to 100 mol %, preferably 50 to 100 mol %. In the case of reacting with the novolak resin having a repeating unit represented by the formula (28), a ratio of substituting hydrogen atoms of the phenolic hydroxy group with the 1,2-naphthoquinone diazide sulfonyl group is 2 to 50 mol %, preferably 3 to 27 mol %.

The component (C) is preferably added in an amount of 1 to 60 parts by mass, more preferably 10 to 50 parts by mass relative to 100 parts by mass of the component (A). Furthermore, one kind or two or more kinds of the component (C) in combination may be used.

By blending such a component (C), before exposure, the solubility to the alkaline aqueous solution is suppressed due to the dissolution preventing effect of the component (C), and the system becomes alkali-insoluble; and when exposed, the photosensitizer of the component (C) generates an acid by light, a dissolution speed to the alkaline aqueous solution increases, and the system becomes alkali-soluble.

That is, when an alkaline aqueous solution is used as a developer, an unexposed part is not dissolved in the developer and an exposed part is soluble in the developer. As a result, a positive pattern may be formed.

[(D) Heat Crosslinking Agent]

The inventive positive photosensitive resin composition preferably further contains, in addition to the components (A), (B), and (C) that are essential components, (D) one or more kinds of crosslinking agents selected from an amino condensate modified by formaldehyde or formaldehyde-alcohol; a phenol compound having two or more methylol groups or alkoxymethylol groups by average in one molecule; a compound in which a hydrogen atom of a phenolic hydroxy group of polyhydric phenol is substituted with a glycidyl group; a compound in which a hydrogen atom of a phenolic hydroxy group of polyhydric phenol is substituted with a substituent represented by the following formula (D-1); and a compound having two or more nitrogen atoms having a glycidyl group represented by the following formula (D-2).

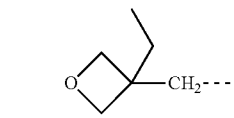

(D-1)

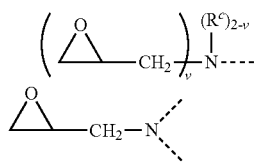

(D-2)

In the formulae, a dotted line represents a bond, $R^c$ represents a linear, branched, or cyclic alkyl group having 1 to 6 carbon atoms, and "v" represents 1 or 2.

Examples of the amino condensates modified by the formaldehyde or formaldehyde-alcohol include a melamine condensate modified by the formaldehyde or formaldehyde-alcohol, and a urea condensate modified by the formaldehyde or formaldehyde-alcohol.

The melamine condensate modified by the formaldehyde or formaldehyde-alcohol is prepared, for example, in such a manner that, firstly, according to a well-known method, a melamine monomer is modified by methylol reaction with formalin, or this is further modified by alkoxylation with alcohol, thus modified melamine represented by the following general formula (30) is obtained. As the alcohol, a lower alcohol, for example alcohols having 1 to 4 carbon atoms is preferable.

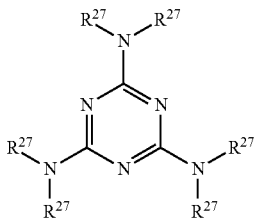

(30)

In the formula, $R^{27}$s may be the same or different from each other, and is a methylol group, an alkoxymethyl group containing an alkoxy group having 1 to 4 carbon atoms or a hydrogen atom, and at least one $R^{27}$ is a methylol group or the alkoxymethyl group.

Examples of the $R^{27}$ include a hydrogen atom, and alkoxymethyl groups such as a methylol group, a methoxymethyl group, and an ethoxymethyl group.

Specific examples of the modified melamine represented by the general formula (30) include trimethoxymethylmonomethylol melamine, dimethoxymethylmonomethylol melamine, trimethylol melamine, hexamethylol melamine, and hexamethoxymethylol melamine.

Next, the modified melamine represented by the general formula (30) or its multimer (for example, an oligomer such as a dimer or a trimer) is subjected to addition condensation polymerization with formaldehyde until a desired molecular weight is obtained according to the conventional method to obtain a melamine condensate modified by formaldehyde or formaldehyde-alcohol.

The urea condensate modified by the formaldehyde or formaldehyde-alcohol is prepared, according to, for example, a well-known method, by modifying a urea condensate having a desired molecular weight by methylol reaction with formaldehyde, or by further modifying by alkoxylation with alcohol.

Specific examples of the urea condensate modified by the formaldehyde or formaldehyde-alcohol include a methoxymethylated urea condensate, an ethoxymethylated urea condensate, a propoxymethylated urea condensate, and the like.

These modified melamine condensates and modified urea condensates may be used by one kind or by mixing two or more kinds.

Next, examples of the phenol compound having two or more methylol groups or alkoxymethylol groups in average in one molecule include (2-hydroxy-5-methyl)-1,3-benzenedimethanol, 2,2',6,6'-tetramethoxymethylbisphenol A, compounds represented by the following formulae (D-3) to (D-7), and the like.

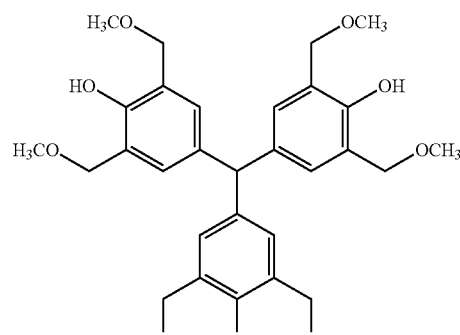
(D-3)

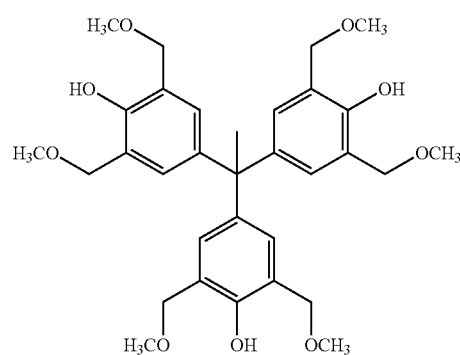
(D-4)

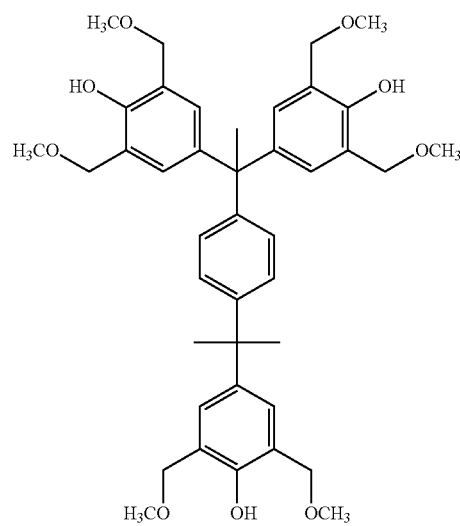
(D-5)

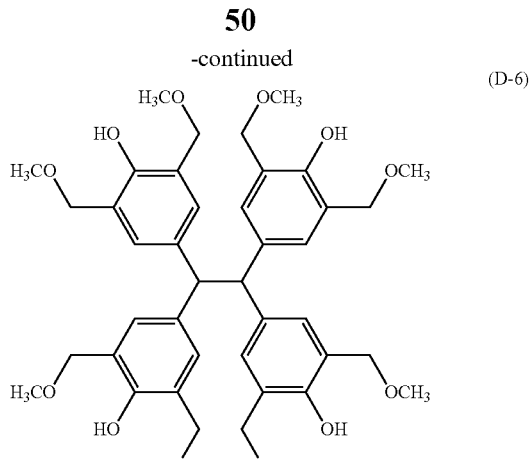
(D-6)

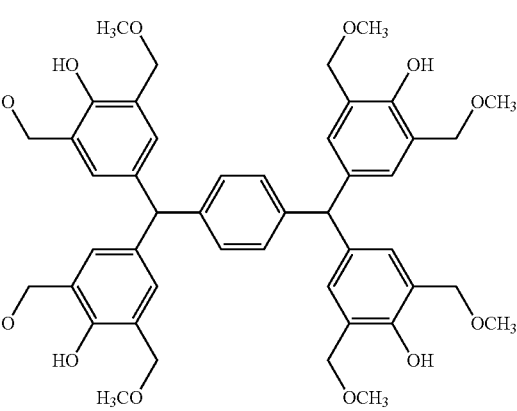
(D-7)

One of the crosslinking agents may be used or two or more kinds may be used in combination.

Meanwhile, examples of the compounds in which a hydrogen atom of a hydroxy group of polyhydric phenol is substituted with a glycidyl group include a compound obtained by reaction of the hydroxy group of bisphenol A, tris(4-hydroxyphenyl)methane, and 1,1,1-tris(4-hydroxyphenyl)ethane with epichlorohydrin in the presence of a base. Suitable examples of the compound in which a hydrogen atom of a hydroxy group of a polyhydric phenol is substituted with a glycidyl group include the compounds represented by the following formulae (D-8) to (D-14).

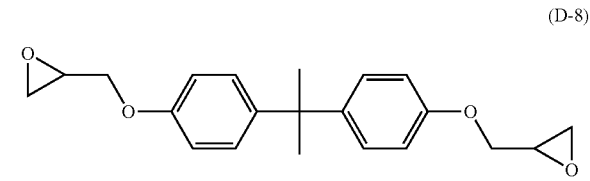
(D-8)

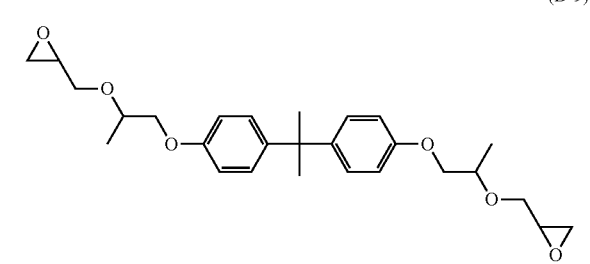
(D-9)

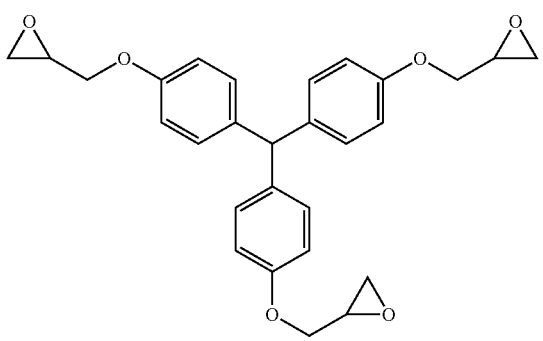
(D-10)

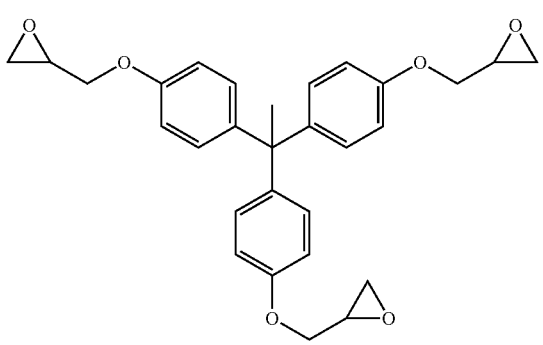
(D-11)

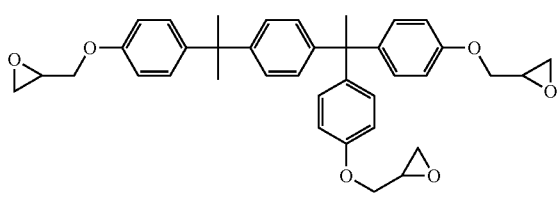
(D-12)

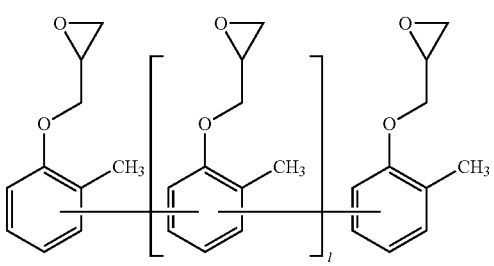
(D-13)

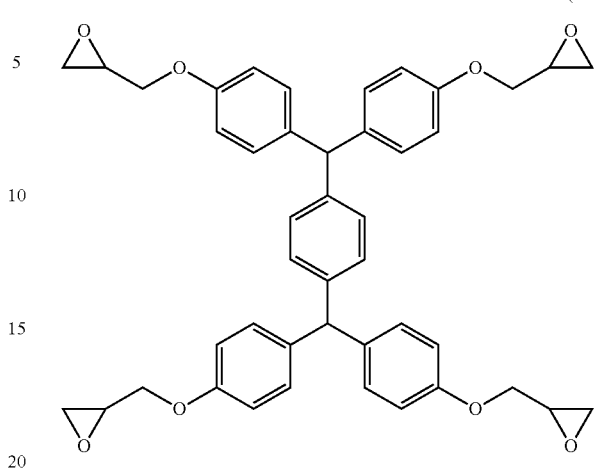
(D-14)

In the formulae, t is 2≤t≤3.

Furthermore, favorable examples of compounds other than those of the formulae (D-8) to (D-14) include Epiclon 850-S, Epiclon HP-4032, Epiclon HP-7200, Epiclon HP-820, Epiclon HP-4700, Epiclon EXA-4710, Epiclon HP-4770, Epiclon EXA-859CRP, Epiclon EXA-4880, Epiclon EXA-4850, Epiclon EXA-4816, Epiclon EXA-4822 (all trade names, manufactured by Dainippon Ink and Chemicals, Inc.), RIKARESIN BPO-20E, RIKARESIN BEO-60E (both trade names, manufactured by New Japan Chemical Co., Ltd.), EP-40035, EP-40005, EP-4000L (all trade names, manufactured by ADEKA CORPORATION), jER828EL, YX7105 (both trade names, manufactured by Mitsubishi Chemical Corporation), and the like.

One kind or two kinds of the compounds (a compound in which a hydrogen atom of a phenolic hydroxy group of polyhydric phenol is substituted with a glycidyl group) obtained by substituting a hydroxy group of the polyhydric phenol with a glycidoxy group may be used as a crosslinking agent.

Examples of the compound in which a hydrogen atom of a phenolic hydroxy group of polyhydric phenol is substituted with a substituent represented by the following formula (D-1) include ones containing two or more of the substituents and represented by the following formula (D-15).

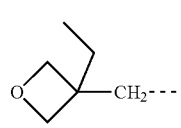
(D-1)

In the formula, a dotted line represents a bond.

(D-15)

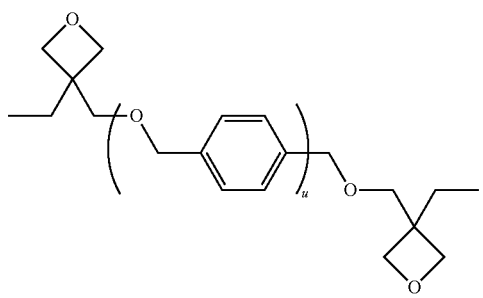

In the formula, 1≤u≤3.

Furthermore, favorable examples of compounds other than those of the formula (D-15) include 3-ethyl-3-hydroxymethyloxetane, 1,4-bis{[(3-ethyl-3-oxetanyl)methoxy]methyl}benzene, 3-ethyl-3-(2-ethylhexylmethyl)oxetane, 1,4-benzenedicarboxylic acid-bis[(3-ethyl-3-oxetanyl)methyl]ester, ARON OXETANE Series manufactured by TOAGOSEI CO., LTD., and the like.

Meanwhile, examples of the compound containing two or more nitrogen atoms having a glycidyl group represented by the following formulae (D-2) include ones represented by the following formula (D-16).

(D-2)

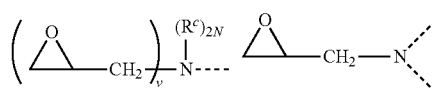

In the formulae, a dotted line represents a bond, $R^c$ represents a linear, branched, or cyclic alkyl group having 1 to 6 carbon atoms, and "v" represents 1 or 2.

(D-16)

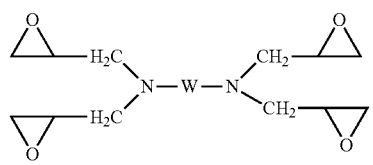

In the formula, W represents a linear, branched or cyclic alkylene group having 2 to 12 carbon atoms, or a divalent aromatic group. The W here is applied only in the above formula.

Examples of the compounds represented by the formula (D-16) include compounds represented by the following formulae (D-17) to (D-20).

(D-17)

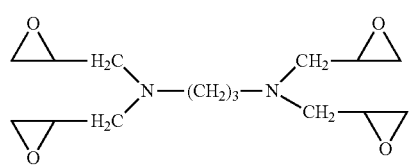

(D-18)

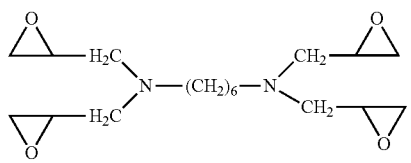

(D-19)

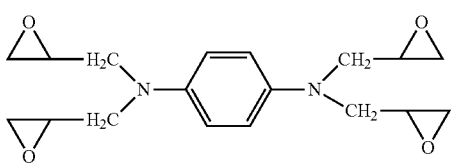

(D-20)

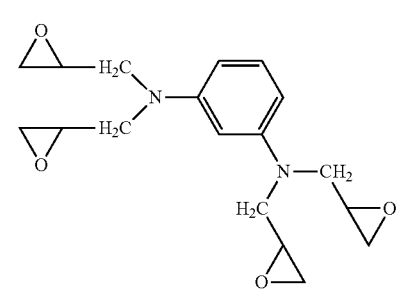

As the compound containing two or more nitrogen atoms each of which has a glycidyl group(s) represented by the formula (D-2), a compound represented by the following formulae (D-21) and (D-22) may be suitably used.

(D-21)

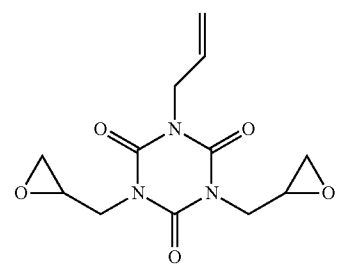

(D-22)

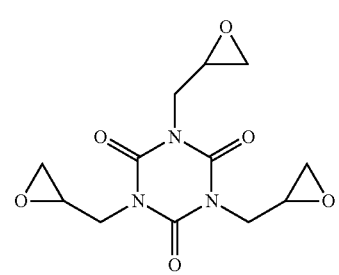

One kind or two kinds of these compounds containing two or more nitrogen atoms each of which has a glycidyl group(s) represented by the formula (D-2) may be used as a crosslinking agent.

An epoxy group has a great distortion in the ring and has high reactivity, but oxetane has high basicity and is easily bonded with an acid. It is reported that reactivity in cation polymerization is remarkably improved by combining an epoxy group with an oxetanyl group.

The component (D) is a component that causes a cross-linking reaction in the post-curing after forming a pattern of the inventive positive photosensitive resin composition to further increase the strength of a cured product. A weight-average molecular weight of such a component (D) is preferably 150 to 10,000, and particularly preferably 200 to 3,000, from the viewpoint of the photocurability and heat resistance.

In the inventive positive photosensitive resin composition, a blending amount of the component (D) is preferably 0.5 to 100 parts by mass, more preferably 1 to 100 parts by mass, and particularly preferably 1 to 80 parts by mass relative to 100 parts by mass of the component (A).

[(E) Protective Amine Compound]

The inventive positive photosensitive resin composition can further contain, in addition to the components (A), (B), and (C) that are essential components, (E) a protective amine compound. The component (E) protective amine compound can be any protective amine compound, as long as it is a nitrogen-containing organic compound in which a group that is deprotected by heat or an acid is bonded to a nitrogen atom. In particular, the protective amine compound is not particularly limited as long as it has a carbamate structure represented by the following general formula (31) or (32).

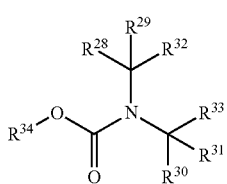

(31)

Here, in the formula, $R^{28}$, $R^{29}$, $R^{30}$ and $R^{31}$ each independently represent hydrogen, an alkyl group having 1 to 8 carbon atoms optionally having a substituent, a cycloalkyl group having 3 to 8 carbon atoms optionally having a substituent, an alkoxyl group having 1 to 8 carbon atoms optionally having a substituent, an alkenyl group having 2 to 8 carbon atoms optionally having a substituent, an alkynyl group having 2 to 8 carbon atoms optionally having a substituent, an aryl group optionally having a substituent, or a heterocyclic group optionally having a substituent. $R^{32}$ and $R^{33}$ each independently represent hydrogen, an alkyl group having 1 to 8 carbon atoms optionally having a substituent, a cycloalkyl group having 3 to 8 carbon atoms optionally having a substituent, an alkoxyl group having 1 to 8 carbon atoms optionally having a substituent, an alkenyl group having 2 to 8 carbon atoms optionally having a substituent, an alkynyl group having 2 to 8 carbon atoms optionally having a substituent, an aryl group optionally having a substituent, a heterocyclic group optionally having a substituent, a single ring optionally having a substituent formed by bonding with each other, or a polycycle optionally having a substituent formed by bonding with each other. (Here, the total number of carbon atoms in the formula is preferably 10 or less.) $R^{34}$ represents an alkyl group having 1 to 12 carbon atoms optionally having a substituent, a cycloalkyl group having 3 to 12 carbon atoms optionally having a substituent, an alkenyl group having 2 to 12 carbon atoms optionally having a substituent, an alkynyl group having 2 to 12 carbon atoms optionally having a substituent, an aryl group optionally having, as a substituent, an alkyl group having 1 to 3 carbon atoms, an aralkyl group optionally having, as a substituent, an alkyl group having 1 to 3 carbon atoms, or a heterocyclic group optionally having a substituent. (Here, the total number of carbon atoms constituting $R^{34}$ is 12 or less.) Any substituent may be used as the substituent that the above groups optionally have.

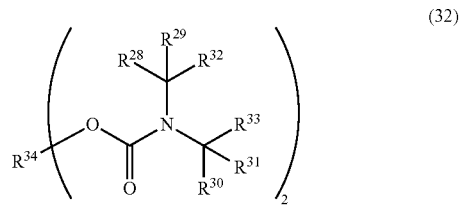

(32)

Specific examples of the formulae (31) and (32) include the following: N-(isopropoxycarbonyl)-2,6-dimethylpiperidine, N-(isopropoxycarbonyl)-2,2,6,6-tetramethylpiperidine, N-(isopropoxycarbonyl)diisopropylamine, N-(isopropoxycarbonyl)pyrrolidine, N-(isopropoxycarbonyl)-2,5-dimethylpyrrolidine, N-(isopropoxycarbonyl)-azetidine, N-(1-ethylpropoxycarbonyl)-2,6-dimethylpiperidine, N-(1-ethylpropoxycarbonyl)-2,2,6,6-tetramethylpiperidine, N-(1-ethylpropoxycarbonyl)diisopropylamine, N-(1-ethylpropoxycarbonyl)pyrrolidine, N-(1-ethylpropoxycarbonyl)-2,5-dimethylpyrrolidine, N-(1-ethylpropoxycarbonyl)-azetidine, N-(1-propylbutoxycarbonyl)-2,6-dimethylpiperidine, N-(1-propylbutoxycarbonyl)-2,2,6,6-tetramethylpiperidine, N-(1-propylbutoxycarbonyl)diisopropylamine, N-(1-propylbutoxycarbonyl)pyrrolidine, N-(1-propylbutoxycarbonyl)-2,5-dimethylpyrrolidine, N-(1-propylbutoxycarbonyl)-azetidine, N-(cyclopentoxycarbonyl)-2,6-dimethylpiperidine, N-(cyclopentoxycarbonyl)-2,2,6,6-tetramethylpiperidine, N-(cyclopentoxycarbonyl)diisopropylamine, N-(cyclopentoxycarbonyl)pyrrolidine, N-(cyclopentoxycarbonyl)-2,5-dimethylpyrrolidine, N-(cyclopentoxycarbonyl)-azetidine, N-(cyclohexylcarbonyl)-2,6-dimethylpiperidine, N-(cyclohexylcarbonyl)-2,2,6,6-tetramethylpiperidine, N-(cyclohexylcarbonyl)diisopropylamine, N-(cyclohexylcarbonyl) pyrrolidine, N-(cyclohexylcarbonyl)-2,5-dimethylpyrrolidine, N-(cyclohexylcarbonyl)-azetidine, N-(tert-butoxycarbonyl)-2,6-dimethylpiperidine, N-(tert-butoxycarbonyl)-2,2,6,6-tetramethylpiperidine, N-(tert-butoxycarbonyl)diisopropylamine, N-(tert-butoxycarbonyl)pyrrolidine, N-(tert-butoxycarbonyl)-2,5-dimethylpyrrolidine, N-(tert-butoxycarbonyl)-azetidine, N-(benzyloxycarbonyl)-2,6-dimethylpiperidine, N-(benzyloxycarbonyl)-2,2,6,6-tetramethylpiperidine, N-(benzyloxycarbonyl)diisopropylamine, N-(benzyloxycarbonyl)pyrrolidine, N-(benzyloxycarbonyl)-2,5-dimethylpyrrolidine, N-(benzyloxycarbonyl)-azetidine, 1,4-bis(N,N'-diisopropylaminocarbonyloxy)cyclohexane, imidazole compounds disclosed in JP 5609815 B, and the like.

The protective amine compound according to the present embodiment is particularly preferably decomposed 100% at 200° C. or lower. In this manner, a basic compound can be generated more efficiently to promote imidization of a polyimide precursor or to promote the crosslinking reaction between a heat crosslinking agent and a resin. A base obtained by heating the protective amine compound and other decomposed products preferably have a boiling point of 200° C. or lower under 1 atmosphere (0.1 GPa). This is because the decomposed product can be volatilized in a low-temperature process from during coating, when the boiling point is 200° C. or lower. The lower limit of the boiling point of the decomposed product under 1 atmosphere is not particularly limited, but is preferably −150° C. or higher from the viewpoint of synthesizing the protective amine compound simply and conveniently.

When an amine compound is added directly to the inventive positive photosensitive resin composition, there is concern that the component (B) crosslinkable polymer compound or the component (D) heat crosslinking agent and the amine compound react under room temperature and the composition becomes viscous over time so that storage stability becomes degraded. On the other hand, with an amine compound whose basicity is protected by a protecting group, the component (B) and the component (D) do not react under room temperature, in the same manner as when unheated. Therefore, storage stability of the photosensitive resin composition over time can be raised. In addition, since a base is only generated once heated, such an amine compound becomes a catalyst in an imide ring-closing reaction or a crosslinking reaction with the component (A) alkali-soluble resin, so that a crosslinking reaction can be promoted effectively.

One kind of the protective amine compound can be used or a combination of two or more kinds can be used. When 0 to 10 parts by mass of the protective amine compound is to be blended relative to 100 parts by mass of the component (A) alkali-soluble resin, a protective amine compound being a mixture with the blending amount of 0.01 to 10 parts by mass, in particular, 0.01 to 5 parts by mass is suitable. When the blending amount is 10 parts by mass or less, the alkali-solubility of the composition does not become lowered, so that lithography patterning property does not become degraded.

[(F) Thermal Acid Generator]

The inventive positive photosensitive resin composition may further contain (F) a compound that generates an acid by heat (thermal acid generator). The compound generating an acid by heat of the component (F) may be added to thermally expedite a crosslinking reaction of the component (A) with the component (B) and the component (D) in a step of heating and post-curing in a temperature of 100 to 300° C. performed after the pattern formation.

In particular, as the component (F), a preferable component is one that does not encourage the curing of a film and does not disturb the pattern formation until a pattern is formed by development. In order to realize this, the component (F) is preferably one that, after the photosensitive resin composition is coated, does not generate an acid at a temperature in a step of removing a solvent and drying, but generates an acid by a heat treatment after pattern formation to encourage the curing of the pattern or a film of the positive photosensitive resin composition. Specifically, a compound that is decomposed by a heat treatment at 100° C. to 300° C., preferably at 150° C. to 300° C. to generate an acid is preferable. By containing such a component (F), crosslinking and curing reaction of the pattern or the film of the positive photosensitive resin composition can be further promoted in the step of heating and post-curing at a temperature of 100 to 300° C. after patterning. The component (F) makes it possible to further improve the mechanical strength, the chemical resistance, the adhesiveness or the like of the obtained pattern or film, by further forwarding the crosslinking, and the curing reaction.

As the compound that generates an acid by a suitable heat, compounds described in paragraphs [0061] to [0085] of JP 2007-199653 A may be exemplified.

A blending amount of the compound that generates an acid by heat is preferably 0.1 part by mass or larger, more preferably 0.5 parts by mass or larger, and, preferably 30 parts by mass or smaller, and more preferably 5 parts by mass or smaller relative to 100 parts by mass of the component (A) in the inventive positive photosensitive resin composition. When the contained amount is 0.1 part by mass or larger, the crosslinking reaction can be promoted. Meanwhile, when the contained amount is 30 parts by mass or smaller, alkali developing properties of the composition are not degraded, so that development residue is not generated.

[(G) Antioxidant]

The inventive positive photosensitive resin composition can further contain (G) an antioxidant. Degradation of an aliphatic group or a phenolic hydroxy group of the component (A) by oxidation can be suppressed by the component (G) antioxidant being contained. In addition, by an anticorrosive effect to metal materials, it is possible to suppress oxidation of metal by water from outside, a photo-acid generator, or a thermal acid generator, etc. and accompanying adhesion degradation and delamination.

Specific examples of antioxidants that can be used here include hindered phenol-based antioxidants, phosphorus-based antioxidants and sulfur-based antioxidants as preferable examples. However, the antioxidant is not limited thereto. Moreover, one of these antioxidants can be used or two or more thereof can be used in combination.

Furthermore, out of the above-described specific examples of antioxidants, examples of the hindered phenol-based antioxidants include pentaerythritol tetrakis[3-(3,5-di-tert-butyl-4-hydroxyphenyl)propionate] (Irganox 1010 (trade name), manufactured by BASF Japan Ltd.), thiodiethylenebis[3-(3,5-di-tert-butyl-4-hydroxyphenyl)propionate] (Irganox 1035 (trade name), manufactured by BASF Japan Ltd.), octadecyl[3-(3,5-di-tert-butyl-4-hydroxyphenyl)propionate] (Irganox 1076 (trade name), manufactured by BASF Japan Ltd.), octyl-1-3,5-di-tert-butyl-4-hydroxyhydrocinnamic acid (Irganox 1135 (trade name), manufactured by BASF Japan Ltd.), 4,6-bis(octylthiomethyl-o-cresol) (Irganox 1520L, manufactured by BASF Japan Ltd.), Sumilizer GA80 (trade name, manufactured by Sumitomo Chemical Co., Ltd.), Adekastab AO-20 (trade name, manufactured by ADEKA CORPORATION), Adekastab AO-30 (trade name, manufactured by ADEKA CORPORATION), Adekastab AO-40 (trade name, manufactured by ADEKA CORPORATION), Adekastab AO-50 (trade name, manufactured by ADEKA CORPORATION), Adekastab AO-60 (trade name, manufactured by ADEKA CORPORATION), Adekastab AO-80 (trade name, manufactured by ADEKA CORPORATION), Adekastab AO-330 (trade name, manufactured by ADEKA CORPORATION), hindered phenol-based antioxidants disclosed in WO 2017/188153 A1, and the like.

Furthermore, out of the above-described specific examples of antioxidants, examples of the phosphorus-based antioxidants include triphenyl phosphite, tris(methylphenyl) phosphite, triisooctyl phosphite, tridecyl phosphite, tris(2-ethylhexyl) phosphite, tris(nonylphenyl) phosphite, tris(octylphenyl) phosphite, tris[decylpoly(oxyethylene) phosphite, tris(cyclohexylphenyl) phosphite, tricyclohexyl phosphite, tri(decyl)thio phosphite, triisodecylthio phosphite, phenyl-bis(2-ethylhexyl) phosphite, phenyl-diisodecyl phosphite, tetradecylpoly(oxyethylene)-bis(ethylphenyl) phosphite, phenyl-dicyclohexyl phosphite, phenyl-diisooctyl phosphite, phenyl-di(tridecyl) phosphite, diphenyl-cyclohexyl phosphite, diphenyl-isooctyl phosphite, diphenyl-2-ethylhexyl phosphite, diphenyl-isodecyl phosphite, diphenyl-cyclohexylphenyl phosphite, diphenyl-(tridecyl)thio phosphite, and the like.

Furthermore, out of the above-described specific examples of antioxidants, examples of the sulfur-based antioxidants include Adekastab AO-4125 (trade name, manufactured by ADEKA CORPORATION), AO-5035 (trade name, manufactured by ADEKA CORPORATION), Sumilizer TP-D (trade name, manufactured by Sumitomo Chemical Co., Ltd.), and the like.

Sulfur-based antioxidants and phosphorus-based antioxidants can be expected to have an effect of decomposing peroxides.

The blending amount of (G) the antioxidant is preferably 0.1 to 10 parts by mass, more preferably 0.2 to 5 parts by mass relative to 100 parts by mass of the component (A) alkali-soluble resin. When the contained amount is 0.1 part by mass or more, adhesiveness to metal materials is enhanced, while at the same time, delamination is suppressed. Meanwhile, when the contained amount is 10 parts by mass or less, the alkali developing properties of the composition and the toughness of the cured film are not degraded.

[(H) Silane Compound]

The inventive positive photosensitive resin composition can further contain (H) a silane compound. When the component (H) silane compound is contained, not only is the adhesiveness to metal materials enhanced, it is also possible to suppress the delamination of the cured film in reliability tests such as a thermal shock test and a high temperature and high humidity test.

A silane compound that can be used here can be any silane compound as long as the silane compound has an alkoxysilyl group. Suitable, specific examples include the following: γ-glycidoxypropyltriethoxysilane, γ-glycidoxypropyltrimethoxysilane, 2-(3,4-epoxycyclohexyl)ethyltrimethoxysilane, bis(2-hydroxyethyl)-3-aminopropyl-triethoxysilane, γ-aminopropyltrimethoxysilane, γ-aminopropyltriethoxysilane, vinyltriethoxysilane, vinyltrimethoxysilane, γ-methacryloxypropyltrimethoxysilane, γ-acryloxypropyltrimethoxysilane, 3-mercaptopropyltrimethoxysilane, 3-isocyanatepropyltriethoxysilane, bis(2-hydroxyethyl)-3-aminopropyltriethoxysilane, triethoxysilylpropylethyl carbamate, 3-(triethoxysilyl)propyl succinic anhydride, phenyltriethoxysilane, phenyltrimethoxysilane, N-phenyl-3-aminopropyltrimethoxysilane, 3-triethoxysilyl-N-(1,3-dimethylbutylidene)propylamine, amide group-containing silane compounds disclosed in JP 6414060 B, thiourea group-containing silane compounds disclosed in WO 2016/140024 A and JP 5987984 B, thiol group-containing silane compounds disclosed in JP 2017-044964 A, and the like. However, the silane compound is not limited thereto. Furthermore, one of these silane compounds can be used or a combination of two or more thereof can be used.

The contained amount of (H) the silane compound is preferably 0.1 to 20 parts by mass, more preferably 1 to 10 parts by mass, and further preferably 3 to 6 parts by mass relative to 100 parts by mass of the component (A) alkali-soluble resin. With 0.1 part by mass or more, more sufficient adhesiveness with a substrate can be provided, and when 20 parts by mass or less, it is possible to further suppress the problem of increasing viscosity or the like when storing at room temperature. Meanwhile, when the contained amount is less than 10 parts by mass, the alkali developing properties of the composition are not degraded, so that development residue is not caused.

[Other Components]

In the inventive positive photosensitive resin composition, components other than the components (A), (B), (C), (D), (E), (F), (G), and (H) may be further contained. Examples of such other components include (I) a dissolution inhibitor, (J) a surfactant, (K) a solvent, and the like. The compounds exemplified below or the like can be suitably used. However, the compounds are not limited thereto.

Examples of (I) the dissolution inhibitor include compounds having two or more phenolic hydroxy groups in a molecule, where an average of 0 to 100 mol % of the hydrogen atoms of the phenolic hydroxy groups are substituted with acid-labile groups as a whole; or compounds having a carboxy group in a molecule, where an average of 50 to 100 mol % of the hydrogen atoms of the carboxy groups are substituted with acid-labile groups as a whole. In addition, the compounds have a weight-average molecular weight of 100 to 1,000, preferably 150 to 800.

The degree of substitution of the hydrogen atoms in the phenolic hydroxy groups with the acid-labile groups is, on average, 0 mol % or higher, preferably 30 mol % or higher of all the phenolic hydroxy groups, and the upper limit of the degree is 100 mol %, more preferably 80 mol %. The degree of substitution of the hydrogen atoms in the carboxy groups with the acid-labile group is, on average, 50 mol % or higher, preferably 70 mol % or higher of all the carboxy groups, and the upper limit of the degree is 100 mol %.

In this case, compounds represented by the following formulae (I1) to (I14) are preferable as the compounds having two or more phenolic hydroxy groups or the compounds having a carboxy group.

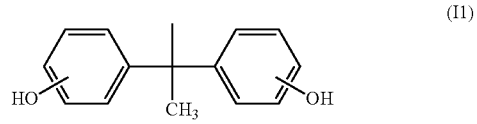

(I1)

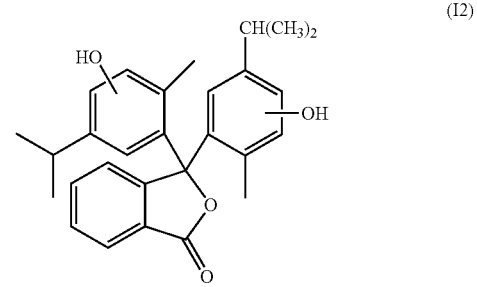

(I2)

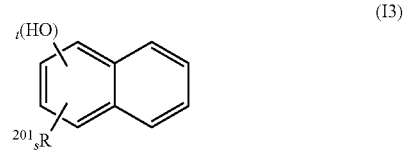

(I3)

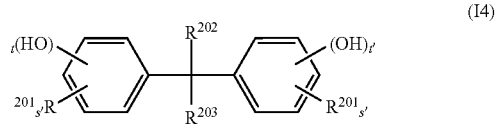

(I4)

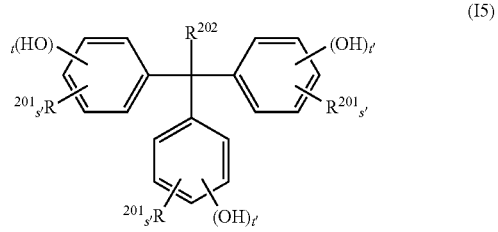

(I5)

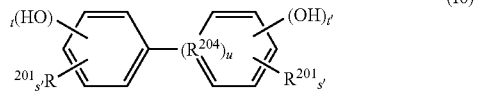

(I6)

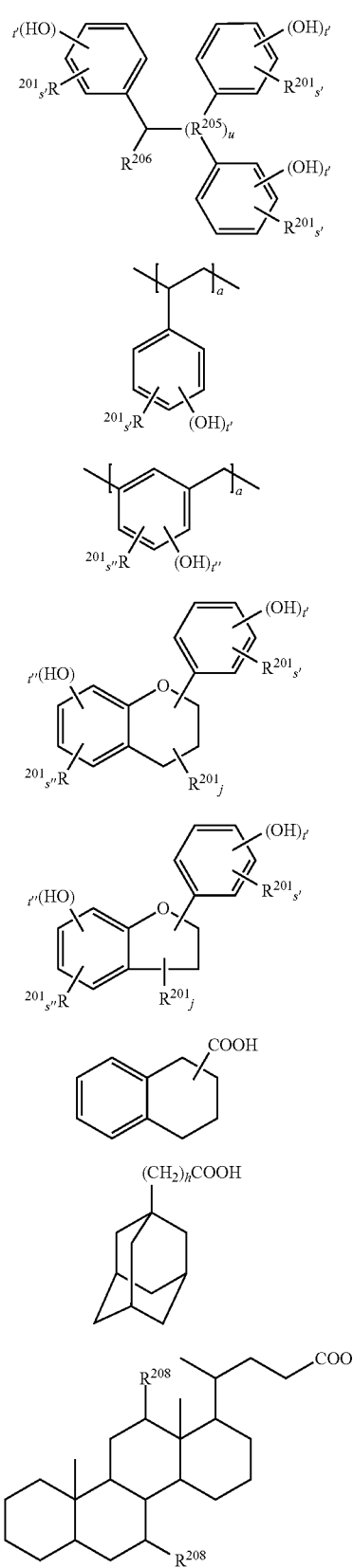

having 1 to 8 carbon atoms. $R^{203}$ represents a hydrogen atom or a linear or branched alkyl group or alkenyl group having 1 to 8 carbon atoms. $R^{204}$ represents $—(CH_2)_i—(i=2$ to 10), an arylene group having 6 to 10 carbon atoms, a carbonyl group, a sulfonyl group, an oxygen atom, or a sulfur atom. $R^{205}$ represents an alkylene group having 1 to 10 carbon atoms, an arylene group having 6 to 10 carbon atoms, a carbonyl group, a sulfonyl group, an oxygen atom, or a sulfur atom. $R^{206}$ represents a hydrogen atom, a linear or branched alkyl group or alkenyl group having 1 to 8 carbon atoms, or a phenyl group or a naphthyl group each substituted with a hydroxy group. $R^{208}$ represents a hydrogen atom or a hydroxy group. "j" is an integer of 0 to 5. "u" and "h" are 0 or 1. "s", "t", "s'", "t'", "s''", and "t''" each satisfy s+t=8, s'+t'=5, and s''+t''=4, and are numbers such that there is at least one hydroxy group in each phenyl skeleton. "α" is a number that gives a molecular weight of 100 to 1,000 to the compounds of the formulae (18) and (19).

The blending amount of the dissolution inhibitor is 0 to 50 parts by mass, preferably 5 to 50 parts by mass, more preferably 5 to 20 parts by mass relative to 100 parts by mass of the component (A) alkali-soluble resin. One dissolution inhibitor can be used or a mixture of two or more thereof can be used. When the blending amount is sufficient, resolution can be enhanced, and when the amount is 50 parts by mass or less, film loss of patterns does not occur, so that high resolution can be achieved.

As the (J) surfactant, a nonionic surfactant is preferable. Examples thereof include fluorinated surfactants, specifically, perfluoroalkyl polyoxyethylene ethanol, fluorinated alkyl ester, perfluoroalkylamine oxide, a fluorine-containing organosiloxane compound, and a nonfluorinated organosiloxane compound.

As these surfactants, commercially available ones may be used. Examples thereof include Fluorad FC-4430 (trade name, manufactured by Sumitomo 3M Limited), PF-6320 (trade name, manufactured by OMNOVA Solutions Inc.), PF-636 (trade name, manufactured by OMNOVA Solutions Inc.), Surflon S-141 and S-145 (both trade names, manufactured by ASAHI GLASS CO., LTD.), UNIDYNE DS-401, DS-4031, and DS-451 (all trade names, manufactured by DAIKIN INDUSTRIES, LTD.), Megafac F-8151 (trade name, manufactured by DIC Corporation), X-70-093 (trade name, manufactured by Shin-Etsu Chemical Co., Ltd.), etc. Among these, preferred are Fluorad FC-4430 (trade name, manufactured by Sumitomo 3M Limited), PF-6320 (trade name, manufactured by OMNOVA Solutions Inc.), PF-636 (trade name, manufactured by OMNOVA Solutions Inc.), and X-70-093 (trade name, manufactured by Shin-Etsu Chemical Co., Ltd.).

The blending amount of the surfactant is preferably 0.01 to 5 parts by mass, more preferably 0.01 to 3 parts by mass relative to 100 parts by mass of the component (A) alkali-soluble resin.

The (K) solvent is not limited as long as it can dissolve the component (A), the component (B), and the component (C). Examples of the solvent include: ketones such as cyclohexanone, cyclopentanone, methyl-2-n-amyl ketone, and the like; alcohols such as 3-methoxybutanol, 3-methyl-3-methoxybutanol, 1-methoxy-2-propanol, 1-ethoxy-2-propanol, and the like; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, and the like; esters such as propylene glycol monomethyl ether acetate, propylene glycol monoethyl ether acetate, ethyl lactate, ethyl pyruvate, butyl acetate, methyl In the formulae, $R^{201}$ and $R^{202}$ each represent a hydrogen atom or a linear or branched alkyl group or alkenyl group 3-methoxypropionate, ethyl 3-ethoxypropionate, tert-butyl acetate, tert-butyl propionate, propylene glycol-mono-tert-butyl ether acetate, γ-butyrolactone, and the like. One or more kinds thereof may be used. In particular, ethyl lactate, cyclohexanone, cyclopentanone, propylene glycol monomethyl ether acetate, γ-butyrolactone or a mixed solvent thereof is preferable.

A blending amount of the component (K) is preferably 50 to 2,000 parts by mass, particularly preferably 100 to 1,000 parts by mass relative to 100 parts by mass of the total of the blending amounts of the component (A), the component (B), and the component (C).

[Positive Photosensitive Dry Film]

The inventive positive photosensitive dry film is provided with a supporting film, a top coat film, and between the supporting film and the top coat film, a photosensitive resin film (photosensitive resin layer) obtained from the above-described positive photosensitive resin composition.

The photosensitive dry film (supporting film, top coat film, and photosensitive resin film) is solid, and the photosensitive resin film does not contain a solvent. Therefore, there is no risk of bubbles caused by volatilization of the solvent remaining inside the photosensitive resin film and between the photosensitive resin film and an uneven substrate.

The film thickness of the photosensitive resin film is preferably 5 to 200 μm, more preferably 5 to 100 μm, and further preferably 10 to 100 μm, from the viewpoints of flatness on an uneven substrate, covering of the uneven surface, and a distance between laminated substrates.

The viscosity and the flowability of the photosensitive resin film are closely related. The photosensitive resin film can exhibit suitable flowability at a suitable viscosity range and go deep into narrow spaces, or strengthen the adhesion with a substrate by softening the resin. Accordingly, the viscosity of the photosensitive resin film is preferably 10 to 5,000 Pa·s, more preferably 30 to 2,000 Pa·s, and further preferably 50 to 300 Pa·s at 80 to 120° C. from the viewpoint of the flowability of the photosensitive resin film. In the present invention, the viscosity is a value measured with a rotational viscometer.

When the inventive photosensitive dry film has the top coat film delaminated to bring into close contact with an uneven substrate, the photosensitive resin film follows and covers the unevenness, so that high flatness can be achieved. In particular, since the photosensitive resin film has a characteristic of having low viscoelasticity, higher flatness can be achieved. Furthermore, by bringing the photosensitive resin film into close contact with the substrate under vacuum conditions, these spaces can be prevented more effectively.

[Method for Producing Positive Photosensitive Dry Film]

Furthermore, the present invention provides a method for producing a positive photosensitive dry film, including:

(1) forming a photosensitive resin layer by continuously coating a supporting film with the above-described positive photosensitive resin composition;

(2) continuously drying the photosensitive resin layer; and further (3) laminating a top coat film onto the photosensitive resin layer.

The inventive photosensitive dry film can be produced by coating a supporting film with the above-described photosensitive resin composition and drying to form a photosensitive resin film. As an apparatus for producing the photosensitive dry film, a film coater that is generally used for producing an adhesive product may be used. Illustrative examples of the film coater include a comma coater, a comma reverse coater, a multi coater, a die coater, a lip coater, a lip reverse coater, a direct gravure coater, an offset gravure coater, a 3-roll bottom reverse coater, and a 4-roll bottom reverse coater.

The supporting film is rolled out from a roll-out axis of the film coater, and when the supporting film is passing through a coater head of the film coater, the photosensitive resin composition is applied onto the supporting film with a predetermined thickness; and then, the resultant is passed through a hot-air circulating oven at a predetermined temperature for a predetermined period to dry and form a photosensitive resin film on the supporting film. Next, the photosensitive resin film is passed through a laminate roll together with the top coat film that has been rolled out from another roll-out axis of the film coater under a predetermined pressure, thereby bonding the photosensitive resin film to the top coat film on the supporting film. Subsequently, this is rolled up to a roll-up axis of the film coater. Thus, a photosensitive dry film having a top coat film can be produced. In this case, the temperature of the hot-air circulating oven is preferably 25 to 150° C., the period for passing through is preferably 1 to 100 minutes, and the laminate roll pressure is preferably 0.01 to 5 MPa.

The supporting film may be a monolayer film formed from a single film or a multilayer film having a plurality of films being laminated. Examples of the material for the film include synthetic resin films such as polyethylene, polypropylene, polycarbonate, and polyethylene terephthalate, etc. Among these, polyethylene terephthalate is preferable in view of having appropriate flexibility, mechanical strength, and heat resistance. These films may be variously subjected to, for example, corona treatment and coating treatment with a releasing agent. For this, commercial films may be used. Illustrative examples thereof include Cerapeel WZ (RX) and Cerapeel BX8 (R) (both manufactured by Toray Advanced Film Co., Ltd.), E7302 and E7304 (both manufactured by Toyobo Co., Ltd.), Purex G31 and Purex G71T1 (both manufactured by Teijin DuPont Films Japan Ltd.), and PET38×1-A3, PET38×1-V8, and PET38×1-X08 (all manufactured by Nippa Co., Ltd.).

As the top coat film, the same film as the above-mentioned supporting film can be used, but polyethylene terephthalate and polyethylene are preferable, having appropriate flexibility. For this, commercial films may be used, and illustrative examples thereof include the polyethylene terephthalates that have already been exemplified, polyethylene such as GF-8 (manufactured by Tamapoly Co., Ltd.) and PE Film 0-Type (manufactured by Nippa Co., Ltd.).

The thicknesses of the supporting film and the top coat film are both preferably 10 to 100 μm, more preferably 10 to 50 μm, in view of stable production of the photosensitive dry film and the rolling habit around a roll axis, so-called curl-prevention.

(Patterning Process)

The present invention provides a patterning process including the following steps.

(1) A step of forming a photosensitive material film by coating a substrate with the above-described positive photosensitive resin composition;

(2) subsequently, after a heat treatment, a step of exposing the photosensitive material film with a high energy beam having a wavelength of 190 to 500 nm or an electron beam via a photomask; and (3) after irradiation, a step of developing on the substrate with a developer of an alkaline aqueous solution.

In the following, a patterning process using the inventive positive photosensitive resin composition will be described.

In the inventive positive photosensitive resin composition, in order to form a pattern, a well-known lithography technology may be adopted and performed. For example, on a silicon wafer, a $SiO_2$ substrate, a SiN substrate, or a substrate on which a pattern such as copper wiring is formed, the photosensitive resin composition is applied by a technique of spin-coating (spin-coating method), followed by prebaking under the condition at 80 to 130° C., and for about 50 to 600 seconds to form a photosensitive material film having a thickness of 1 to 50 μm, preferably 1 to 30 μm, and further preferably 1 to 20 μm.

According to the spin-coating method, after dispensing about 5 mL of the photosensitive resin composition on such a silicon substrate, the photosensitive resin composition may be applied on the substrate by rotating the substrate. At this time, by adjusting the rotation rate, a film thickness of the photosensitive material film on the substrate may be readily adjusted.

Subsequently, by holding a mask for forming a target pattern over the photosensitive material film, a high energy beam of a wavelength of 190 to 500 nm such as an i-line and a g-line or an electron beam is used for irradiation such that an exposure dose is about 1 to 5,000 $mJ/cm^2$, preferably about 100 to 2,000 $mJ/cm^2$.

After the irradiation, the development is applied. In the inventive positive photosensitive resin composition, an alkaline development using an alkaline aqueous solution may be applied.

Examples of the aqueous alkaline solution that can be favorably used for the alkali development include 2.38% aqueous tetramethylammonium hydroxide (TMAH) solution. The development may be performed according to an ordinary method such as a spray method and a paddle method, or by dipping in the developer, or the like. After that, as needs arise, by performing cleaning, rinsing, drying or the like, a resist film having a desired pattern may be obtained.

(Patterning Process Using Positive Photosensitive Dry Film)

The present invention provides a patterning process including the following steps.
(1) A step of adhering onto a substrate the photosensitive resin layer which becomes exposed by delaminating the top coat film from the inventive positive photosensitive dry film;
(2) subsequently, a step of exposing the photosensitive resin layer to a high energy beam having a wavelength of 190 to 500 nm or an electron beam via a photomask under the state of intervention of the supporting film or under the state of the supporting film delaminated; and
(3) after irradiation, a step of developing with a developer of an alkaline aqueous solution.

In the following, a patterning process using the inventive positive photosensitive dry film will be described.

In step (1), a photosensitive resin film is formed on a substrate by using a photosensitive dry film. Specifically, a photosensitive resin film is formed on a substrate by laminating a photosensitive resin film of a photosensitive dry film on a substrate. Examples of the substrate include those similar to the substrates described in the patterning process using the positive photosensitive resin composition.

When the photosensitive dry film has a top coat film, the top coat film is delaminated from the photosensitive dry film, and then the photosensitive resin film of the photosensitive dry film is laminated onto the substrate. The lamination can be performed using a film laminating apparatus, for example. As the film laminating apparatus, a vacuum laminator is preferred. For example, the top coat film of the photosensitive dry film is delaminated, and the photosensitive resin film thereby exposed is brought into close contact with the substrate on a table at a predetermined temperature by using an adhering roll under a predetermined pressure in a vacuum chamber with a predetermined degree of vacuum. Note that the temperature of the table is preferably 60 to 120° C., the pressure of the adhering roll is preferably 0 to 5.0 MPa, and the degree of vacuum is preferably 50 to 500 Pa.

In order to obtain the photosensitive resin film with a necessary film thickness, the films may be laminated multiple times as necessary. For example, about 1 to 10 times of the adhesion can give the photosensitive resin film with the thickness of about 10 to 1,000 μm, particularly about 100 to 500 μm.

If necessary, pre-bake may be carried out in order to enhance the adhesion properties between the photosensitive resin film and the substrate. The pre-bake may be carried out, for example, at 40 to 140° C. for about 1 minute to 1 hour.

Subsequently, by holding a mask for forming a target pattern over the photosensitive resin film, a high energy beam of a wavelength of 190 to 500 nm such as an i-line and a g-line or an electron beam is used for irradiation such that an exposure dose is about 1 to 5,000 $mJ/cm^2$, preferably about 100 to 2,000 $mJ/cm^2$. Incidentally, the supporting film of the photosensitive dry film is delaminated or removed by other methods before the pre-bake or before the PEB in accordance with the process.

After the irradiation, the photosensitive resin film is developed using a developer to form a pattern in the same manner as the patterning process using the photosensitive resin composition.

(Method for Forming Cured Film)

The film having a pattern obtained by the patterning process may be baked and post-cured with an oven or a hot plate, for example, at 100 to 300° C., preferably 150 to 300° C., more preferably 180 to 250° C. to form a cured film. The post-curing temperature of 100 to 300° C. allows the film of the photosensitive resin composition to increase the cross-linking density and to remove remaining volatile components. Thus, this temperature range is preferable in view of adhesiveness to a substrate, heat resistance, strength, and electronic characteristics. The time for the post-curing can be 10 minutes to 10 hours.

The formed pattern is used for the purpose of a protective coating for covering wirings, circuits and substrates, and the like. The formed patterns and protective coatings, while having excellent insulation property, have excellent adhesive force on a metal layer such as Cu of wirings and circuits to be covered, on a metal electrode existing on the substrate, or on an insulating substrate such as SiN existing in wirings and circuits to be covered, and make it possible, while having the mechanical strength appropriate as a protective coating, to remarkably improve the resolution performance for enabling a finer pattern formation.

(Cured Film)

The cured film thus obtained is excellent in the adhesiveness to the substrate, heat resistance, electric characteristics, mechanical strength and chemical resistance to an alkaline release liquid, and the like, and also excellent in reliability of a semiconductor device using the film as a protective coating. In particular, it is possible to prevent occurrence of cracks in the temperature cycle test, and it can be suitably used as a protective coating (an interlayer insulation film or a surface protective film) for electric and electronic parts, a semiconductor device, and the like.

That is, the present invention provides an interlayer insulation film or a surface protective film made of the cured film obtained by curing the positive photosensitive resin composition.

The above protective coating is useful for an insulator film for a semiconductor device including rewiring use, an insulator film for a multilayer printed substrate, a solder mask, and a cover lay film, etc. because of its heat resistance, chemical resistance, and insulating property.

Furthermore, the present invention provides an electronic component having the interlayer insulation film or the surface protective film. Such an electronic component becomes excellent in reliability because the electronic component has the protective coating (interlayer insulation film or surface protective film) having heat resistance, chemical resistance, and the insulation property.

EXAMPLE

Hereinafter, the present invention will be specifically described with reference to Synthesis Examples, Examples, and Comparative Examples. However, the present invention is not limited to the following examples. Note that the weight-average molecular weight (Mw) indicates a weight-average molecular weight measured by GPC in terms of polystyrene.

I. Synthesis of Alkali-Soluble Resin (A)

In the following Synthesis Examples, chemical structures and names of the used compounds are shown below.

[Synthesis Example 1] Synthesis of Polyimide Resin (A1)

Into a 1-L flask provided with a stirrer and a thermometer, 30 g (81.9 mmol) of 2,2-bis(3-amino-4-hydroxyphenyl)hexafluoropropane (6FAP), 0.9 g (8.6 mmol) of 4-aminophenol (PAP) and 125 g of N-methyl-2-pyrrolidone were added, followed by dissolving by stirring at room temperature. Next, under room temperature, a solution in which 26.7 g (86.2 mmol) of 3,3',4,4'-oxydiphthalic dianhydride (s-ODPA) was dissolved in 270 g of N-methyl-2-pyrrolidone was dropped thereto, after dropping, followed by stirring for 3 hours under room temperature. Thereafter, 40 g of xylene was added to the reaction liquid, followed by heating and refluxing for 3 hours while removing water generated at 170° C. outside the system. After cooling to room temperature, the reaction liquid was dropped into 2 L of ultrapure water under stirring, a precipitate was filtered to be washed appropriately with water, followed by drying under reduced pressure at 40° C. for 48 hours. Thus, a polyimide resin (A1) was obtained. A molecular weight of the polymer was measured by GPC. A weight-average molecular weight was 35,000 in terms of polystyrene.

[Synthesis Example 2] Synthesis of Polyimide Resin (A2)

A polyimide resin (A2) was obtained by the same method as Synthesis Example 1, except that the 30 g of (81.9 mmol) 2,2-bis(3-amino-4-hydroxyphenyl)hexafluoropropane (6FAP) was changed to 21.2 g (81.9 mmol) of 2,2-bis(3-amino-4-hydroxyphenyl)propane (BAP). A molecular

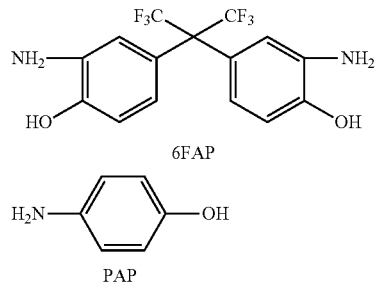

6FAP

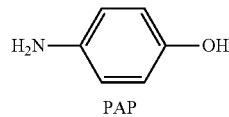

PAP

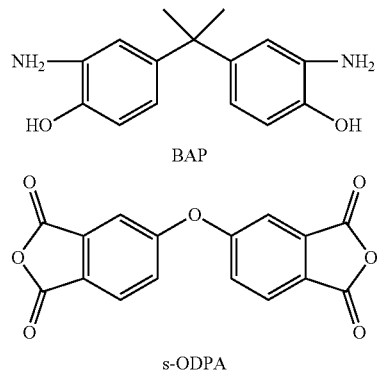

BAP s-ODPA

DC-1

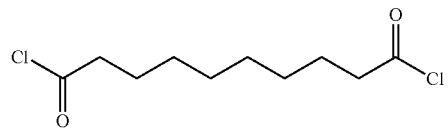

X-1

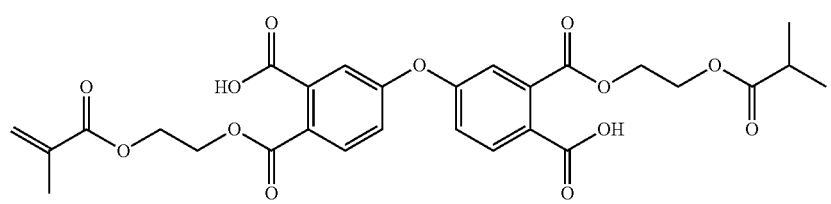

weight of the polymer was measured by GPC. A weight-average molecular weight was 34,000 in terms of polystyrene.

[Synthesis Example 3] Synthesis of Polyamide-Imide Resin (A3)

Into a 500-ml flask provided with a stirrer and a thermometer, 28.5 g (77.8 mmol) of 2,2-bis(3-amino-4-hydroxyphenyl)hexafluoropropane (6FAP), 0.9 g (8.2 mmol) of 4-aminophenol (PAP), and 118 g of N-methyl-2-pyrrolidone were added, followed by dissolving by stirring at room temperature. Next, under room temperature, a solution in which 19.0 g (61.4 mmol) of 3,3',4,4'-oxydiphthalic dianhydride (s-ODPA), was dissolved in 192 g of N-methyl-2-pyrrolidone was dropped thereto, after dropping, followed by stirring for 3 hours under room temperature. Thereafter, 40 g of xylene was added to the reaction liquid, followed by heating and refluxing for 3 hours while removing water generated at 170° C. outside the system. After cooling to room temperature, 3.2 g (41.0 mmol) of pyridine was added thereto, and 4.9 g (20.5 mmol) of sebacoyl dichloride (DC-1) was dropped thereto so as to keep the temperature to 5° C. or lower. After completion of the dropping, the temperature was returned to room temperature, and the reaction liquid was dropped into 2 L of ultrapure water under stirring. A precipitate was filtered to be washed appropriately with water, followed by drying under reduced pressure at 40° C. for 48 hours. Thus, a polyamide-imide resin (A3) was obtained. A molecular weight of the polymer was measured by GPC. A weight-average molecular weight was 35,000 in terms of polystyrene.

[Synthesis Example 4] Synthesis of Polyamide Resin (A4)

Into a 500-ml flask provided with a stirrer and a thermometer, 28.5 g (77.8 mmol) of 2,2-bis(3-amino-4-hydroxyphenyl)hexafluoropropane (6FAP), 0.9 g (8.2 mmol) of 4-aminophenol (PAP), and 118 g of N-methyl-2-pyrrolidone were added, followed by dissolving by stirring at room temperature. Next, 13.0 g (163.8 mmol) of pyridine was added thereto, and 19.6 g (81.9 mmol) of sebacoyl dichloride (DC-1) was dropped thereto so as to keep the temperature to 5° C. or lower. After completion of the dropping, the temperature was returned to room temperature, and the reaction liquid was dropped into 2 L of ultrapure water under stirring. A precipitate was filtered to be washed appropriately with water, followed by drying under reduced pressure at 40° C. for 48 hours. Thus, a polyamide resin (A4) was obtained. A molecular weight of the polymer was measured by GPC. A weight-average molecular weight was 38,000 in terms of polystyrene.

[Synthesis Example 5] Synthesis of Tetracarboxylic Diester Compound (X-1

Into a 3-L flask provided with a stirrer and a thermometer, 100 g (322 mmol) of 3,3',4,4'-oxydiphthalic dianhydride (s-ODPA), 65.2 g (644 mmol) of triethylamine, 39.3 g (322 mmol) of N,N-dimethyl-4-aminopyridine, and 400 g of γ-butyrolactone were added, under stirring at room temperature, 83.8 g (644 mmol) of hydroxyethylmethacrylate (HEMA) was dropped thereto, followed by stirring for 24 hours under room temperature. After that, 370 g of a 10% aqueous solution of hydrochloric acid was dropped under ice cooling to stop the reaction. To the reaction liquid, 800 g of 4-methyl-2-pentanone was added to sample an organic layer, followed by washing 6 times with 600 g of water. A solvent of the obtained organic layer was distilled and 180 g of a tetracarboxylic diester compound (X-1) was obtained.

[Synthesis Example 6] Synthesis of Polyimide Precursor (A5)

Into a 1-L flask provided with a stirrer and a thermometer, 57.1 g (100 mmol) of (X-1) and 228 g of N-methyl-2-pyrrolidone were added, followed by dissolving by stirring at room temperature. Next, under ice cooling, 24.4 g (205 mmol) of thionyl chloride was dropped thereto so as to keep the reaction solution temperature to 10° C. or lower. After completion of the dropping, the solution was stirred under ice cooling for 2 hours. Subsequently, a solution obtained by dissolving 34.8 g (95 mmol) of 2,2-bis(3-amino-4-hydroxyphenyl)hexafluoropropane (6FAP), 1.1 g (10 mmol) of 4-aminophenol (PAP), and 32.4 g (410 mmol) of pyridine with 144 g of N-methyl-2-pyrrolidone was dropped thereto under ice cooling so as to keep the reaction solution temperature to 10° C. or lower. After completion of the dropping, the temperature was returned to room temperature, and the reaction liquid was dropped into 3 L of water under stirring. A precipitate was filtered to be washed appropriately with water, followed by drying under reduced pressure at 40° C. for 48 hours. Thus, a polyimide precursor (A5) was obtained. A molecular weight of the polymer was measured by GPC. A weight-average molecular weight was 36,000 in terms of polystyrene.

II. Synthesis of Crosslinkable Polymer Compound (B)

Synthesis Example

As a crosslinkable polymer compound (polymeric additive), various monomers were combined and copolymerized under a tetrahydrofuran solvent, a crystal was precipitated in hexane, dried, and polymer compounds (polymers B1 to B19 and comparative polymers C1 and C2) of the compositions shown below were obtained. The composition of the obtained polymer compounds was confirmed by 1H-NMR, and the molecular weight of the obtained polymer compounds was confirmed by gel permeation chromatography.

[Synthesis Example 7] Polymer B1

Molecular weight (Mw)=11,600

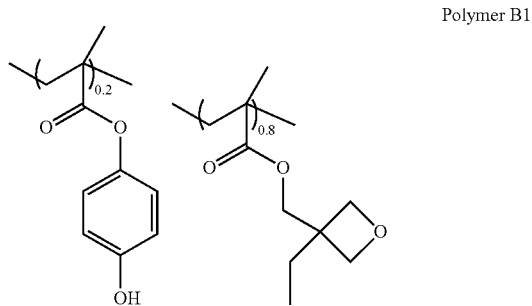

Polymer B1

[Synthesis Example 8] Polymer B2
Molecular weight (Mw)=11,800
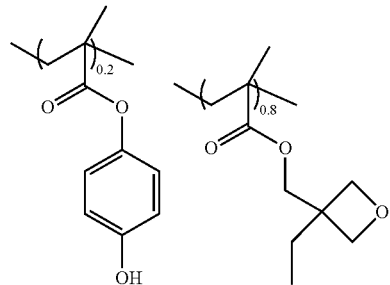
Polymer B2
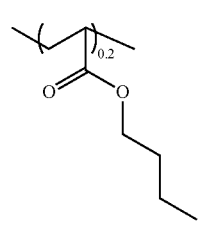
[Synthesis Example 9] Polymer B3
Molecular weight (Mw)=11,000
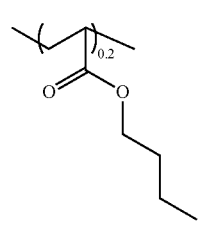
Polymer B3
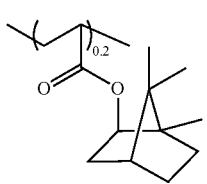
[Synthesis Example 10] Polymer B4
Molecular weight (Mw)=10,800
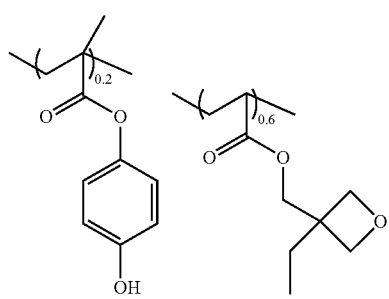
Polymer B4
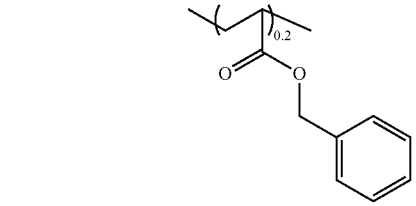
[Synthesis Example 11] Polymer B5
Molecular weight (Mw)=11,300
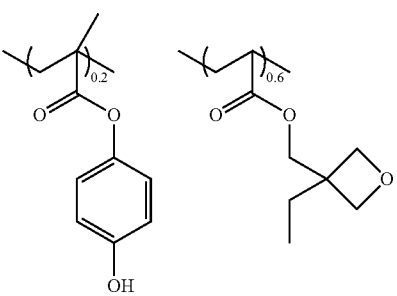
Polymer B5
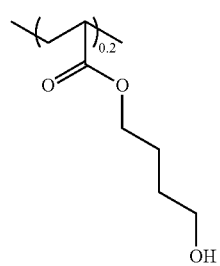

[Synthesis Example 12] Polymer B6
Molecular weight (Mw)=9,800
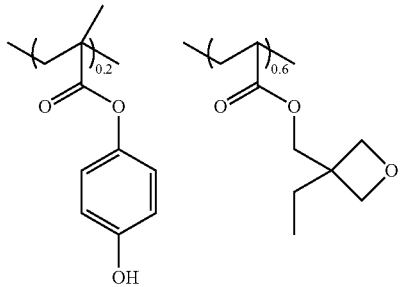
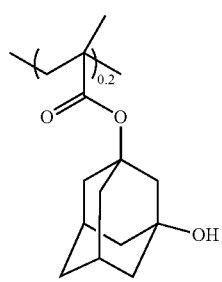
[Synthesis Example 13] Polymer B7
Molecular weight (Mw)=9,500
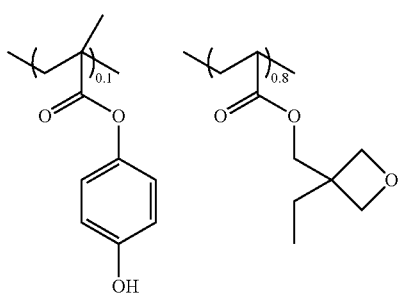
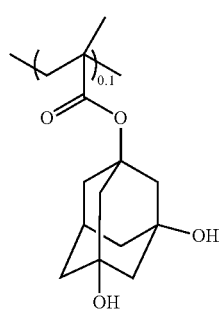
[Synthesis Example 14] Polymer B8
Molecular weight (Mw)=10,200
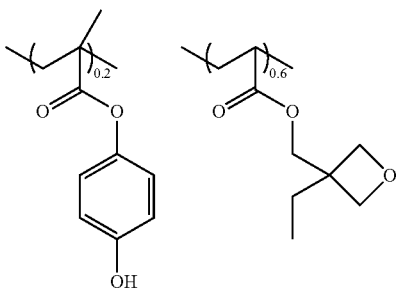
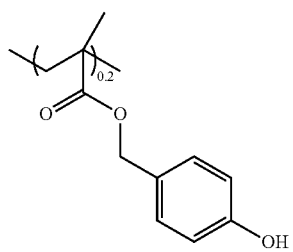
[Synthesis Example 15] Polymer B9
Molecular weight (Mw)=12,300
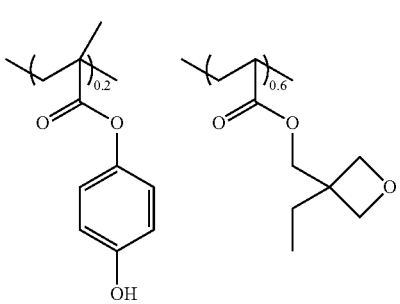
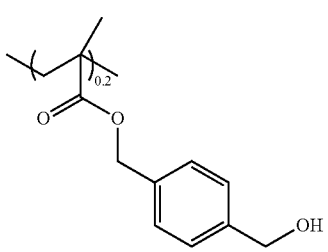

[Synthesis Example 16] Polymer B10
Molecular weight (Mw)=11,800
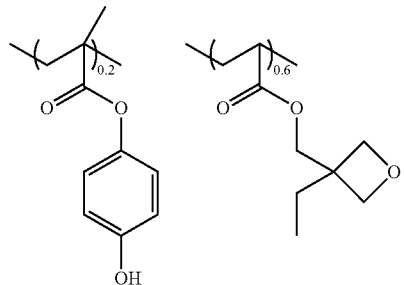
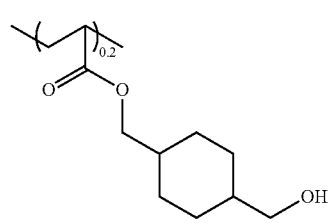
[Synthesis Example 17] Polymer B11
Molecular weight (Mw)=9,000
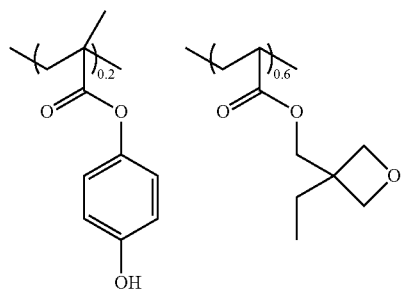
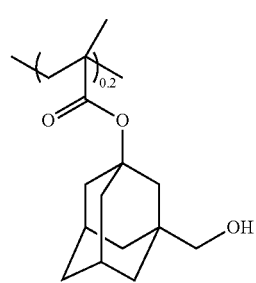
[Synthesis Example 18] Polymer B12
Molecular weight (Mw)=9,300
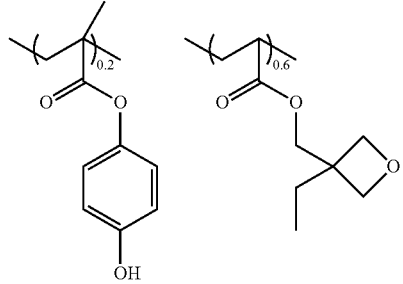
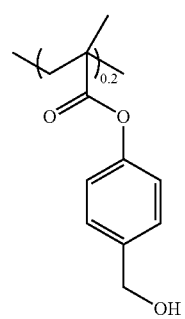
[Synthesis Example 19] Polymer B13
Molecular weight (Mw)=9,500

[Synthesis Example 20] Polymer B14
Molecular weight (Mw)=10,400
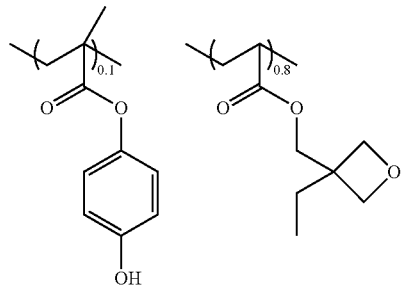
Polymer B14
[Synthesis Example 21] Polymer B15
Molecular weight (Mw)=12,300
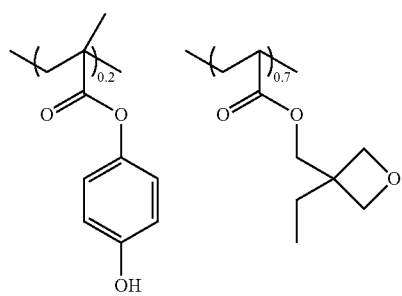
Polymer B15
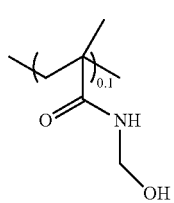
[Synthesis Example 22] Polymer B16
Molecular weight (Mw)=12,300
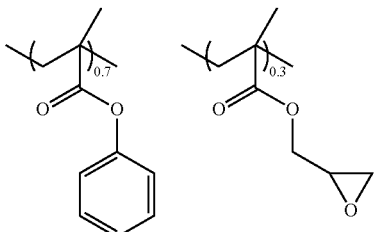
Polymer B16
[Synthesis Example 23] Polymer B17
Molecular weight (Mw)=11,300
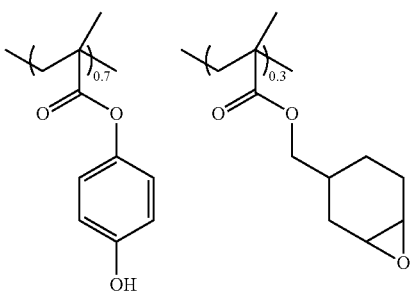
Polymer B17
[Synthesis Example 24] Polymer B18
Molecular weight (Mw)=11,700
Polymer B18

[Synthesis Example 25] Polymer B19

Molecular weight (Mw)=11,300

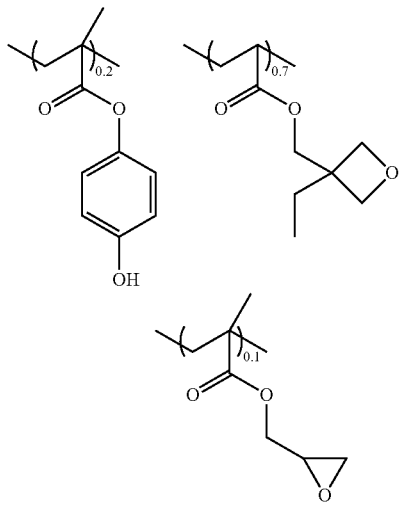

Polymer B19

[Synthesis Example 26] Comparative Polymer C1

Molecular weight (Mw)=11,900

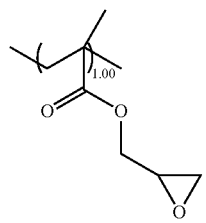

Comparative polymer C1

[Synthesis Example 27] Comparative Polymer C2

Molecular weight (Mw)=10,600

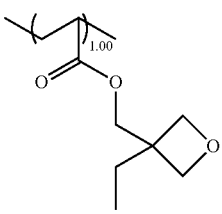

Comparative polymer C2

III-1. Preparation of Positive Photosensitive Resin Composition

Alkali-soluble resins (A1) to (A5) synthesized in the Synthesis Example 1 to Synthesis Example 6 with cross-linkable polymer compounds (B1) to (B19), (C1), and (C2) synthesized in Synthesis Example 7 to Synthesis Example 27 added were used as a base resin, with the compositions and blending amounts described in Table 1, resin compositions were prepared. Thereafter, after stirring, mixing, and dissolving, micro-filtering was applied with a Teflon (registered trade mark) 1.0-μm filter to obtain a positive photosensitive resin composition. In the Table, PGMEA of a solvent represents propylene glycol monomethyl ether acetate and GBL represents γ-butyrolactone.

TABLE 1

| | Resin | | Photosensitizer | Crosslinking agent | | Protective amine compound |
|---|---|---|---|---|---|---|
| | Component (A) | Component (B) | Component (C) | Component (D) | | Component (E) |
| Photosensitive resin composition 1 | A1 90 parts by weight | B1 10 parts by weight | PAC-1 20 parts by weight | CL-1 15 parts by weight | CL-3 10 parts by weight | E-1 1 part by weight |
| Photosensitive resin composition 2 | A2 90 parts by weight | B1 10 parts by weight | PAC-1 20 parts by weight | CL-1 15 parts by weight | CL-3 10 parts by weight | E-1 1 part by weight |
| Photosensitive resin composition 3 | A3 90 parts by weight | B1 10 parts by weight | PAC-1 20 parts by weight | CL-1 15 parts by weight | CL-3 10 parts by weight | E-1 1 part by weight |
| Photosensitive resin composition 4 | A4 90 parts by weight | B1 10 parts by weight | PAC-1 20 parts by weight | CL-1 15 parts by weight | CL-3 10 parts by weight | E-1 1 part by weight |
| Photosensitive resin composition 5 | A5 90 parts by weight | B1 10 parts by weight | PAC-1 20 parts by weight | CL-1 15 parts by weight | CL-3 10 parts by weight | E-1 1 part by weight |
| Photosensitive resin composition 6 | A1 90 parts by weight | B1 10 parts by weight | PAC-1 20 parts by weight | CL-2 15 parts by weight | CL-3 10 parts by weight | E-1 1 part by weight |
| Photosensitive resin composition 7 | A1 90 parts by weight | B1 10 parts by weight | PAC-1 20 parts by weight | CL-2 15 parts by weight | CL-3 10 parts by weight | E-1 1 part by weight |

TABLE 1-continued

| Composition | A | B | PAC | CL | CL | CL | E |
|---|---|---|---|---|---|---|---|
| Photosensitive resin composition 8 | A1 90 parts by weight | B1 10 parts by weight | PAC-1 20 parts by weight | CL-2 15 parts by weight | CL-3 10 parts by weight | | |
| Photosensitive resin composition 9 | A1 90 parts by weight | B1 10 parts by weight | PAC-1 20 parts by weight | CL-2 15 parts by weight | CL-3 10 parts by weight | | |
| Photosensitive resin composition 10 | A1 90 parts by weight | B2 10 parts by weight | PAC-1 20 parts by weight | CL-2 15 parts by weight | CL-3 10 parts by weight | | E-1 1 part by weight |
| Photosensitive resin composition 11 | A1 90 parts by weight | B3 10 parts by weight | PAC-1 20 parts by weight | CL-2 15 parts by weight | CL-3 10 parts by weight | | E-1 1 part by weight |
| Photosensitive resin composition 12 | A1 90 parts by weight | B4 10 parts by weight | PAC-1 20 parts by weight | CL-2 15 parts by weight | CL-3 10 parts by weight | | E-1 1 part by weight |
| Photosensitive resin composition 13 | A1 90 parts by weight | B5 10 parts by weight | PAC-1 20 parts by weight | CL-2 15 parts by weight | CL-3 10 parts by weight | | E-1 1 part by weight |
| Photosensitive resin composition 14 | A1 90 parts by weight | B6 10 parts by weight | PAC-1 20 parts by weight | CL-2 15 parts by weight | CL-3 10 parts by weight | | E-1 1 part by weight |
| Photosensitive resin composition 15 | A1 90 parts by weight | B7 10 parts by weight | PAC-1 20 parts by weight | CL-2 15 parts by weight | CL-3 10 parts by weight | | E-1 1 part by weight |
| Photosensitive resin composition 16 | A1 90 parts by weight | B8 10 parts by weight | PAC-1 20 parts by weight | CL-2 15 parts by weight | CL-3 10 parts by weight | | E-1 1 part by weight |
| Photosensitive resin composition 17 | A1 90 parts by weight | B9 10 parts by weight | PAC-1 20 parts by weight | CL-2 15 parts by weight | CL-3 10 parts by weight | | E-1 1 part by weight |
| Photosensitive resin composition 18 | A1 90 parts by weight | B10 10 parts by weight | PAC-1 20 parts by weight | CL-2 15 parts by weight | CL-3 10 parts by weight | | E-1 1 part by weight |
| Photosensitive resin composition 19 | A1 90 parts by weight | B11 10 parts by weight | PAC-1 20 parts by weight | CL-2 15 parts by weight | CL-3 10 parts by weight | | E-1 1 part by weight |
| Photosensitive resin composition 20 | A1 90 parts by weight | B12 10 parts by weight | PAC-1 20 parts by weight | CL-2 15 parts by weight | CL-3 10 parts by weight | | E-1 1 part by weight |
| Photosensitive resin composition 21 | A1 90 parts by weight | B13 10 parts by weight | PAC-1 20 parts by weight | CL-2 15 parts by weight | CL-3 10 parts by weight | | E-1 1 part by weight |
| Photosensitive resin composition 22 | A1 90 parts by weight | B14 10 parts by weight | PAC-1 20 parts by weight | CL-2 15 parts by weight | CL-3 10 parts by weight | | E-1 1 part by weight |
| Photosensitive resin composition 23 | A1 90 parts by weight | B15 10 parts by weight | PAC-1 20 parts by weight | CL-2 15 parts by weight | CL-3 10 parts by weight | | E-1 1 part by weight |
| Photosensitive resin composition 24 | A1 90 parts by weight | B16 10 parts by weight | PAC-1 20 parts by weight | CL-2 15 parts by weight | CL-3 10 parts by weight | | E-1 1 part by weight |
| Photosensitive resin composition 25 | A1 90 parts by weight | B17 10 parts by weight | PAC-1 20 parts by weight | CL-2 15 parts by weight | CL-3 10 parts by weight | | E-1 1 part by weight |
| Photosensitive resin composition 26 | A1 90 parts by weight | B18 10 parts by weight | PAC-1 20 parts by weight | CL-2 15 parts by weight | CL-3 10 parts by weight | | E-1 1 part by weight |
| Photosensitive resin composition 27 | A1 90 parts by weight | B19 10 parts by weight | PAC-1 20 parts by weight | CL-2 15 parts by weight | CL-3 10 parts by weight | | E-1 1 part by weight |
| Photosensitive resin composition 28 | A1 45 parts by weight | B1 10 parts by weight | PAC-1 20 parts by weight | CL-1 15 parts by weight | CL-2 15 parts by weight | CL-3 10 parts by weight | E-1 1 part by weight |
| Photosensitive resin composition 29 | A1 45 parts by weight | B1 10 parts by weight | PAC-1 20 parts by weight | CL-2 30 parts by weight | CL-3 10 parts by weight | | E-1 1 part by weight |
| Photosensitive resin composition 30 | A1 45 parts by weight | B16 10 parts by weight | PAC-1 20 parts by weight | CL-2 30 parts by weight | CL-3 10 parts by weight | | E-1 1 part by weight |
| Photosensitive resin composition 31 | A1 45 parts by weight | B1 10 parts by weight | PAC-1 20 parts by weight | CL-2 30 parts by weight | CL-3 10 parts by weight | | |
| Comparative photosensitive resin composition 1 | A1 90 parts by weight | C1 10 parts by weight | PAC-1 20 parts by weight | CL-2 15 parts by weight | CL-3 10 parts by weight | | E-1 1 part by weight |
| Comparative photosensitive resin composition 2 | A1 90 parts by weight | C2 10 parts by weight | PAC-1 20 parts by weight | CL-2 15 parts by weight | CL-3 10 parts by weight | | E-1 1 part by weight |

TABLE 1-continued

| | | | | | | |
|---|---|---|---|---|---|---|
| Comparative photosensitive resin composition 3 | A1 100 parts by weight | | PAC-1 20 parts by weight | CL-1 15 parts by weight | CL-3 10 parts by weight | |
| Comparative photosensitive resin composition 4 | A1 55 parts by weight | | PAC-1 20 parts by weight | CL-1 15 parts by weight | CL-2 15 parts by weight | CL-3 10 parts by weight | E-1 1 part by weight |

| | Thermal acid generator Component (F) | Antioxidant Component (G) | Silane compound Component (H) | Dissolution inhibitor Component (I) | Surfactant Component (J) | Solvent Component (K) | |
|---|---|---|---|---|---|---|---|
| Photosensitive resin composition 1 | | G-1 2 parts by weight | H-1 1 part by weight | | J-1 0.02 parts by weight | PGMEA 319 parts by weight | GBL 35.5 parts by weight |
| Photosensitive resin composition 2 | | G-1 2 parts by weight | H-1 1 part by weight | | J-1 0.02 parts by weight | GBL 320 parts by weight | |
| Photosensitive resin composition 3 | | G-1 2 parts by weight | H-1 1 part by weight | | J-1 0.02 parts by weight | PGMEA 319 parts by weight | GBL 35.5 parts by weight |
| Photosensitive resin composition 4 | | G-1 2 parts by weight | H-1 1 part by weight | | J-1 0.02 parts by weight | PGMEA 319 parts by weight | GBL 35.5 parts by weight |
| Photosensitive resin composition 5 | | G-1 2 parts by weight | H-1 1 part by weight | | J-1 0.02 parts by weight | PGMEA 319 parts by weight | GBL 35.5 parts by weight |
| Photosensitive resin composition 6 | | G-1 1 part by weight | H-1 1 part by weight | | J-1 0.02 parts by weight | PGMEA 319 parts by weight | GBL 35.5 parts by weight |
| Photosensitive resin composition 7 | | G-1 1 part by weight | H-1 1 part by weight | I-1 5 parts by weight | J-1 0.02 parts by weight | PGMEA 319 parts by weight | GBL 35.5 parts by weight |
| Photosensitive resin composition 8 | F-1 1 part by weight | G-1 1 part by weight | H-1 1 part by weight | | J-1 0.02 parts by weight | PGMEA 319 parts by weight | GBL 35.5 parts by weight |
| Photosensitive resin composition 9 | F-2 1 part by weight | G-1 1 part by weight | H-1 1 part by weight | | J-1 0.02 parts by weight | PGMEA 319 parts by weight | GBL 35.5 parts by weight |
| Photosensitive resin composition 10 | | G-1 1 part by weight | H-1 1 part by weight | | J-1 0.02 parts by weight | PGMEA 319 parts by weight | GBL 35.5 parts by weight |
| Photosensitive resin composition 11 | | G-1 1 part by weight | H-1 1 part by weight | | J-1 0.02 parts by weight | PGMEA 319 parts by weight | GBL 35.5 parts by weight |
| Photosensitive resin composition 12 | | G-1 1 part by weight | H-1 1 part by weight | | J-1 0.02 parts by weight | PGMEA 319 parts by weight | GBL 35.5 parts by weight |
| Photosensitive resin composition 13 | | G-1 1 part by weight | H-1 1 part by weight | | J-1 0.02 parts by weight | PGMEA 319 parts by weight | GBL 35.5 parts by weight |
| Photosensitive resin composition 14 | | G-1 1 part by weight | H-1 1 part by weight | | J-1 0.02 parts by weight | PGMEA 319 parts by weight | GBL 35.5 parts by weight |
| Photosensitive resin composition 15 | | G-1 1 part by weight | H-1 1 part by weight | | J-1 0.02 parts by weight | PGMEA 319 parts by weight | GBL 35.5 parts by weight |
| Photosensitive resin composition 16 | | G-1 1 part by weight | H-1 1 part by weight | | J-1 0.02 parts by weight | PGMEA 319 parts by weight | GBL 35.5 parts by weight |
| Photosensitive resin composition 17 | | G-1 1 part by weight | H-1 1 part by weight | | J-1 0.02 parts by weight | PGMEA 319 parts by weight | GBL 35.5 parts by weight |
| Photosensitive resin composition 18 | | G-1 1 part by weight | H-1 1 part by weight | | J-1 0.02 parts by weight | PGMEA 319 parts by weight | GBL 35.5 parts by weight |
| Photosensitive resin composition 19 | | G-1 1 part by weight | H-1 1 part by weight | | J-1 0.02 parts by weight | PGMEA 319 parts by weight | GBL 35.5 parts by weight |
| Photosensitive resin composition 20 | | G-1 1 part by weight | H-1 1 part by weight | | J-1 0.02 parts by weight | PGMEA 319 parts by weight | GBL 35.5 parts by weight |
| Photosensitive resin composition 21 | | G-1 1 part by weight | H-1 1 part by weight | | J-1 0.02 parts by weight | PGMEA 319 parts by weight | GBL 35.5 parts by weight |
| Photosensitive resin composition 22 | | G-1 1 part by weight | H-1 1 part by weight | | J-1 0.02 parts by weight | PGMEA 319 parts by weight | GBL 35.5 parts by weight |

TABLE 1-continued

| | | | | | |
|---|---|---|---|---|---|
| Photosensitive resin composition 23 | G-1 1 part by weight | H-1 1 part by weight | J-1 0.02 parts by weight | PGMEA 319 parts by weight | GBL 35.5 parts by weight |
| Photosensitive resin composition 24 | G-1 1 part by weight | H-1 1 part by weight | J-1 0.02 parts by weight | PGMEA 319 parts by weight | GBL 35.5 parts by weight |
| Photosensitive resin composition 25 | G-1 1 part by weight | H-1 1 part by weight | J-1 0.02 parts by weight | PGMEA 319 parts by weight | GBL 35.5 parts by weight |
| Photosensitive resin composition 26 | G-1 1 part by weight | H-1 1 part by weight | J-1 0.02 parts by weight | PGMEA 319 parts by weight | GBL 35.5 parts by weight |
| Photosensitive resin composition 27 | G-1 1 part by weight | H-1 1 part by weight | J-1 0.02 parts by weight | PGMEA 319 parts by weight | GBL 35.5 parts by weight |
| Photosensitive resin composition 28 | G-1 1 part by weight | H-1 1 part by weight | J-1 0.02 parts by weight | PGMEA 155 parts by weight | GBL 17 parts by weight |
| Photosensitive resin composition 29 | G-1 1 part by weight | H-1 1 part by weight | J-1 0.02 parts by weight | PGMEA 155 parts by weight | GBL 17 parts by weight |
| Photosensitive resin composition 30 | G-1 1 part by weight | H-1 1 part by weight | J-1 0.02 parts by weight | PGMEA 155 parts by weight | GBL 17 parts by weight |
| Photosensitive resin composition 31 | G-1 1 part by weight | H-1 1 part by weight | J-1 0.02 parts by weight | PGMEA 155 parts by weight | GBL 17 parts by weight |
| Comparative photosensitive resin composition 1 | G-1 1 part by weight | H-1 1 part by weight | J-1 0.02 parts by weight | PGMEA 319 parts by weight | GBL 35.5 parts by weight |
| Comparative photosensitive resin composition 2 | G-1 1 part by weight | H-1 1 part by weight | J-1 0.02 parts by weight | PGMEA 319 parts by weight | GBL 35.5 parts by weight |
| Comparative photosensitive resin composition 3 | G-1 1 part by weight | | J-1 0.02 parts by weight | PGMEA 319 parts by weight | GBL 35.5 parts by weight |
| Comparative photosensitive resin composition 4 | G-1 1 part by weight | H-1 1 part by weight | J-1 0.02 parts by weight | PGMEA 155 parts by weight | GBL 17 parts by weight |

III-2. Preparation of Positive Photosensitive Dry Film

By using a comma coater as a film coater and a polyethylene terephthalate film AL-5 (trade name, manufactured by LINTEC Corporation, thickness: 38 µm) as a supporting film, each of the photosensitive resin compositions 28 to 31 and comparative photosensitive resin composition 4 described in Table 1 was applied onto the supporting film. Then, each was passed through a hot-air circulating oven (length: 6 m) set to 55° C. over 4 minutes and dried to form a photosensitive resin film on the supporting film, whereby each photosensitive dry film was obtained. Thereafter, a polyethylene film (thickness: 10 µm) was laminated as a top coat film onto the photosensitive resin film by using a laminate roll under pressure of 1 MPa to produce a photosensitive dry film having a top coat film. The film thickness of each photosensitive resin film was set to 14 µm to achieve a finishing film thickness of 10 µm after the post-curing (the film thickness of the photosensitive resin films was measured with an optical interference film thickness gauge).

In table 1, details of the photosensitizer, being a quinonediazide compound (PAC-1), the crosslinking agents (CL-1), (CL-2), and (CL-3), the protective amine compound (E-1), the thermal acid generators (F-1) and (F-2), the antioxidant (G-1), the silane compound (H-1), the dissolution inhibitor (I-1), and the surfactant (J-1) are as follows.

Photosensitizer (PAC-1)

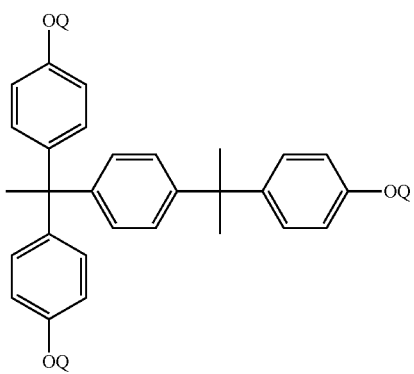

In the formula, Q represents a 1,2-naphthoquinone diazide sulfonyl group represented by the following formula (23) or a hydrogen atom, and 90% of Qs are substituted with the 1,2-naphthoquinone diazide sulfonyl group represented by the following formula (23).

(23)

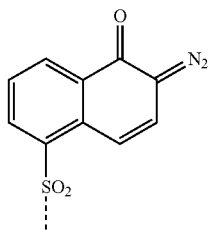

Crosslinking Agent (CL-1)

Epoxy resin: EP4000L manufactured by ADEKA CORPORATION

Crosslinking Agent (CL-2)

Epoxy resin: jER828EL manufactured by Mitsubishi Chemical Corporation

Crosslinking Agent (CL-3)

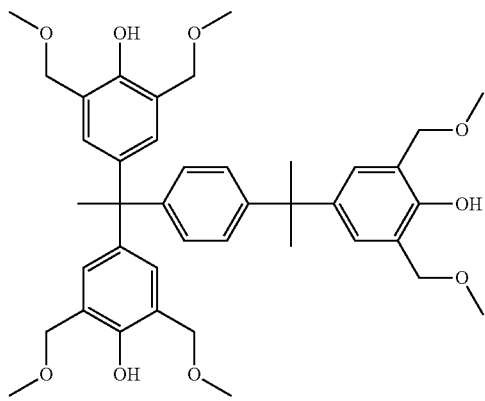

Protective Amine Compound (E-1)

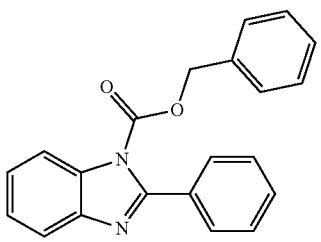 [SMILES: O=C(OCc1ccccc1)n1c(-c2ccccc2)nc2ccccc21]

Thermal Acid Generator (F-1)

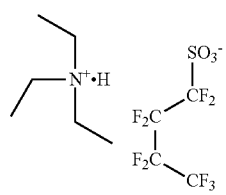

Thermal Acid Generator (F-2)

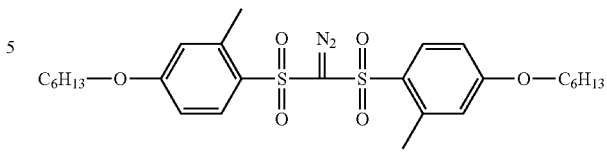

Antioxidant (G-1)
Hindered phenol-based antioxidant: Sumilizer GA-80 manufactured by Sumitomo Chemical Co., Ltd.
Silane Compound (H-1)
Amino silane coupling agent: KBM-573 manufactured by Shin-Etsu Chemical Co., Ltd.
Dissolution Inhibitor (I-1)

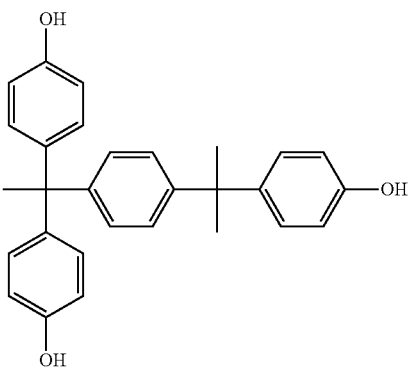 [SMILES: CC(C)(c1ccc(O)cc1)c1ccc(C(C)(c2ccc(O)cc2)c2ccc(O)cc2)cc1]

Surfactant (J-1)
Fluorinated surfactant: PF-6320 manufactured by OMNOVA Solutions Inc.

IV. Pattern Formation

Using each of the photosensitive resin compositions 1 to 27, the comparative photosensitive resin compositions 1 to 3, and furthermore, the photosensitive dry films formed from the photosensitive resin compositions 28 to 31 and the comparative photosensitive resin composition 4, photosensitive resin films were formed on silicon substrates treated with hexamethylsilazane.

By rotating a substrate after each of the resin solutions of the photosensitive resin compositions 1 to 27 and comparative photosensitive resin compositions 1 to 3 was dispensed by 5 mL on a silicon substrate, that is, by a spin-coating method, the photosensitive resin composition was applied such that a film thickness was 2 µm after patterning and heating for the post-curing. That is, by studying in advance that after the post-curing step, the film thickness decreases, the rotational rate during coating was adjusted such that a finishing film thickness after the post-curing was 2 µm. Note that the prebaking conditions were: on a hot plate at 100° C. for 2 minutes.

Meanwhile, from each photosensitive dry film formed using the photosensitive resin compositions 28 to 31 and the comparative photosensitive resin composition 4, the top coat film was delaminated. The photosensitive resin film on the supporting film was brought into close contact with a silicon substrate by using a vacuum laminator TEAM-100RF manufactured by Takatori Corp. with the vacuum degree in the vacuum chamber set to 80 Pa. The stage temperature condition was set to 110° C. After the pressure was resumed to normal pressure, the supporting film was delaminated, and this was pre-baked at 90° C. for 1 minute with a hot plate in order to improve adhesiveness to the substrate.

After forming the coating, i-line exposure was carried out using an i-line stepper AP300E manufactured by Veeco Instruments Inc. In the pattern formation, a mask for a positive pattern was used. The mask has a pattern which can form a contact hole pattern (hereinafter, noted as via pattern) of 2 μm in lengthwise and breadthwise arrangement of 1:1, and can form a via pattern of 1 μm in increments from 10 μm to 2 μm.

Subsequently, a 2.38% aqueous tetramethylammonium hydroxide (TMAH) solution was used as a developer, and 1-minute paddle development was carried out until the coating film of the exposed part was dissolved. Then, rinsing with ultrapure water was carried out.

Subsequently, the substrate with the pattern was post-cured by using an oven at 180° C. for 2 hours while purging with nitrogen.

Next, in order to observe the shape of the obtained via pattern, each substrate was cut out and the via pattern shape was observed using a scanning electron microscope (SEM). The cross sections of the formed 10-μm, 8-μm, 6-μm, 4-μm, and 2-μm via patterns were observed, and the smallest via pattern having a hole penetrating to the bottom was taken as a limiting resolution. Furthermore, verticality of the pattern was evaluated from the obtained cross-sectional photographs. Together with these results, Table 2 shows the sensitivity and the number of times the development was performed at which the via pattern with the smallest diameter was formed.

The shape of the via pattern was evaluated based on the following criteria, and the evaluation results are shown in Table 2. Verticality of the via pattern with the smallest diameter was evaluated, and a vertical pattern was rated as "Excellent", a slightly tapered shape as "Good", a tapered shape as "Poor", and an opening defect as "Bad".

V. Rupture Elongation and Tensile Strength

According to the same procedure as the above-described pattern formation, a photosensitive resin film was formed on an aluminum substrate by using the photosensitive resin compositions 1 to 27, the comparative photosensitive resin compositions 1 to 3, and furthermore, the photosensitive dry films formed from the photosensitive resin compositions 28 to 31 and the comparative photosensitive resin composition 4. The resin solutions were each applied by a spin-coating method so that a finishing film thickness after curing was 10 μm. Meanwhile, the photosensitive dry films were each laminated onto an aluminum substrate so that a finishing film thickness after curing was 10 μm. The pre-baking in the spin-coating method was performed at 100° C. for 4 minutes, and lamination of the dry film was carried out under the same conditions as the pattern formation.

Thereafter, curing was performed with an oven at 180° C. for 2 hours while purging with nitrogen to obtain a photosensitive resin cured film. Next, a wafer with a cured film was cut in strips of a width of 10 mm and a length of 60 mm, followed by peeling the cured film from the substrate by dipping in hydrochloric acid of 20 mass %. The obtained cured film was subjected to a measurement of the rupture elongation and tensile strength using an Autograph AGX-1KN manufactured by Shimadzu Corporation. The measurement was performed 10 times per sample, and an average value thereof is shown in Table 2.

TABLE 2

| | | Smallest via pattern | Pattern shape | Number of times development was performed (Puddle times) | Sensitivity (mJ/cm$^2$) | Rupture elongation (%) | Tensile strength (mPa) |
|---|---|---|---|---|---|---|---|
| Example 1 | Photosensitive resin composition 1 | 2 μm | Good | 60 sec × 2 | 350 | 25 | 116 |
| Example 2 | Photosensitive resin composition 2 | 2 μm | Good | 60 sec × 2 | 340 | 28 | 118 |
| Example 3 | Photosensitive resin composition 3 | 2 μm | Good | 60 sec × 2 | 380 | 30 | 120 |
| Example 4 | Photosensitive resin composition 4 | 2 μm | Good | 60 sec × 2 | 390 | 32 | 108 |
| Example 5 | Photosensitive resin composition 5 | 2 μm | Good | 60 sec × 2 | 410 | 33 | 110 |
| Example 6 | Photosensitive resin composition 6 | 2 μm | Good | 60 sec × 2 | 420 | 28 | 122 |
| Example 7 | Photosensitive resin composition 7 | 2 μm | Good | 60 sec × 2 | 380 | 25 | 125 |
| Example 8 | Photosensitive resin composition 8 | 2 μm | Good | 60 sec × 2 | 440 | 25 | 116 |
| Example 9 | Photosensitive resin composition 9 | 2 μm | Good | 60 sec × 2 | 450 | 25 | 117 |
| Example 10 | Photosensitive resin composition 10 | 2 μm | Good | 60 sec × 2 | 390 | 30 | 112 |
| Example 11 | Photosensitive resin composition 11 | 2 μm | Good | 60 sec × 2 | 380 | 32 | 110 |
| Example 12 | Photosensitive resin composition 12 | 2 μm | Good | 60 sec × 2 | 420 | 28 | 123 |
| Example 13 | Photosensitive resin composition 13 | 2 μm | Good | 60 sec × 2 | 380 | 35 | 118 |
| Example 14 | Photosensitive resin composition 14 | 2 μm | Good | 60 sec × 2 | 420 | 26 | 120 |
| Example 15 | Photosensitive resin composition 15 | 2 μm | Good | 60 sec × 2 | 340 | 30 | 120 |

TABLE 2-continued

|  |  | Smallest via pattern | Pattern shape | Number of times development was performed (Puddle times) | Sensitivity (mJ/cm$^2$) | Rupture elongation (%) | Tensile strength (mPa) |
|---|---|---|---|---|---|---|---|
| Example 16 | Photosensitive resin composition 16 | 2 μm | Good | 60 sec × 2 | 400 | 33 | 123 |
| Example 17 | Photosensitive resin composition 17 | 2 μm | Good | 60 sec × 2 | 440 | 35 | 121 |
| Example 18 | Photosensitive resin composition 18 | 2 μm | Good | 60 sec × 2 | 450 | 38 | 120 |
| Example 19 | Photosensitive resin composition 19 | 2 μm | Good | 60 sec × 2 | 430 | 32 | 120 |
| Example 20 | Photosensitive resin composition 20 | 2 μm | Good | 60 sec × 2 | 420 | 33 | 121 |
| Example 21 | Photosensitive resin composition 21 | 2 μm | Good | 60 sec × 2 | 500 | 28 | 124 |
| Example 22 | Photosensitive resin composition 22 | 2 μm | Good | 60 sec × 2 | 400 | 30 | 124 |
| Example 23 | Photosensitive resin composition 23 | 2 μm | Good | 60 sec × 2 | 380 | 33 | 117 |
| Example 24 | Photosensitive resin composition 24 | 2 μm | Good | 60 sec × 2 | 420 | 35 | 126 |
| Example 25 | Photosensitive resin composition 25 | 2 μm | Good | 60 sec × 2 | 500 | 30 | 128 |
| Example 26 | Photosensitive resin composition 26 | 2 μm | Good | 60 sec × 2 | 520 | 28 | 126 |
| Example 27 | Photosensitive resin composition 27 | 2 μm | Good | 60 sec × 2 | 420 | 38 | 123 |
| Example 28 | Photosensitive resin composition 28 | 8 μm | Excellent | 60 sec × 6 | 1000 | 43 | 110 |
| Example 29 | Photosensitive resin composition 29 | 8 μm | Excellent | 60 sec × 6 | 1000 | 46 | 106 |
| Example 30 | Photosensitive resin composition 30 | 8 μm | Excellent | 60 sec × 6 | 1100 | 50 | 115 |
| Example 31 | Photosensitive resin composition 31 | 8 μm | Excellent | 60 sec × 6 | 800 | 46 | 110 |
| Comparative Example 1 | Comparative photosensitive resin composition 1 | Pattern not resolved | Bad | Exposed part not dissolved | — | 24 | 103 |
| Comparative Example 2 | Comparative photosensitive resin composition 2 | Pattern not resolved | Bad | Exposed part not dissolved | — | 20 | 105 |
| Comparative Example 3 | Comparative photosensitive resin composition 3 | 2 μm | Poor | 60 sec × 3 | 400 | 12 | 120 |
| Comparative Example 4 | Comparative photosensitive resin composition 4 | 10 μm | Good | 60 sec × 6 | 1500 | 38 | 100 |

VI. Adhesion

According to the same procedure as the above-described pattern formation, a photosensitive resin film was formed on a SiN substrate by using the photosensitive resin compositions 1 to 27, and furthermore, the photosensitive dry films formed from the photosensitive resin compositions 28 to 31. The resin solutions were each applied by a spin-coating method so that a finishing film thickness after curing was 5 μm. Meanwhile, the photosensitive dry films were each laminated onto a SiN substrate so that a finishing film thickness after curing was 10 μm. After forming a coating film, a 1-cm-square square pattern was i-line exposed to obtain a gridlike pattern on the entire surface of the substrate. The exposure dose was the exposure dose determined in the via pattern evaluation. The pre-baking in the spin-coating method was performed at 100° C. for 4 minutes, and lamination of the dry film was carried out under the same conditions as the pattern formation. Regarding the development, a 1-minute paddle development was performed until the coating film in the exposed parts dissolved, over a prescribed number of times.

Subsequently, purging with nitrogen was carried out at 180° C. for 2 hours, and the substrate with the pattern was post-cured. Next, the cured substrate was cut into individual pieces along the 1 cm square pattern to obtain chips with cured films. An aluminum pin with epoxy resin was made to stand on an obtained chip, this was heated at 150° C. for 1 hour to make the aluminum pin adhere to the chip, and thus, a measurement sample was fabricated. After cooling, adhesive force was measured by using ROMULUS manufactured by Quad Group Inc., according to the method shown in FIG. 1 (Hereinafter, noted as the Stud-pull method). As the measurement condition, the measurement was performed at a measurement speed of 20 N/sec. FIG. 1 is an explanatory diagram illustrating the adhesive force measurement method. In FIG. 1, 1 denotes a SiN substrate (a substrate), 2 denotes a cured film, 3 denotes an aluminum pin with adhesive, 4 denotes a support, 5 denotes a grip, and 6 denotes a tensile direction. The obtained value was an average value of ten measurement points. The larger the numerical value, the higher the adhesiveness of the cured film to a SiN substrate. In addition, the adhesive force at the peeling interface of cured film/adhesive is higher than that of substrate/cured film. The obtained numerical values and the peeling interfaces were compared to evaluate the adhesiveness.

Furthermore, as a high temperature and high humidity test, the obtained chip was left to stand under saturation 2 atmospheres at 120° C. in a 100% RH pressure cooker for 168 hours. Subsequently, the adhesive force after the test was evaluated by the Stud-pull method. The results are shown in Table 3 as the adhesive force to a substrate together with the results before the test.

TABLE 3

| | | Adhesive force | | Peeling Interface | |
| --- | --- | --- | --- | --- | --- |
| | | Before PCT test | After PCT test | Before PCT test | After PCT test |
| Example 1 | Photosensitive resin composition 1 | 62 | 61 | Cured film/adhesive | Cured film/adhesive |
| Example 2 | Photosensitive resin composition 2 | 63 | 64 | Cured film/adhesive | Cured film/adhesive |
| Example 3 | Photosensitive resin composition 3 | 60 | 60 | Cured film/adhesive | Cured film/adhesive |
| Example 4 | Photosensitive resin composition 4 | 61 | 60 | Cured film/adhesive | Cured film/adhesive |
| Example 5 | Photosensitive resin composition 5 | 62 | 62 | Cured film/adhesive | Cured film/adhesive |
| Example 6 | Photosensitive resin composition 6 | 65 | 66 | Cured film/adhesive | Cured film/adhesive |
| Example 7 | Photosensitive resin composition 7 | 63 | 63 | Cured film/adhesive | Cured film/adhesive |
| Example 8 | Photosensitive resin composition 8 | 62 | 62 | Cured film/adhesive | Cured film/adhesive |
| Example 9 | Photosensitive resin composition 9 | 66 | 64 | Cured film/adhesive | Cured film/adhesive |
| Example 10 | Photosensitive resin composition 10 | 67 | 65 | Cured film/adhesive | Cured film/adhesive |
| Example 11 | Photosensitive resin composition 11 | 63 | 62 | Cured film/adhesive | Cured film/adhesive |
| Example 12 | Photosensitive resin composition 12 | 61 | 62 | Cured film/adhesive | Cured film/adhesive |
| Example 13 | Photosensitive resin composition 13 | 60 | 61 | Cured film/adhesive | Cured film/adhesive |
| Example 14 | Photosensitive resin composition 14 | 59 | 60 | Cured film/adhesive | Cured film/adhesive |
| Example 15 | Photosensitive resin composition 15 | 62 | 63 | Cured film/adhesive | Cured film/adhesive |
| Example 16 | Photosensitive resin composition 16 | 63 | 62 | Cured film/adhesive | Cured film/adhesive |
| Example 17 | Photosensitive resin composition 17 | 64 | 62 | Cured film/adhesive | Cured film/adhesive |
| Example 18 | Photosensitive resin composition 18 | 65 | 64 | Cured film/adhesive | Cured film/adhesive |
| Example 19 | Photosensitive resin composition 19 | 66 | 66 | Cured film/adhesive | Cured film/adhesive |
| Example 20 | Photosensitive resin composition 20 | 67 | 67 | Cured film/adhesive | Cured film/adhesive |
| Example 21 | Photosensitive resin composition 21 | 68 | 67 | Cured film/adhesive | Cured film/adhesive |
| Example 22 | Photosensitive resin composition 22 | 62 | 63 | Cured film/adhesive | Cured film/adhesive |
| Example 23 | Photosensitive resin composition 23 | 61 | 61 | Cured film/adhesive | Cured film/adhesive |
| Example 24 | Photosensitive resin composition 24 | 60 | 61 | Cured film/adhesive | Cured film/adhesive |
| Example 25 | Photosensitive resin composition 25 | 61 | 62 | Cured film/adhesive | Cured film/adhesive |
| Example 26 | Photosensitive resin composition 26 | 61 | 62 | Cured film/adhesive | Cured film/adhesive |
| Example 27 | Photosensitive resin composition 27 | 62 | 62 | Cured film/adhesive | Cured film/adhesive |
| Example 28 | Photosensitive resin composition 28 | 63 | 62 | Cured film/adhesive | Cured film/adhesive |
| Example 29 | Photosensitive resin composition 29 | 63 | 63 | Cured film/adhesive | Cured film/adhesive |
| Example 30 | Photosensitive resin composition 30 | 64 | 62 | Cured film/adhesive | Cured film/adhesive |
| Example 31 | Photosensitive resin composition 31 | 64 | 62 | Cured film/adhesive | Cured film/adhesive |

As shown in Table 2, it has been revealed that the inventive positive photosensitive resin compositions and positive photosensitive dry films resolve via patterns with better rectangularity than the positive photosensitive resin compositions of comparative photosensitive resin compositions 1 and 2 with added polymer compounds constituted only from crosslinkable groups, the positive photosensitive resin compositions of comparative photosensitive resin compositions 3 and 4 with added heat crosslinking agents, and photosensitive dry films thereof.

In addition, as shown in Table 2 and Table 3, it has been revealed that the inventive positive photosensitive composition and photosensitive dry film can give a cured film having excellent mechanical characteristics and resistance to high temperature and high humidity even when cured at a low temperature of 200° C. or lower.

From the above results, the following results have been achieved: the compositions of Examples 1 to 31 show excellent resolution that can resolve fine patterns, and show sufficient properties as photosensitive materials; at the same time, the cured films thereof have substrate adhesiveness and excellent resistance to high temperature and high humidity, and are useful as top coats for circuits and electronic components.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A positive photosensitive resin composition comprising:
  (A) an alkali-soluble resin containing at least one or more structures selected from a polyimide structure, a polyamide-imide structure, and a polybenzoxazole precursor structure;
  (B) a crosslinkable polymer compound containing structural units represented by the following general formula (2) and the following general formula (4); and
  (C) a compound having a quinonediazide structure for serving as a photosensitizer to generate an acid by light and increase a dissolution speed to an alkaline aqueous solution,

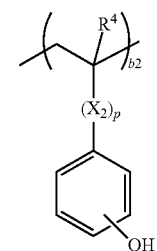

(2)

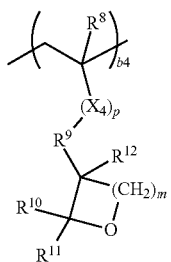

(4)

wherein $R^8$ represents a hydrogen atom or a methyl group, $X_4$ each represents —C(=O)—O—, a phenylene group, or a naphthylene group; $R^9$ represents a linear, branched, or cyclic alkylene group having 1 to 15 carbon atoms, optionally containing a hydroxy group, an ester group, an ether group, or an aromatic hydrocarbon, $R^{10}$ represents a hydrogen atom, a linear, branched, or cyclic alkyl group having 1 to 6 carbon atoms, or is optionally bonded with $R^9$ to form a ring; $R^{11}$ represents a hydrogen atom or a linear, branched, or cyclic alkyl group having 1 to 6 carbon atoms, $R^{12}$ represents a hydrogen atom or a linear alkyl group having 1 to 6 carbon atoms, and is optionally bonded with $R^9$ to form a ring; "m" is 1; "p" is 0 or 1 for general formula (4) only; $0<b2<1.0$, $0<b4<1.0$, and $0<b2+b4\leq1.0$; $R^4$ represents a hydrogen atom or a methyl group, $X_2$ each represents —C(=O)—O—, —C(=O)—NH—, or —C(=O)—N($R^5$OH)—;

and $R^5$ represents a divalent linear, branched, or cyclic aliphatic saturated hydrocarbon group having 1 to 12 carbon atoms, or an aromatic hydrocarbon group having 6 to 12 carbon atoms, wherein a carbon atom of the aliphatic saturated hydrocarbon group is optionally substituted with an oxygen atom; and "p" is 1 for general formula (2) only.

2. The positive photosensitive resin composition according to claim 1, further comprising (D) a heat crosslinking agent.

3. The positive photosensitive resin composition according to claim 2, wherein the component (D) contains one or more kinds of crosslinking agents selected from an amino condensate modified by formaldehyde or formaldehyde-alcohol; a phenol compound having two or more methylol groups or alkoxymethylol groups by average in one molecule; a compound in which a hydrogen atom of a phenolic hydroxy group of polyhydric phenol is substituted with a glycidyl group; a compound in which a hydrogen atom of a phenolic hydroxy group of polyhydric phenol is substituted with a substituent represented by the following formula (D-1); and a compound containing two or more nitrogen atoms having a glycidyl group represented by the following formula (D-2),

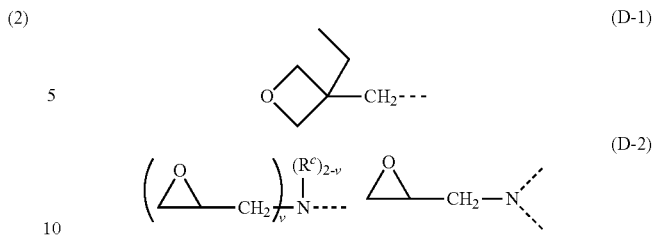

wherein a dotted line represents a bond, $R^c$ represents a linear, branched, or cyclic alkyl group having 1 to 6 carbon atoms, and "v" represents 1 or 2.

4. The positive photosensitive resin composition according to claim 1, containing 1 to 50 parts by mass of the component (B) relative to 100 parts by mass of the component (A).

5. The positive photosensitive resin composition according to claim 2, containing 0.5 to 100 parts by mass of the component (D) relative to 100 parts by mass of the component (A).

6. The positive photosensitive resin composition according to claim 1, further comprising any one or more of (E) a protective amine compound, (F) a thermal acid generator, (G) an antioxidant, and (H) a silane compound.

7. A patterning process comprising:
(1) forming a photosensitive material film by coating a substrate with the positive photosensitive resin composition according to claim 1;
(2) subsequently, after a heat treatment, exposing the photosensitive material film with a high energy beam having a wavelength of 190 to 500 nm or an electron beam via a photomask; and
(3) after irradiation, developing with a developer of an alkaline aqueous solution.

8. A positive photosensitive dry film, which has a photosensitive resin layer having a film thickness of 5 to 200 μm, the photosensitive resin layer being sandwiched between a supporting film and a top coat film, wherein the photosensitive resin layer is formed using the positive photosensitive resin composition according to claim 1.

9. A method for producing a positive photosensitive dry film, comprising:
(1) forming a photosensitive resin layer by continuously coating a supporting film with the positive photosensitive resin composition according to claim 1;
(2) continuously drying the photosensitive resin layer; and further
(3) laminating a top coat film onto the photosensitive resin layer.

10. A patterning process comprising:
(1) adhering onto a substrate the photosensitive resin layer which becomes exposed by delaminating the top coat film from the positive photosensitive dry film according to claim 8;
(2) exposing the photosensitive resin layer to a high energy beam having a wavelength of 190 to 500 nm or an electron beam via a photomask under the state of intervention of the supporting film or under the state of the supporting film delaminated; and
(3) after irradiation, developing with a developer of an alkaline aqueous solution.

11. A method for forming a cured film comprising:
heating and post-curing a film on which a pattern is formed by the patterning process according to claim 7 at a temperature of 100 to 300° C.

12. A method for forming a cured film comprising:
heating and post-curing a film on which a pattern is formed by the patterning process according to claim 10 at a temperature of 100 to 300° C.

13. An interlayer insulation film being a cured film by curing the positive photosensitive resin composition according to claim 1.

14. A surface protective film being a cured film by curing the positive photosensitive resin composition according to claim 1.

15. An electronic component having the interlayer insulation film according to claim 13.

16. An electronic component having the surface protective film according to claim 14.

* * * * *